(12) United States Patent  
Chen

(10) Patent No.: US 6,201,270 B1  
(45) Date of Patent: Mar. 13, 2001

(54) HIGH SPEED CMOS PHOTODETECTORS WITH WIDE RANGE OPERATING REGION AND FIXED PATTERN NOISE REDUCTION

(76) Inventor: Pao-Jung Chen, 20872 Sola St., Cupertino, CA (US) 95014

( * ) Notice: Subject to any disclaimer, the term of this patent is extended or adjusted under 35 U.S.C. 154(b) by 0 days.

(21) Appl. No.: 09/372,687

(22) Filed: Aug. 11, 1999

Related U.S. Application Data

(63) Continuation-in-part of application No. 08/835,297, filed on Apr. 7, 1997, now Pat. No. 5,869,857.

(51) Int. Cl.[7] .................. H01L 31/062; H01L 31/113; H01L 31/06

(52) U.S. Cl. .................. 257/292; 257/461; 250/214.1; 327/514; 327/515

(58) Field of Search .................. 257/292, 461; 250/214.1; 327/514, 515

(56) References Cited

U.S. PATENT DOCUMENTS

| | | | |
|---|---|---|---|
| 5,581,077 | * 12/1996 | Chirovsky et al. | 250/214 R |
| 5,742,047 | * 4/1998 | Buhler et al. | 250/214 R |
| 5,821,528 | * 10/1998 | Liao et al. | 250/214 R |
| 6,091,280 | * 7/2000 | Hynecek | 327/514 |

* cited by examiner

*Primary Examiner*—Ngân V. Ngô  
(74) *Attorney, Agent, or Firm*—Bo-In Lin

(57) ABSTRACT

A CMOS charge-integration mode photo-detector built on an n-type substrate is disclosed in this invention. This photo-detector includes a p+n photodiode with the n-type substrate constituting an n-region and a p+ diffusion region disposed near a top surface of the n-type substrate, the p+ diffusion region constituting a charge integration node. The photodetector further includes a gate-biased charge storable n-type MOS transistor functioning as a photo-conversion voltage amplifier supported on the substrate formed with a threshold voltage of Vt0 having a gate terminal connected to the charge-integration node. The photodetector further includes a MOS transistor supported on the substrate functioning as a constant current-source load transistor having a drain terminal connected to a source terminal of the gate-biased charge storable n-type MOS transistor and a gate terminal connected to a bias reference voltage. The photodetector further includes a pre-charge switch transistor supported on the substrate having a source terminal connected to charge-integration node and a drain terminal connected to a bias voltage source. (The photodetector further includes a MOS transistor supported on the substrate functioning as a readout switch transistor having a source terminal connected to a drain terminal of the gate-biased charge storable n-type MOS transistor). In an alternate preferred embodiment, the photodetector is formed in a p-type substrate.

6 Claims, 57 Drawing Sheets

(1) Cutoff Region  (2) Transition Region
(3) Active Region  (4) Saturation Region

HIGH SPEED CMOS PHOTODETECTORS WITH WIDE RANGE OPERATING REGION AND FIXED PATTERN NOISE REDUCTION This Application is a Continuation-In-Part (CIP) Application of application Ser. No. 08/835,297 filed on Apr. 7, 1997 now U.S. Pat. No. 5,869,857 by the same sole Applicant of this Continuation-In-Part Application.

TECHNICAL FIELD OF THE INVENTION

This invention relates to photodetectors utilized to produce electronic images of documents and objects. Particular applications for these photodetectors include contact image scanners used in document scanners, photocopiers and facsimile machines, and video cameras.

BACKGROUND OF THE INVENTION

Photodetectors fabricated with mosaic silicon wafers can be approximately categorized into two kinds: pn-junction photodetectors and charge-coupled device (CCD) photodetectors. There are two structures of pn-junction photodetectors: photodiode and phototransistor shown respectively in FIG. 1A and FIG. 2A. The phototransistor structure is comprised of a photodiode connected to the base terminal of a bipolar transistor for the capability of charge amplification. By incorporating a metal oxide semiconductor (MOS) transistor switch in any of the pn-junction photodetectors shown in FIG. 3A and FIG. 4A, a charge-integration mode photodetector element can be implemented on the integrated circuits (ICs) with improved photo-response sensitivity. This also facilitates the integration for a large image-sensing array.

The use of a phototransistor as a photodetector that utilizes photocurrent amplification to increase photosensitivity was first mentioned by William Schockley et. al., in a paper entitled "p-n Junction Transistor," Phys. Rev., 83, 151 (1951). A charge integration mode phototransistor photodetector that was configured as an image capture device was described in a the paper by Rudy Dyck and Gene Weckler entitled "Integrated Array of Silicon Photodetectors for Image Sensing," IEEE Transactions On Electron Devices, Vol. ED-15, No. 4, April 1968.

A contact image sensor (CIS) module, that uses a charge integration mode phototransistor as the photodetector element, was presented in a paper by E .E. Anderson and Weng-Lyang Wang. The paper is entitled "A Novel Contact Image Sensor (CIS) Module for Compact and Lightweight Full Page Scanner Applications," SPIE Vol. 1901 Cameras, Scanners, and Image Acquisition Systems (1993), pages 173–181. A contact-type, color image sensor using color phototransistors was presented in a paper by Tadahiko Hamaguchi, et.al., entitled "Contact-type Color Image Sensor Using Color Phototransistors," SPIE Vol. 2172, pages 167–174.

Contact image sensor modules currently used in black-and-white fax machines are built with charge-integration phototransistor sensing elements of FIG. 4A, because of the simplicity that is a result of the self-resetting capability of the phototransistor during the readout period. However, these CIS scanners have limited dynamic range for image reproduction, and are unsuitable for gray level image scanning applications. The limited dynamic range is the result of being operated in the non-linear photo-response transfer function region and the after-image effect (or image lag) caused by the incomplete and non-linear self-resetting process of the phototransistor.

A substantial improvement in contact image scanners over those using charge-integration phototransistor sensing elements is described in co-pending patent application Ser. No. 08/654,394 filed May 28, 1996 by Pao-Jung Chen, titled "Charge Integration Photodetector Having A Prechargeable Charge Storage Node".

By inserting certain DC-biasing charge through a precharge switch to the base terminal of the npn transistor prior to the charge integration process, an improved charge-integration phototransistor (as shown in FIG. 5A) eliminates the non-linear and after image problems of the conventional charge-integration phototransistor shown in FIG. 4A, and reaches the performance of comparable CCD image sensors. However, the process technologies required in the base-biased phototransistors are not fully compatible with the existing foundries' standard CMOS process. Also, the subordinate circuits for operating this phototransistor image sensors are cumbersome and power consuming.

The other image sensor built with voltage-pickoff charge-integration photodiode sensing elements shown in FIG. 6A, has been used in image sensing applications since the early 1970's. This sensing element consists of a re-settable reverse-biased photodiode connected to the high impedance gate terminal of a MOS transistor operating as a source-follower amplifier. The source follower configuration provides the low output impedance needed to drive the external readout circuits.

The concept of operation, circuit configurations, and especially the types of buffered transistors used for charge-integration photodiodes and for charge-integration phototransistors are quite different. In the operation of the voltage-pickoff photodetector, the photodiode and the gate terminal of the source-follower transistor are initially reset to a DC voltage, usually to one of the power buses. This causes the source-follower transistor to operate in the top end of the active region under the dark level condition. When the light illumination increases, the source-follower transistor operates toward the cut-off region. However, the operation of the charge-integration phototransistor is just the opposite. The photodiode and the base terminal of the npn transistor are reset to a voltage near the cut-off region under the dark level condition. When the light illumination increases, the emitter-follower transistor operates toward the top end of the active region. Their differences are illustrated in the circuit diagrams in FIGS. 5A and 6A, and in the photoresponse transfer characteristics in FIGS. 5C and 6C respectively. Both photodetectors are fabricated with CMOS technology on the same type substrate. However, the transistor body effect of the reset switch and the readout switch of the voltage-pickoff photodetector complicate the circuit design and process technology, and reduce the dynamic range and readout rate of the image sensing devices that use voltage-pickoff charge-integration photodiodes as sensing elements.

Integrating photodiode area-array image sensors with signal processing circuits on one chip using CMOS technology is currently under heavy development for emerging multimedia applications. Presentations on this topic were included in the IEEE ISSCC conferences of '96 and '97.

SUMMARY OF THE INVENTION

One of the key photodetectors of this invention is named a gate-biased charge-integration photodiode as illustrated in the circuit diagram shown in FIG. 7A. It's operating concept is similar to the operating concept of the base-biased charge-integration phototransistor of FIG. 5A.

The photodetector of the present invention is created by replacing the bipolar npn transistor of the base-biased charge-integration phototransistor with a threshold-voltage adjustable n-type MOS transistor. The new photodetector exhibits a linear photoresponse transfer characteristic covering almost the entire operating region. This is illustrated in FIG. 7C. The transfer function for the gate-biased charge-integration photodiode was calculated from the SPICE simulation with a capacitor-loaded source follower circuit. Its readout operation-timing diagram is shown in FIG. 7B.

The operation concept of the gate-biased charge-integration photodiode is described as follows: Prior to each charge-integration cycle of the photodetector, the charge-integration node of the photodiode and the gate terminal of the n-type MOS transistor are charged through a MOS switch to a DC-bias voltage that is slightly above the threshold voltage of the n-type MOS transistor M1. This precharging step initializes the photodetector to the active region so that the output signal will linearly follow the photosignal of the photodiode. Simultaneously, this same precharging step resets the photosignal charge left from the previous readout cycle and eliminates the after image effect. If the threshold voltage of the n-type MOS transistor is chosen to be a negative value by the threshold voltage implanting step, the DC-biasing voltage can be connected to the ground bus and the photodetector will automatically operate in the active region. In this case, DC biasing circuitry is not required.

The photodetector of the present invention can be fabricated using standard CMOS processes. Note that no extra processing steps are needed, because threshold voltage implanting is a standard processing step.

This photodetector element is comprised of a photodiode with three major MOS transistors. For an n-type substrate wafer of CMOS process technology, the photodiode is a p+n junction diode formed by a p+ diffusion layer to the n-type substrate; the p+ diffusion layer is the anode node of the photodiode, and the n-type substrate is the cathode. The p+ anode is connected to the gate of an n-type MOS transistor, M1 of FIG. 7A. Transistor M1 functions as a voltage-buffering transistor or voltage-amplifying transistor for the voltage at the p+ anode of the photodiode. Transistors M2 and M3 of FIG. 7A function as the on-off switches for the photodetector; both transistors can be either n-type, or p-type, or a transmission gate (with both n-type and p-type transistors connected together in parallel) MOS transistor. However, n-type MOS transistors are preferred for M2 and M3 with n-type substrate CMOS technology for optimizing the circuit design and photodetector performance. Transistor M2 functions as a readout switch for the photodetector, and transistor M3 serves as a precharging switch for inserting the DC biasing charge on the gate terminal of transistor M1, and simultaneously resetting the photodiode in the beginning of each photocharge-integration cycle. The time duration, between the "on" time of transistors M3 and M2 of FIG. 7B, is the integration time of the photodetector. If a p-type substrate wafer of CMOS process technology is used, the photodetector of the invention will be comprised of an n+p photodiode and three p-type MOS transistors.

The photodetector of this invention, shown in FIG. 7A, replaces the bipolar npn transistor of the base-biased charge-integration phototransistor of FIG. 5A with an n-type MOS transistor having an adjustable threshold voltage, which can be achieved with the transistor threshold voltage implant step. This photodetector thereby exhibits a family of transfer function curves covering the entire operating region as shown in FIG. 7C. In contrast, the transfer function of the base-biased charge-integration phototransistor has only a very limited range because of the limited process adjustable range for the "turn on" voltage of the bipolar emitter-base junction, ranging approximately from 0.6V to 0.9V. Also in contrast, the transfer function of the voltage-pickoff charge-integration photodiode of FIG. 6A occupies only a portion of the super-set transfer function of the photodetector of the present invention. Therefore, the proposed charge-integration photodetector provides more flexibility for optimizing the design of image-sensing devices.

In summary, the advantages of this photodetector compared to the base-biased phototransistor are:

(1) Higher sensitivity and better linearity due to the non-destructive readout sensing of the photogenerated charge signal in the photodiode. Whereas in the base-biased phototransistor-type photodetector, a portion of the photogenerated charge signal will be discharged as base-to-emitter current during the readout period.

(2) Voltage reference circuit of Vbias illustrated in FIG. 8 for the photodetector of the present invention can be integrated on chip to set the photodetector operating in the linear active region. The voltage reference circuit can also compensate for the output DC offset variations vs. temperature. In contrast, an isolated bipolar transistor can not be integrated on chip with the CMOS phototransistor-type technologies, and therefore it cannot provide a voltage reference circuit with temperature compensation.

(3) A simplified and optimized design of the photodetector of FIG. 7A can be obtained by using a depletion-type transistor for the buffered n-type MOS transistor M1 which has a negative transistor threshold voltage. As shown in the transfer function curves of FIG. 7C, as the threshold voltage of transistor M1 becomes negative, the photodetector operates in the linear active region with the Vbias connected to ground. A photodetectors of this design, illustrated in FIG. 9, does not require the voltage reference circuit. Image-sensing devices constructed with this photodetector element consume very little power and require a minimal amount of silicon real estate, with resulting cost benefits.

(4) Fabrication technology is fully compatible with most low-cost and high-performance standard digital CMOS process technologies.

The advantages of the gate-biased charge-integration photodiode over the conventional voltage-pickoff charge-integration photodiode are:

(1) It has a super set of photoresponse transfer characteristics, while the voltage-pickoff photodetector can only operate within a portion of the super set.

(2) It has a wide range of active region and therefore a large dynamic range. This can be seen from the transfer characteristic curves when the voltage of Vbias is connected to ground, and both photodetectors are operated with the same power buses. The detector of the present invention has an active-region curve ranging from approximately the origin to the maximum allowable output when the threshold voltage of the transistor M1 of FIG. 9 is slightly below 0 Volts.

(3) It has a faster output readout rate of the video signal because of its concept of operation. This can be explained as follows: At dark level, the starting point of operation, the DC bias for the source follower transistor M1 of the present invention is set at the low end of the active region, which is about a threshold voltage of the transistor M1 from the ground level. When the readout switch M2 is on, the voltage on the node of the resetting-to-ground capacitor load will be charged up by the source-follower transistor M1 to approximately one threshold voltage of the transistor M1 below the dark-level voltage of the photodiode, which is almost equal to ground level. Therefore the charging time constant to charge a small voltage to the capacitor load is very short. Whereas in the operation of the voltage-pickoff photodetector, the source-follower transistor M1 is DC biased to the top end of the active region, transistor M1 needs to charge a big voltage swing to the capacitor load to follow the dark level signal of the photodiode. Therefore a long charging time constant or slow output readout rate is required for the voltage-pickoff photodetector.

(4) It has an optimized circuit configuration with minimum body effect for the operation of readout switch of transistor M2 and precharge switch of transistor M3. Transistors with regular threshold voltage can be used for M2 and M3 on standard CMOS process. Whereas in the case of voltage-pickoff photodetector, it is quite difficult to operate the detector correctly without tweaking on the process or circuitry for transistors M2 and M3 because of the transistor body effect inherited from the concept of operation of the detector.

From the operation concept of the CCD image sensing device and the analyses mentioned above, another two photodetecting elements for image sensing devices can be constructed:

(1) a photodetector element comprised of a gate-biased charge-integration photodiode and a resettable-capacitor load as a sample-and-hold stage for the photodetector signal illustrated in FIG. 12, and (2) a photodetector element comprised of a voltage-pickoff charge-integration photodiode and a resettable-capacitor load as a sample-and-hold stage for the photodetector signal illustrated in FIG. 14.

Linear array image sensing devices constructed with either of these two photodetector elements are illustrated in FIG. 13A and FIG. 15A. These two devices function like linear array CCD image sensors: simultaneously transfer each photosite signal in parallel to its corresponding analog memory cell, then read out the memory cells sequentially while each photodetecting element performs charge integration for the next readout cycle. These image sensing devices can be used to increase the scanning through put in the color CIS scanner module built with the three-color-LED light switching method.

During the precharging period of the photodetector of FIG. 7A, the source terminal of the transistor M1 is floating, and contains the charge signal remaining from the previous readout cycle, which may cause crosstalk between the adjacent readout signals or fixed pattern noise for the readout signals. This problem can be solved by resetting the source terminal of transistor M1, at the same time as the precharging period, through n-type MOS switch transistor M8 connected between the source terminal and either a voltage source or ground. However, a transient current will flow from Vdd to ground through transistor M1, and transistor M8 during this reset period. These modified photodetecting elements are illustrated in FIGS. 16A, 16B, and 16C.

Resetting the source terminal of transistor M1 of the voltage-pickoff photodetector of FIG. 6A may not be necessary, because the transistor M1 is always on during the reset period. The voltage on the source terminal of transistor M1 is reset to about one threshold voltage below the voltage of the gate terminal.

Additional improvements are made by incorporating current-source-load MOS transistor into the previous photodetector cell acting as the load of the buffer amplifier transistor, i.e., M1 of FIG. 7A. The output voltage of the buffer amplifier transistor instantaneously follows the voltage signal at the p+ node of the photodiode. By connecting a current-source load to the buffer amplifier, the buffer amplifier output of this new photodetector cell becomes a low impedance node. The charge-up time for the output signal at the capacitive load are greatly reduced. The crosstalk (or the capacitive coupling) noise generated from the on-off control signal of the readout switch transistor M2 and the feedback crosstalk noise from the output signal at the capacitive load to the photo-signal at the p+ node of the photodiode are minimized. The video signal dynamic range is improved by this implementation.

With a current-source load transistor connected in parallel to the capacitive load, the charging time constant of the video output can be greatly reduced, without sacrificing the gain of the amplifier. The output data rate of the digital scanning shift register can be improved drastically.

The circuitry for implementing the photo-detector with a current-source MOS transistor load is minimal. The improved photo-detector is illustrated in FIG. 19A and FIG. 19B. The MOS transistors MI and MIL for the current-source loads are the same type of MOS transistor as the buffer amplifier transistor M1. The biasing voltage VbiasI for the gate terminal of the current-source transistor can be an independent voltage reference, from Vbias of the existing preset voltage reference, or tied to the ground. The improved photodetector employs the same CMOS process technology as the co-pending original invention.

Additional improvement on the dark fixed-pattern-noise reduction of a linear (or area) array constructed with a plural number of gate-biased photodetecting element is made by implementing a replica transistor circuit to each of the photodetecting cell and a readout circuitry with a differential readout method for the array. The dark fixed pattern noise (FPN) of the array depends on the matching characteristics of the photodetecting cell and its replica cell. While the FPN noise of the photodetector array without replica circuit depends on the matching characteristics among all photodetecting cells of the array.

Additional improvement on the readout data rate of a photodetector array is obtained by multiplexing the output signal of the photodetecting cells using two phased output signal.

A capacitive sensor cell can be constructed by replacing the photodiode of the photodetector cell of FIG. 32 with a MOS capacitor Ci connected between the charge-integration node and the substrate potential, and a current source MOS transistor MIc whose source and drain terminals are connected to the charge-integration node and the substrate potential respectively to discharge the charge-integration node during the charge-integration sensing period. The capacitor Ci is designed to increase its value if an external fixed potential plate, such as a human's finger, moves closely to the capacitor plate of the charge-integration node. Under this condition, in additional to the capacitor Ci, a stray capacitor Cs is presented to the charge-integration node of the sensor cell, at the end of the integration period, the output voltage of the sensor cell will vary with the values of Cs and indicates the presence of the external capacitance. FIG. 39A illustrates the circuit diagram of a gate-biased charge-integration capacitive sensor cell.

BRIEF DESCRIPTION OF THE DRAWINGS

FIG. 32A illustrates the circuit diagram of a gate-biased charge-integration photodiode with a capacitor-loaded source-follower readout circuit built on p-type substrate.

FIG. 32B illustrates the timing control signals for operating the image-sensing device presented in FIG. 32A.

DESCRIPTION OF THE PREFERRED EMBODIMENT

Figure 1A:
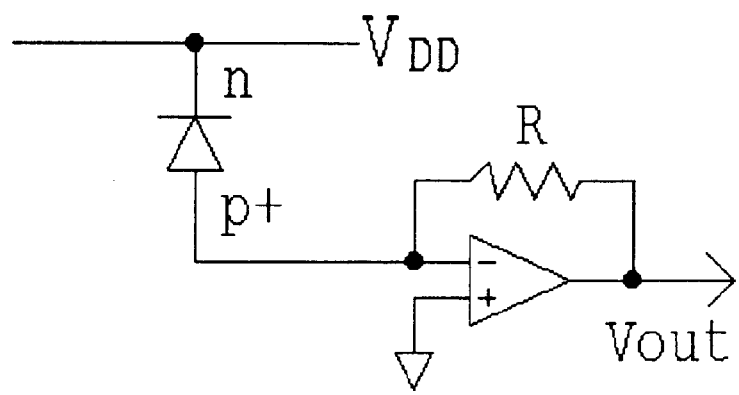
FIG. 1A illustrates a typical p+n junction photodiode operated in real-time photocurrent sensing mode.
Figure 1B:
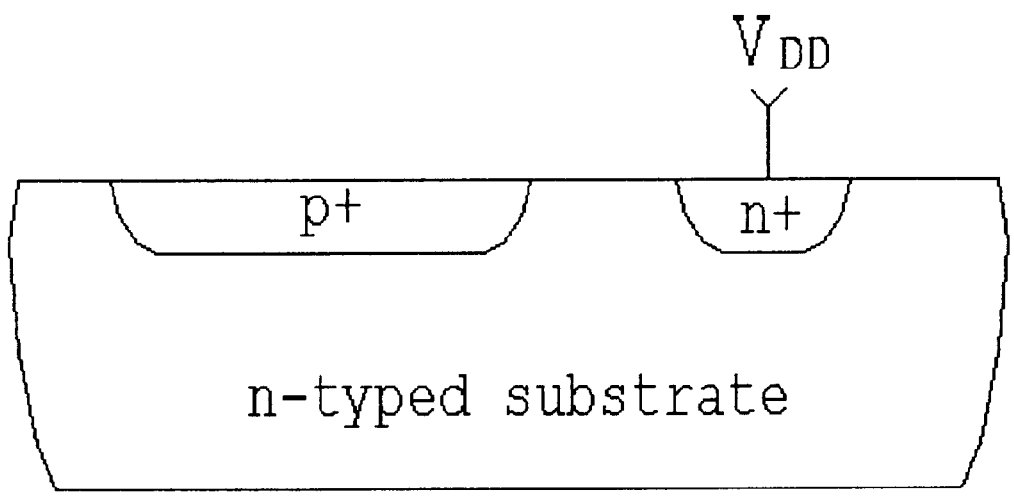
FIG. 1B illustrates a typical structure of the p+n junction photodiode presented in FIG. 1A.
Figure 2A:
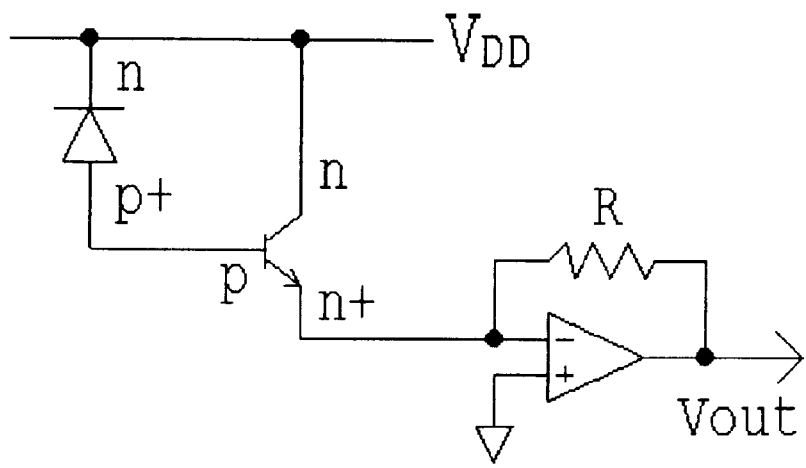
FIG. 2A illustrates a phototransistor operated in real-time photocurrent amplification mode.
Figure 2B:
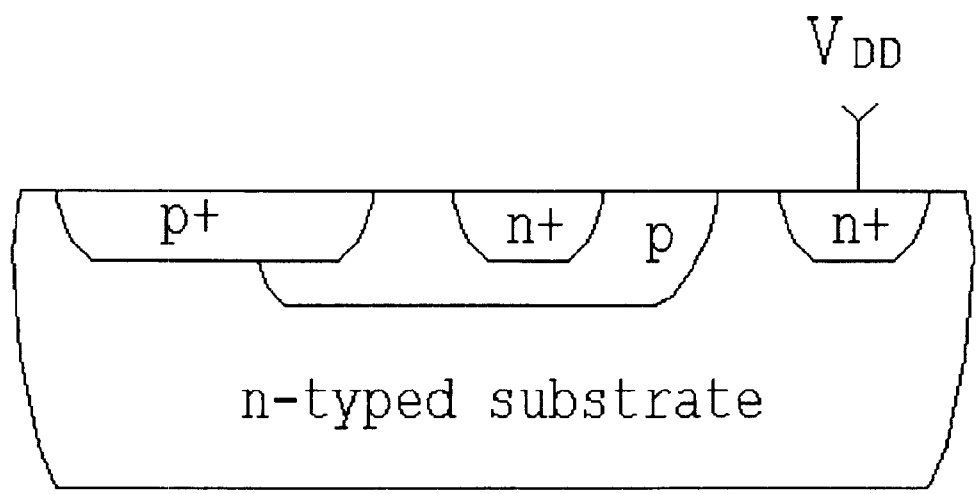
FIG. 2B illustrates a typical structure of phototransistor presented in FIG. 2A.
Figure 3A:
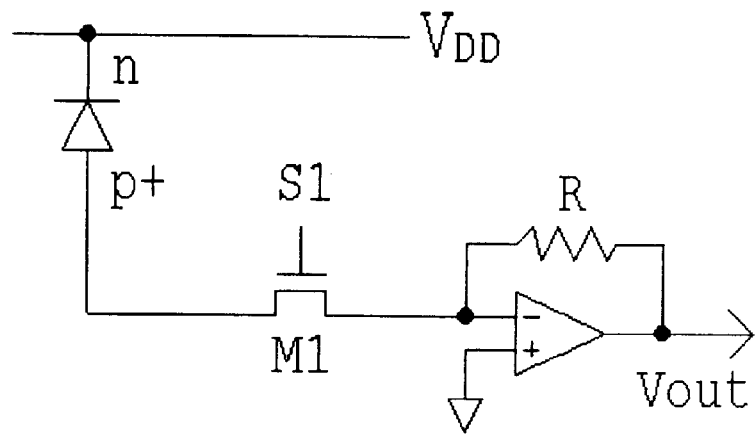
FIG. 3A illustrates a p+n photodiode operated in charge-integration mode.
Figure 3B:
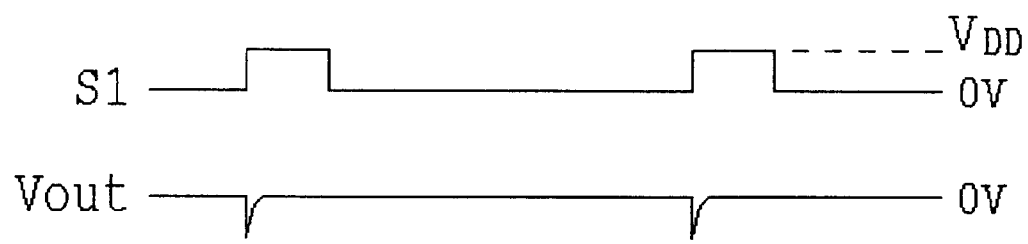
FIG. 3B illustrates the timing diagram of the readout switch and the output signal for operating the charge-integration photodiode presented in FIG. 3A.
Figure 4A:
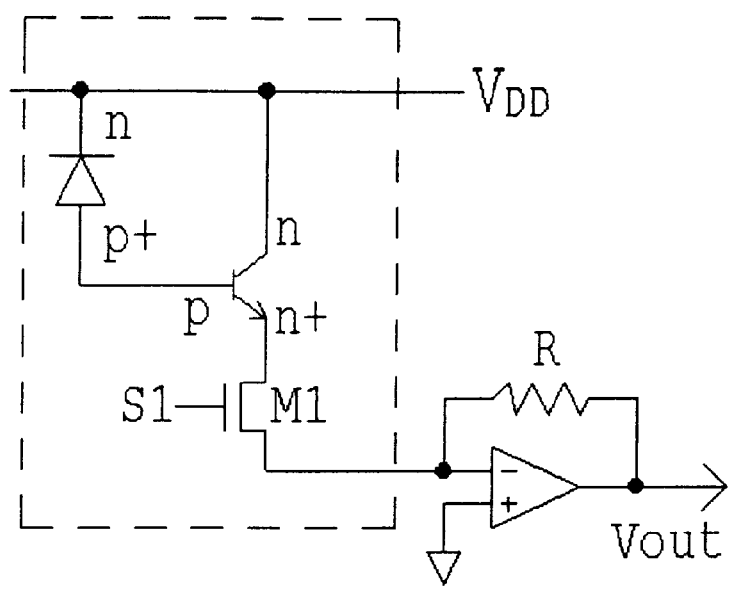
FIG. 4A illustrates a phototransistor operated in charge-integration mode.
Figure 4B:
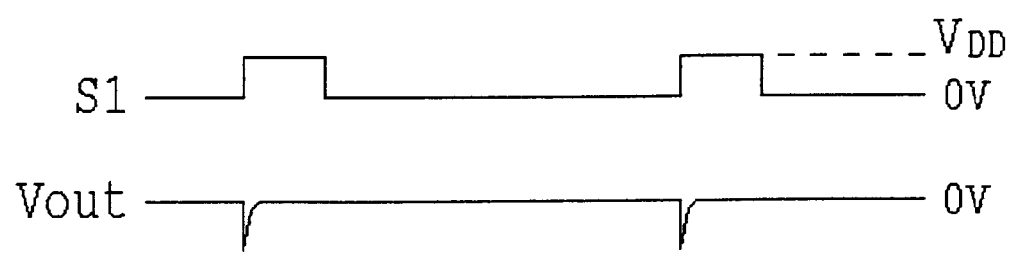
FIG. 4B illustrates the timing diagram of the readout switch and the output signal for operating the charge-integration phototransistor presented in FIG. 4A.
Figure 5A:
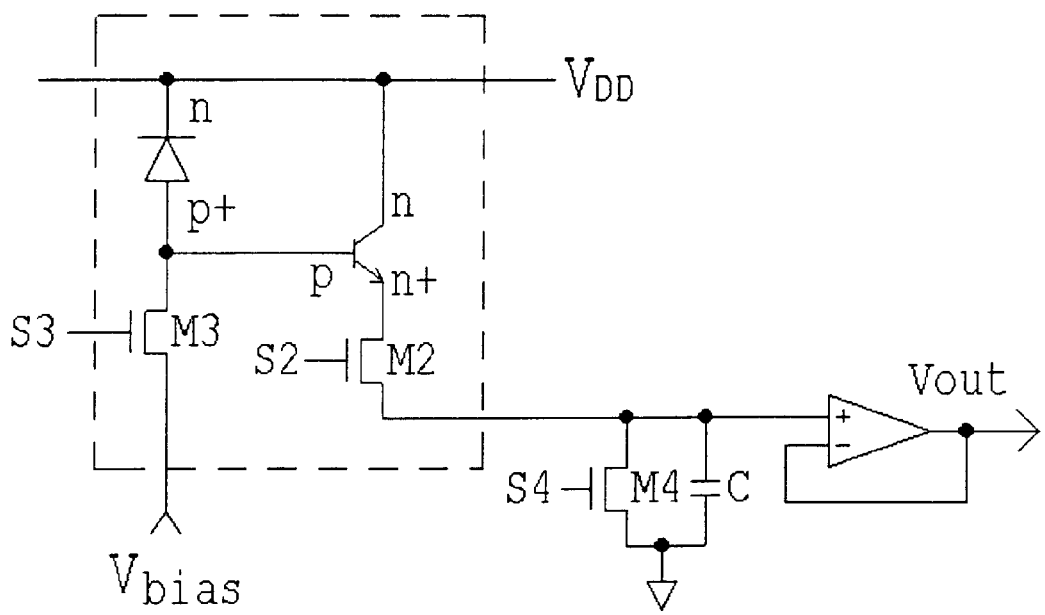
FIG. 5A illustrates the circuit diagram of a base-biased charge-integration phototransistor with a capacitor-loaded emitter-follower readout circuit.
Figure 5B:
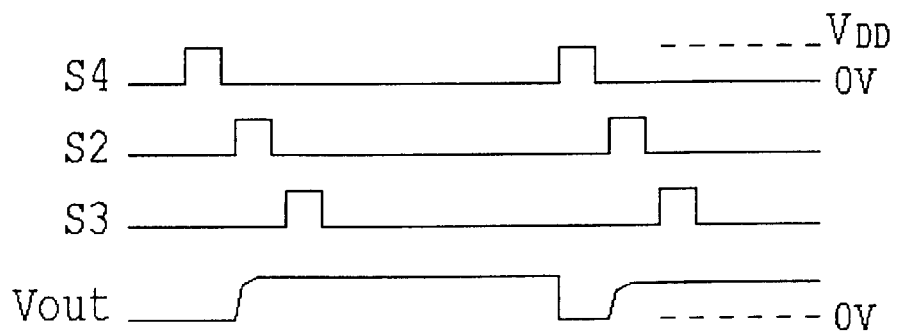
FIG. 5B illustrates the timing diagram of the precharging switch M3, readout switch M2, capacitor load reset switch M4 and output signal for operating the photodetector element presented in FIG. 5A.
Figure 5C:
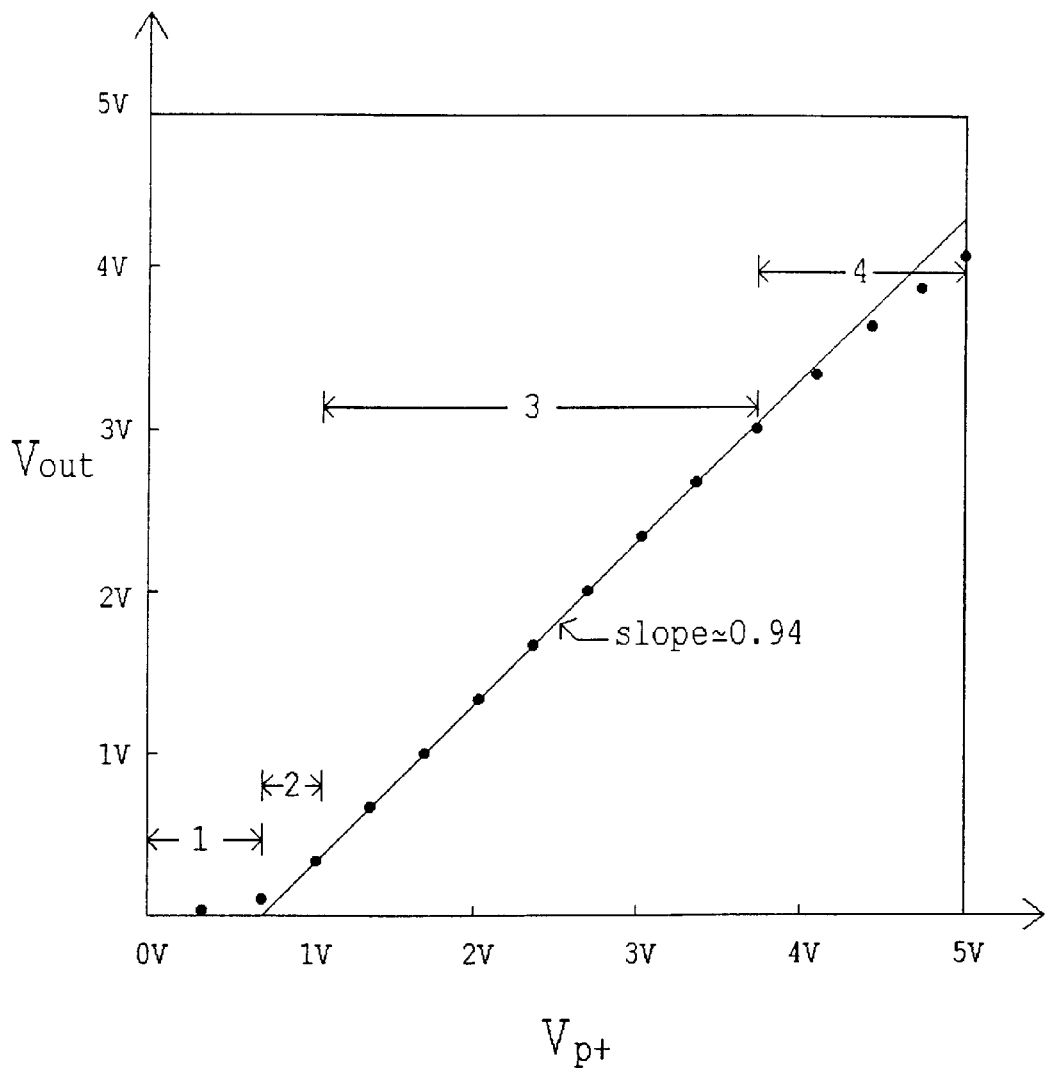
FIG. 5C illustrates the calculated photoresponse transfer characteristics of the photodetector element presented in FIG. 5A.
Figure 6A:
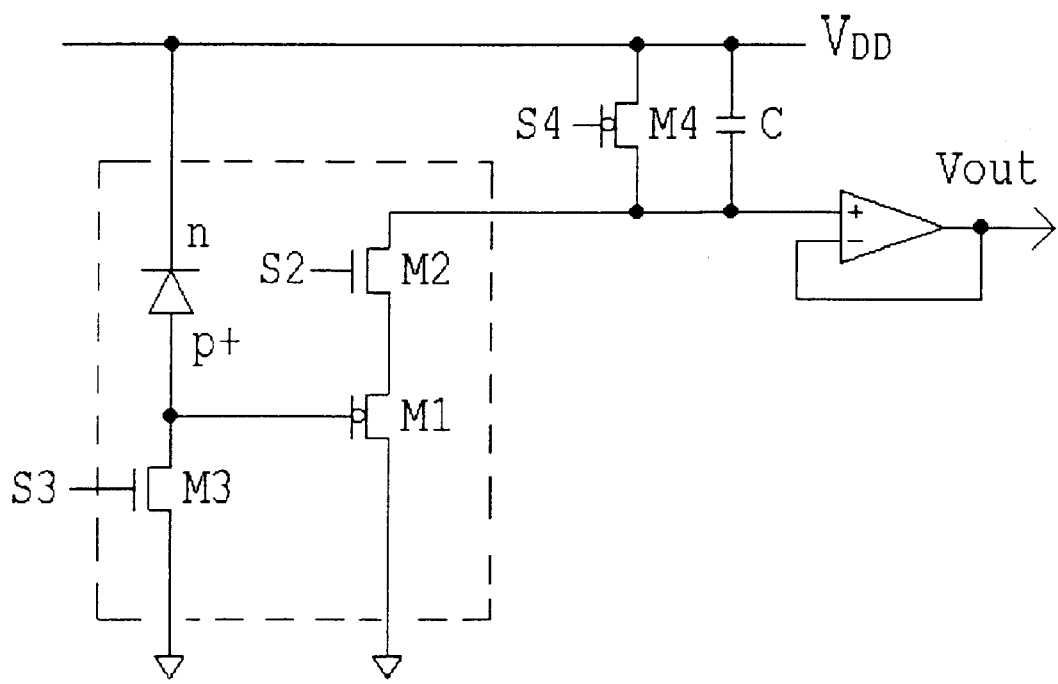
FIG. 6A illustrates the circuit diagram of a voltage-pickoff charge-integration photodiode with a capacitor-loaded source-follower readout circuit.
Figure 6B:
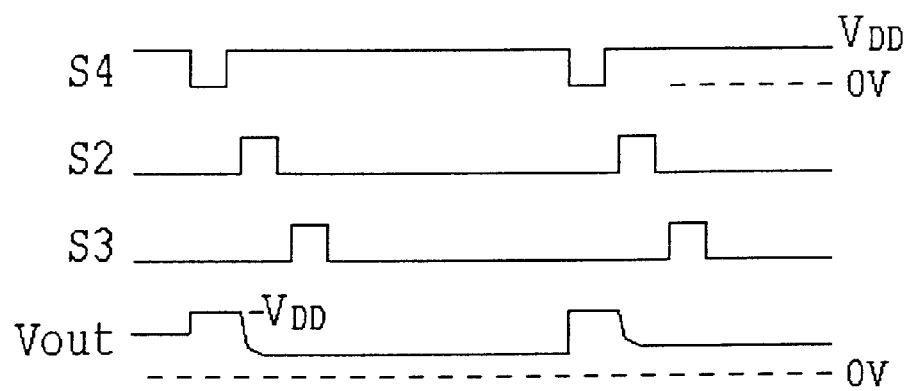
FIG. 6B illustrates the timing diagram of the photodiode reset switch M3, readout switch M2, capacitor load reset switch M4 and output signal for operating the photodetector element presented in FIG. 6A.
Figure 6C:
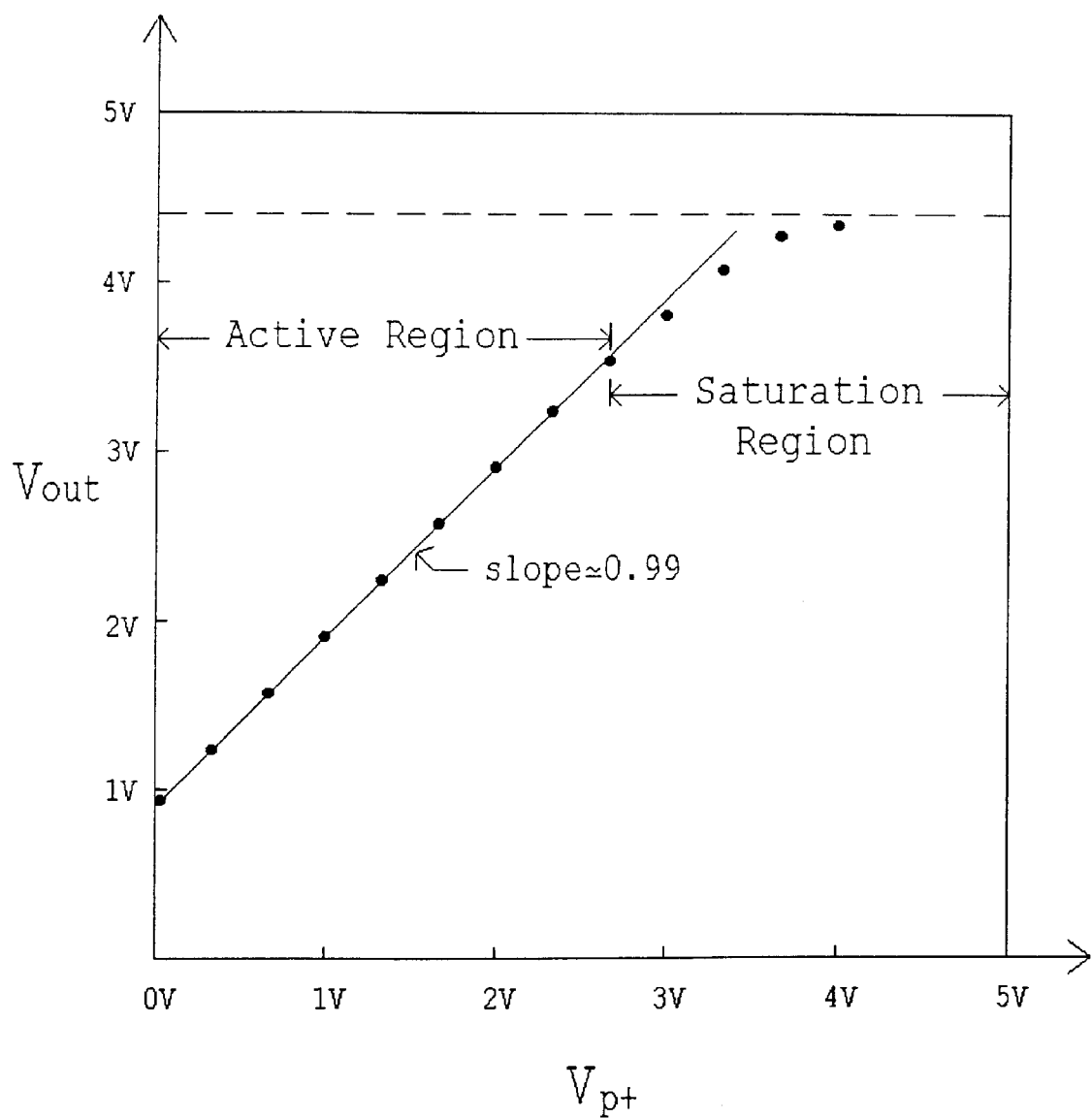
FIG. 6C illustrates the calculated photoresponse transfer characteristics of the photodetector element presented in FIG. 6A.
Figure 7A:
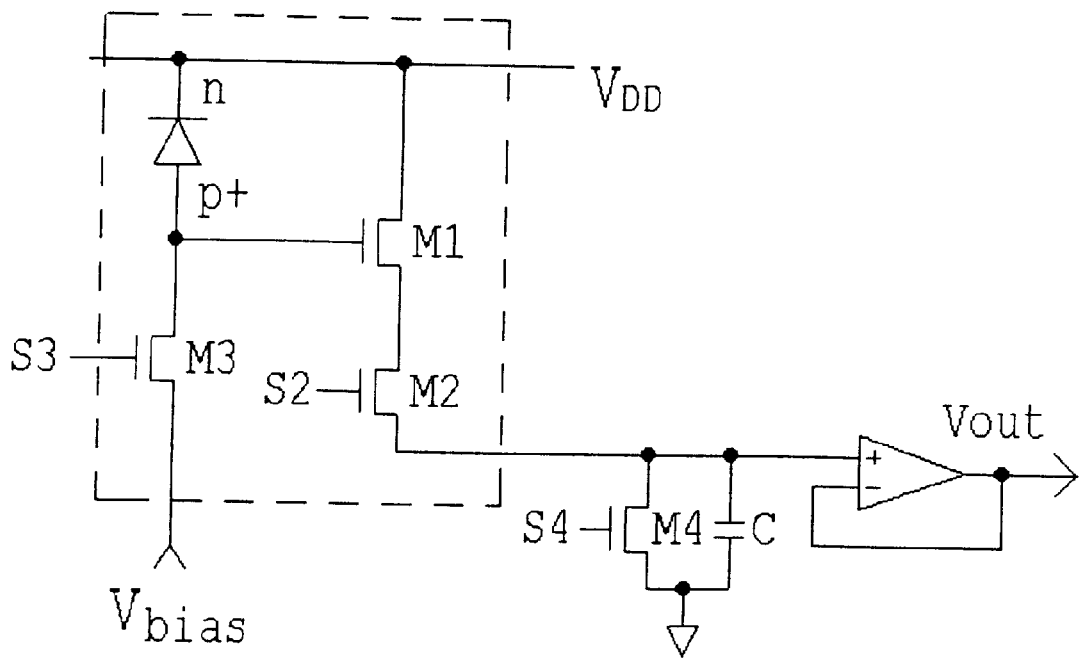
FIG. 7A illustrates the circuit diagram of a gate-biased charge-integration photodiode with a capacitor-loaded source-follower readout circuit.

Referring to FIG. 7A, a detailed schematic of the present invention, a gate-biased charge-integration photodiode, is the basic photosensing element for constructing single element, linear array and area array image sensing devices. This photodetector is comprised of a pn-junction photodiode, three major MOS transistors designated M1 through M3, and a voltage reference, Vbias. For an n-type substrate wafer of CMOS process technology, the photodiode is a p+n junction diode formed by a p+ diffusion layer to the n-type substrate; the p+ diffusion layer is the anode node of the photodiode, and the n-type substrate is the cathode. The p+ anode is connected to the gate terminal of an n-type MOS transistor M1. Transistor M1 functions as a voltage-buffering transistor or voltage-amplifying transistor for the voltage at the p+ node of the photodiode. Both transistors M2 and M3 function as the on-off switches for the photodetector; both transistors can be either n-type, or p-type, or transmission gate (with n-type and p-type transistors connected together in parallel) MOS transistors. However, n-type MOS transistors are preferred for M2 and M3 under this n-type substrate CMOS technology for optimizing the circuit design and photodetector performance. Transistor M2 functions as a readout switch for the photodetector, and transistor M3 serves as a precharging switch for discharging the gate terminal of the transistor M1 to a DC-biasing voltage of Vbias, and at the same time resetting the photodiode in the beginning of each photocharge-integration cycle.

Figure 7B:
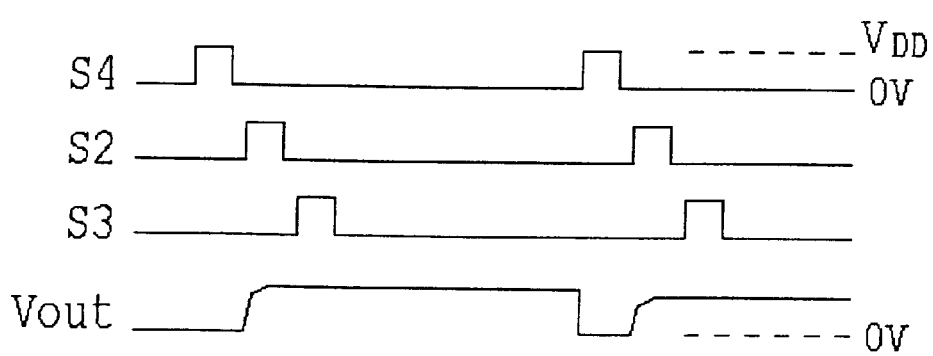
FIG. 7B illustrates the timing diagram of the photodiode and gate precharging switch M3, readout switch M2, capacitor load reset switch M4 and output signal for operating the photodetector element presented in FIG. 7A.

FIG. 7B shows the timing diagram of the precharge switch M3, readout switch M2, capacitive-load reset switch M4 and the readout signal Vout in operating the photodetector presented in FIG. 7A. The time duration, between the "on" time of transistors M3 and M2 of FIG. 7B, is the integration time of the photodetector. The readout mechanism begins with resetting the capacitive load to ground through the control signal CLK to the gate terminal of transistor M4. Then the readout control signal S2 is on, the capacitive load is charged through the M1 transistor to a voltage at the p+ node of the photodiode level about one threshold voltage of M1 below the photo-voltage signal. The timing for S2 and CLK have to be non-overlapping to ensure a correct readout signal. After completing the readout process with which the control signal S2 goes low, then the precharge control signal S3 is on, the p+ node of the photodiode and the gate terminal of transistor M1 are charged to the voltage of Vbias to initialize the photodetector for next charge integration cycle. The precharge mechanism serves the following purposes: (1) it sets the p+n photodiode in reverse-biased condition for photocharge integration (2) it sets the DC biasing voltage for the n-type MOS transistor M1 to operate in the high gain active region during the readout period (3) it removes the photosignal left from the previous readout cycle and eliminates the after image effect.

Figure 7C:
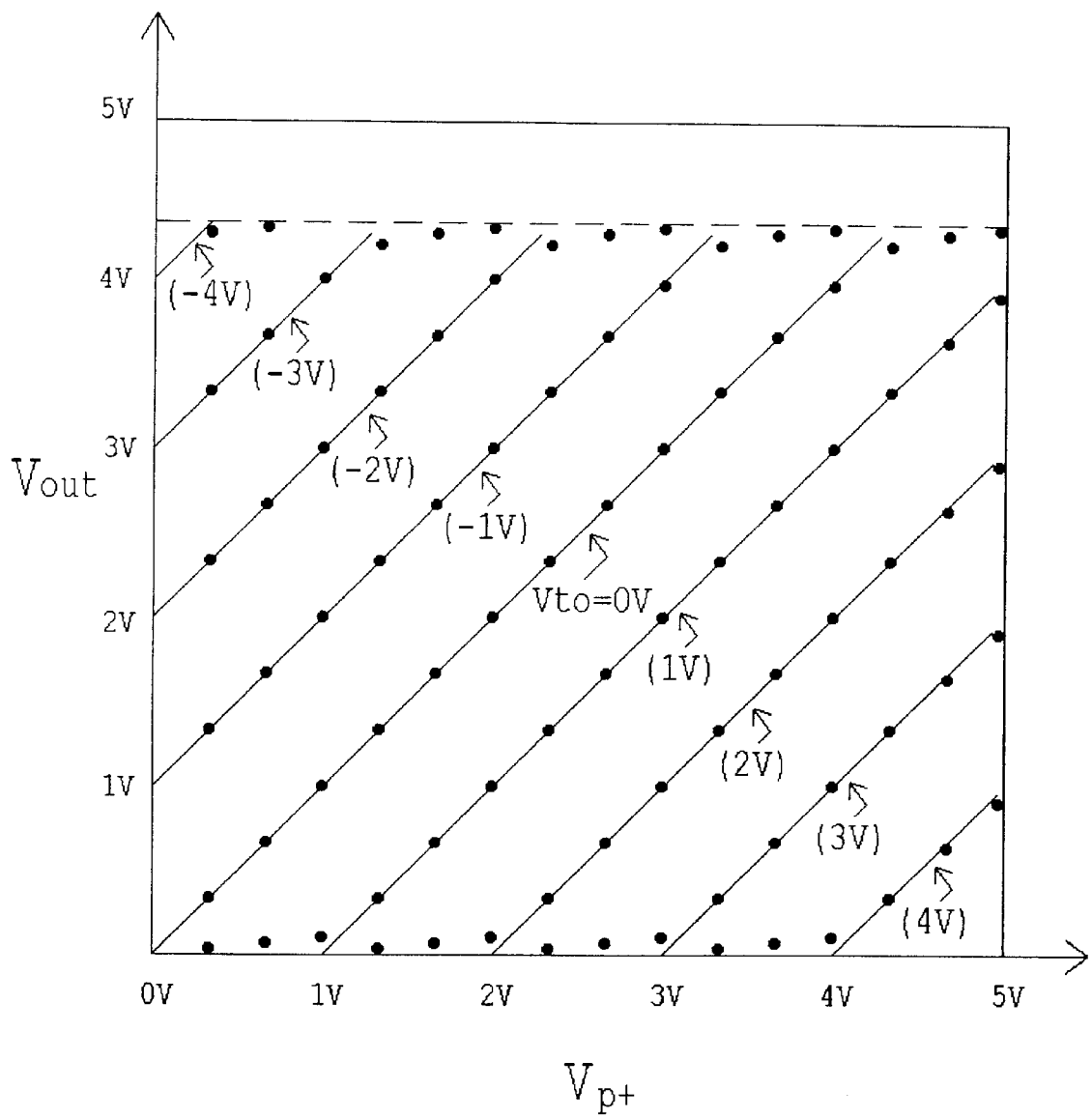
FIG. 7C illustrates the calculated photoresponse transfer characteristics of the photodetector element presented in FIG. 7A with variable threshold voltage value of the transistor M1.

FIG. 7C illustrates the calculated photoresponse transfer characteristics of the photodetector presented in FIG. 7A with variable threshold voltages of Vt0 of transistor M1. To emulate the photogenerated charge accumulated on the p+ node of the photodiode, electrical charge is injected from the voltage reference to the p+ node through the precharge switch M3. It can be seen that the transfer characteristic almost covers the entire operating region allowed by the supplied voltage Vdd. The output signal saturates to approximately 4.3V from threshold voltage and the body effect of the MOS transistor M2. If the threshold voltage Vt0 of the transistor M1 is greater than zero (Vt0>0), the transfer characteristic plots for each value of Vt0 can be divided into the following regions: (1) a cutoff region with slope almost equal to zero, when input voltage Vp+ of the p+ node is less than Vt0, (2) a rather abrupt transition region in which the slope changes from approximately zero to almost 1, (3) a substantially linear active region with a constant slope almost equal to 1 that extends up to 4 volts, within which this device is to be operated, and (4) a saturation region with slope decreasing slowly. If the threshold voltage Vt0 of the transistor M1 is less than zero (Vt0<0), the transfer characteristic plots for each value of Vt0 display only linear active region and saturation region. Therefore, by connecting the voltage reference Vbias to ground, the photodetectors of the present invention with negative Vt0 of transistor M1 will automatically operate in the linear active region.

Figure 8:
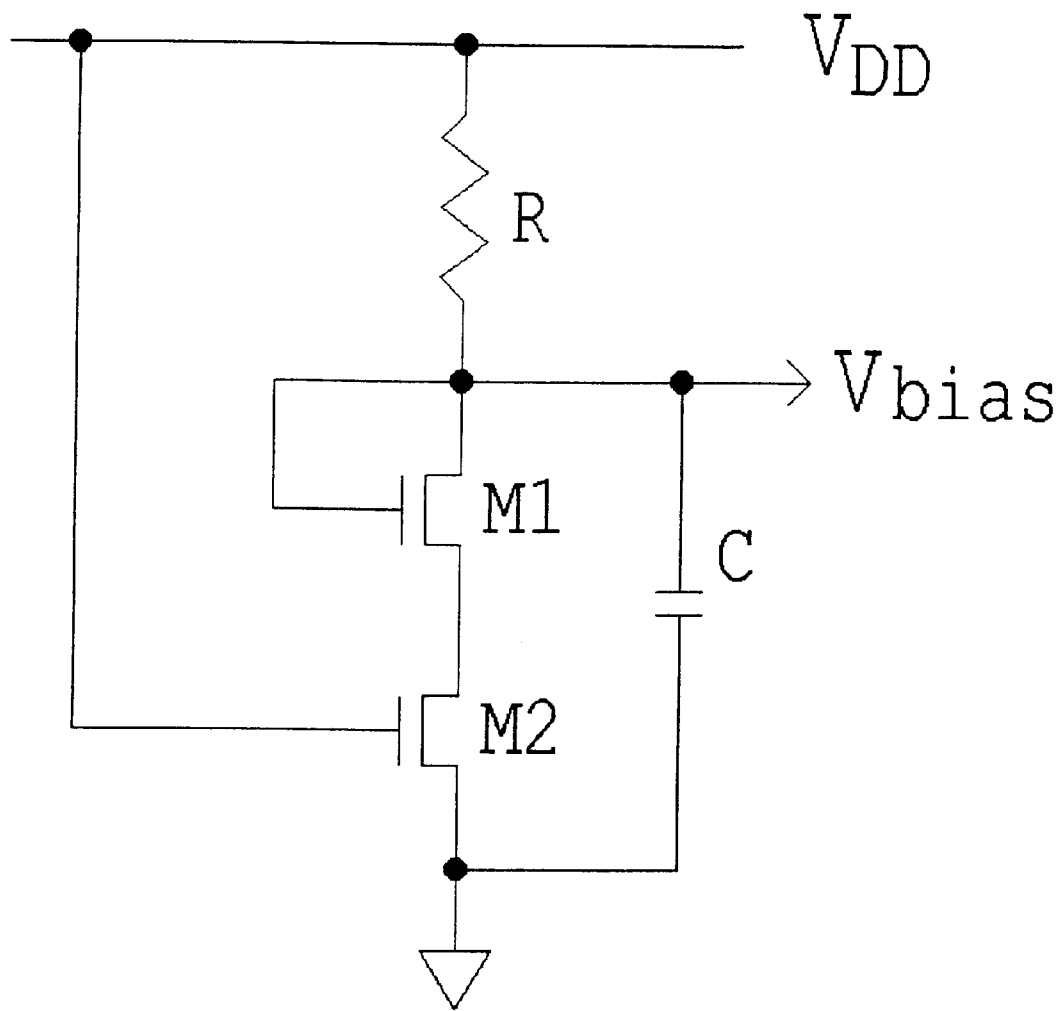
FIG. 8 illustrates a circuit diagram for the voltage reference Vbias to bias the photodetector presented in FIG. 7A to operate in the linear active region, when the threshold voltage Vt0 of transistor M1 is greater than zero, and M1 is an enhancement mode transistor.

FIG. 8 illustrates a simple circuit diagram for voltage reference Vbias if the Vt0 of transistor M1 is greater than zero. It is designed as a replica circuit of transistor M1 and M2 operated during the readout period. Precharging the n+ node to the voltage Vbias, the DC offset voltage of the output signal will maintain approximately constant regardless of variations of the operating temperature. This voltage reference circuit can be integrated on chip with the photodetector of the present invention.

Figure 9:
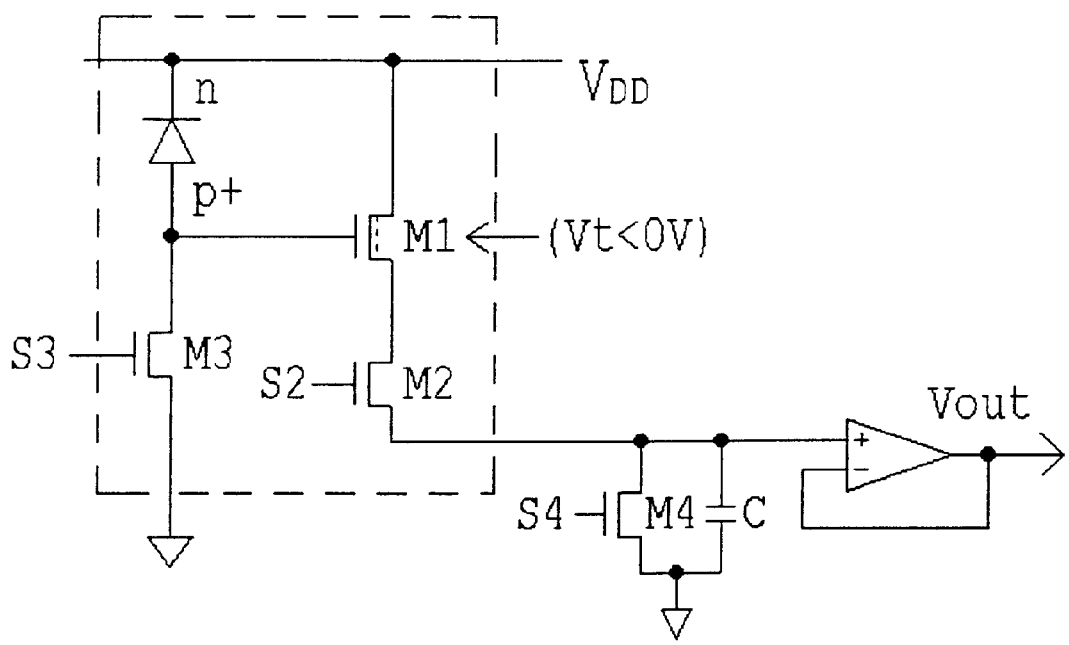
FIG. 9 illustrates a modified circuit diagram for the photodetector element of FIG. 7A, when the threshold voltage Vt0 of the transistor M1 is less than zero, and M1 is a depletion mode transistor. The voltage reference circuit can be omitted, and Vbias can be tied to ground.

FIG. 9 illustrates the circuit diagram of the gate-biased charge-integration photodiode of the present invention when a negative threshold voltage of Vt0 of the transistor M1 is implemented. By connecting the voltage reference Vbias to ground, the photodetector is operated between Vdd and ground.

If the voltage stabilization for DC offset and temperature variations are required, a differential readout technique can be implemented by incorporating a dummy photodetector having the same circuit diagram of FIG. 9 except with the photodiode shielded by a light blocking metal plate.

Figure 10A:
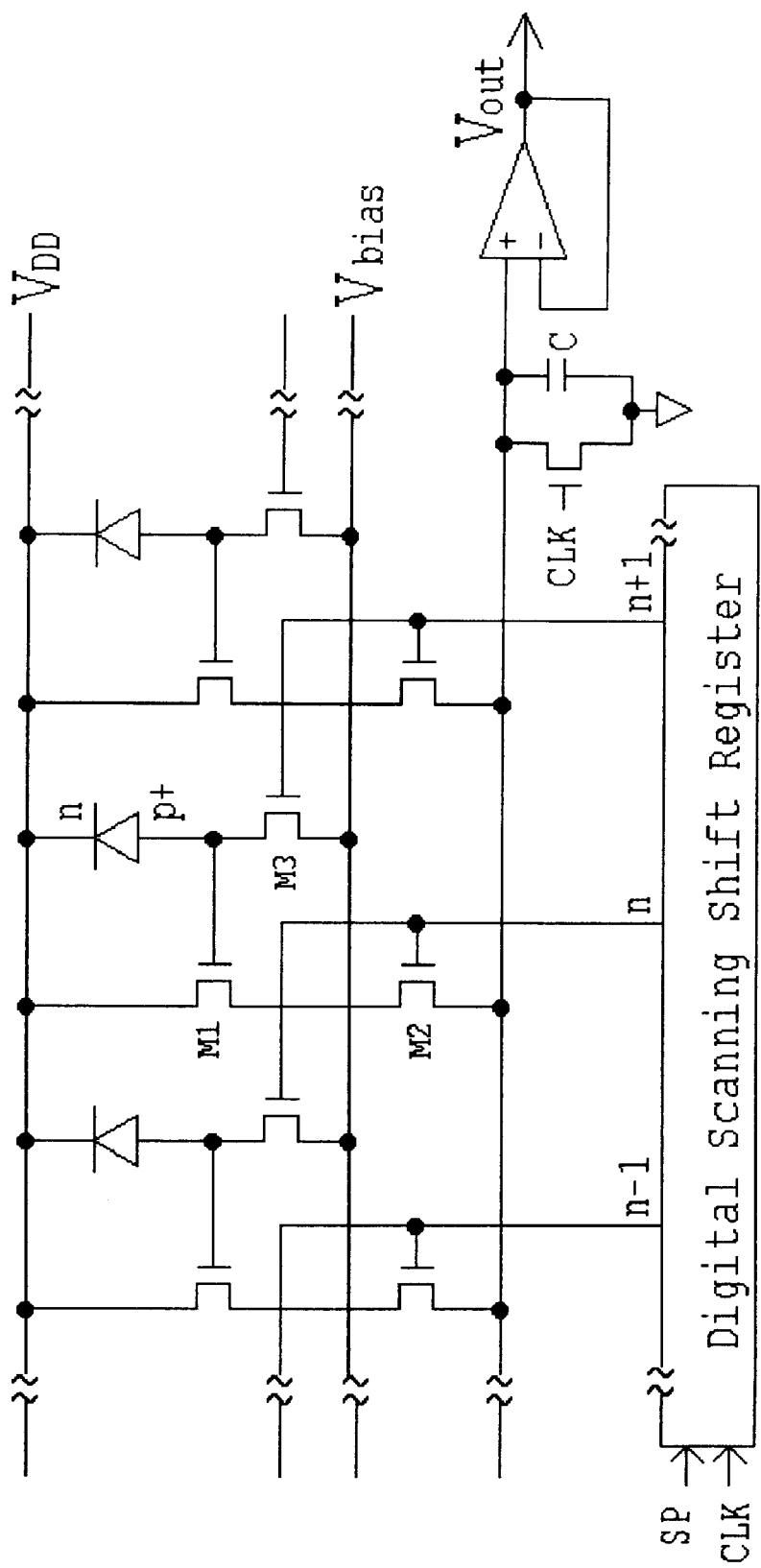
FIG. 10A illustrates a circuit diagram of a linear-array image-sensing device that contains a plurality of photodetector element of FIG. 7A configured in a one-dimensional structure and the readout circuitry.

FIG. 10A illustrates a linear-array image-sensing device that contains a plurality of photodetecting elements of FIG. 7A. In the drawings, only three photodetecting elements are shown to illustrate the control timing relationships between adjacent photodetecting elements. The circuit also includes the capacitive-load readout circuitry and a unity gain operational amplifier as a buffer amplifier for output video signal. The circuit further includes a digital scanning shift register which sequentially activates the readout switches of each of the photo-detecting elements.

Figure 10B:
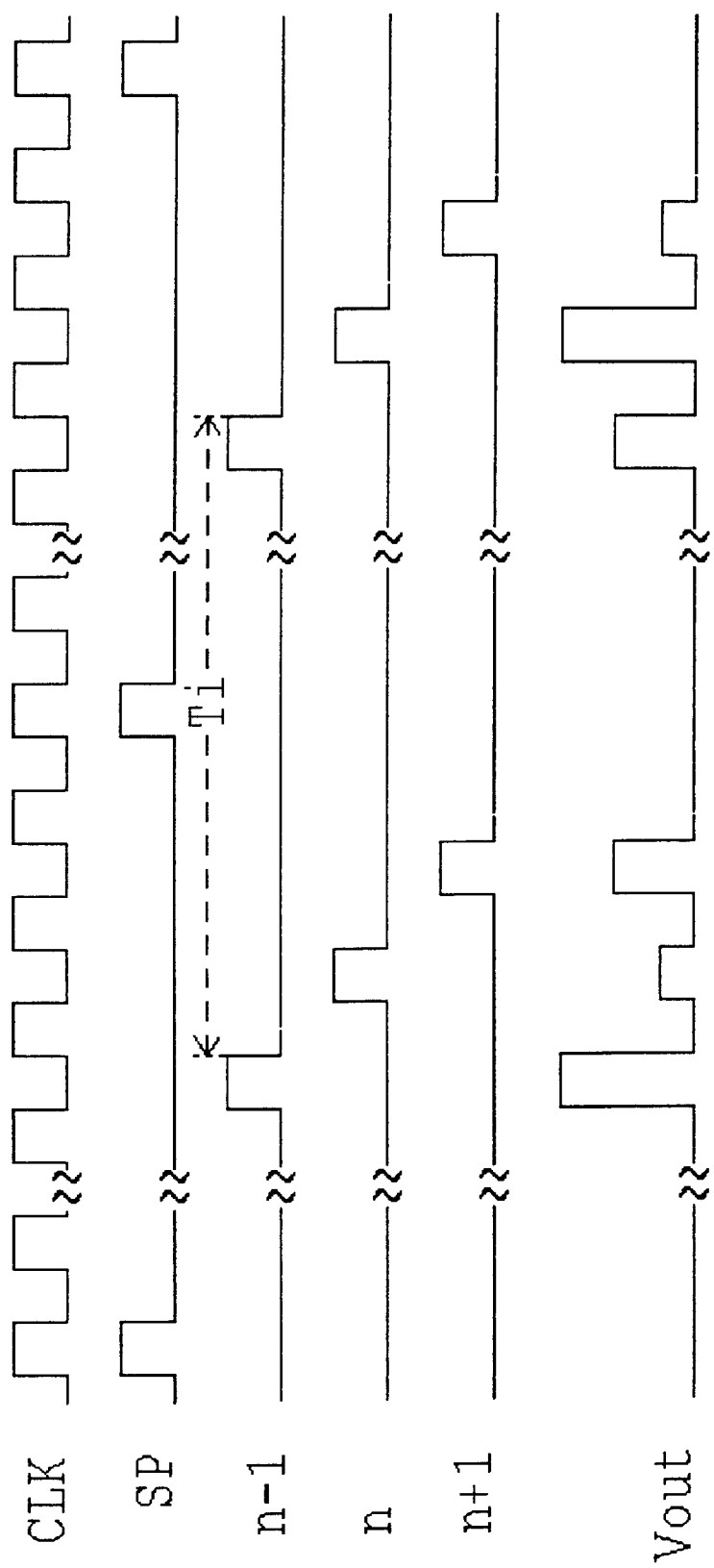
FIG. 10B illustrates the timing control signals to operate the image sensing device presented in FIG. 10A.

The timing control signals to operate this linear array are depicted in FIG. 10B. The clock control signal CLK continuously clocks the shift register and resets the capacitive load forcing the output signal to stay at ground level. When the start pulse control signal is applied to the shift register it sequentially activates the readout switch of each photodetecting element to output the photosignal to the capacitor load by employing capacitive-load source follower readout operation. While the digital shift register activates the readout switch of a photodetecting element, the adjacent photodetecting element activated one clock cycle earlier is engaging in the precharging process with the same control signal from the shift register. This precharging operation sets up the photodetecting elements for the next line to be scanned. The integration time for one line is approximately the time between two consecutive readouts for a given photodetecting element. During the integration time, the signal charge generated by the incident light will accumulate at the photodiode of the photodetecting element, changing the photodiode voltage by an amount defined as Qs/Cd, where Qs is the signal charge and Cd is the capacitance of the photodiode.

Figure 11A:
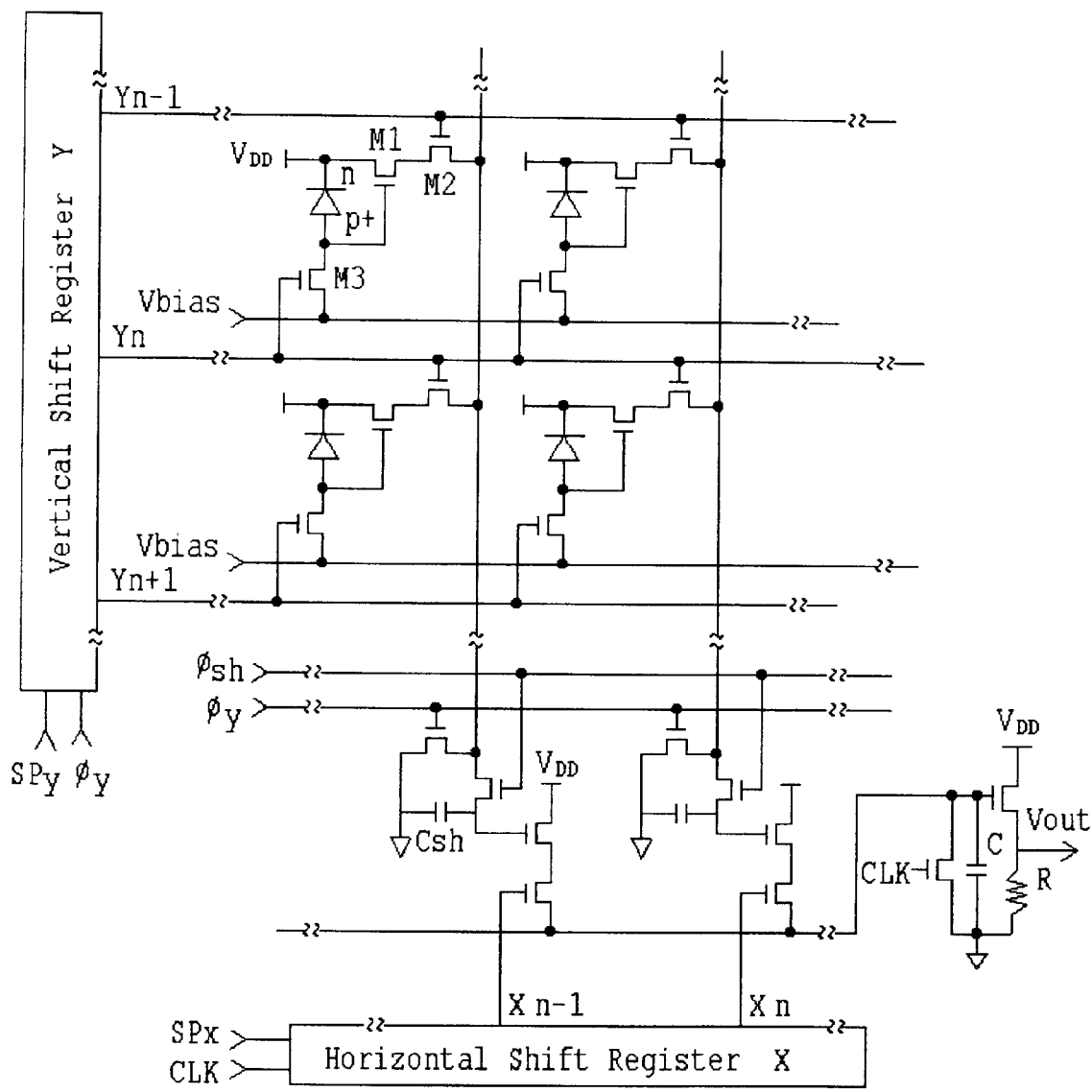
FIG. 11A illustrates a circuit diagram of an area-array image sensing device that contains a plurality of photodetector elements of FIG. 7A configured in a two dimensional structure and the readout circuitry.

FIG. 11A shows an area array image-sensing device that contains a plurality of photodetecting elements of FIG. 7A. In the drawings only a 2×2 matrix of photodetecting elements is shown to illustrate the control timing signals required to operate this device. The circuit also includes a capacitive-load readout and sample-and-hold circuitry for each column, and a capacitive load readout circuit and buffer amplifier for outputting video signal. The circuit further includes two digital scanning shift registers, vertical shift register Y and horizontal shift register X, outputting with coordinating control signals to sequentially output the video signals one row at a time.

Figure 11B:
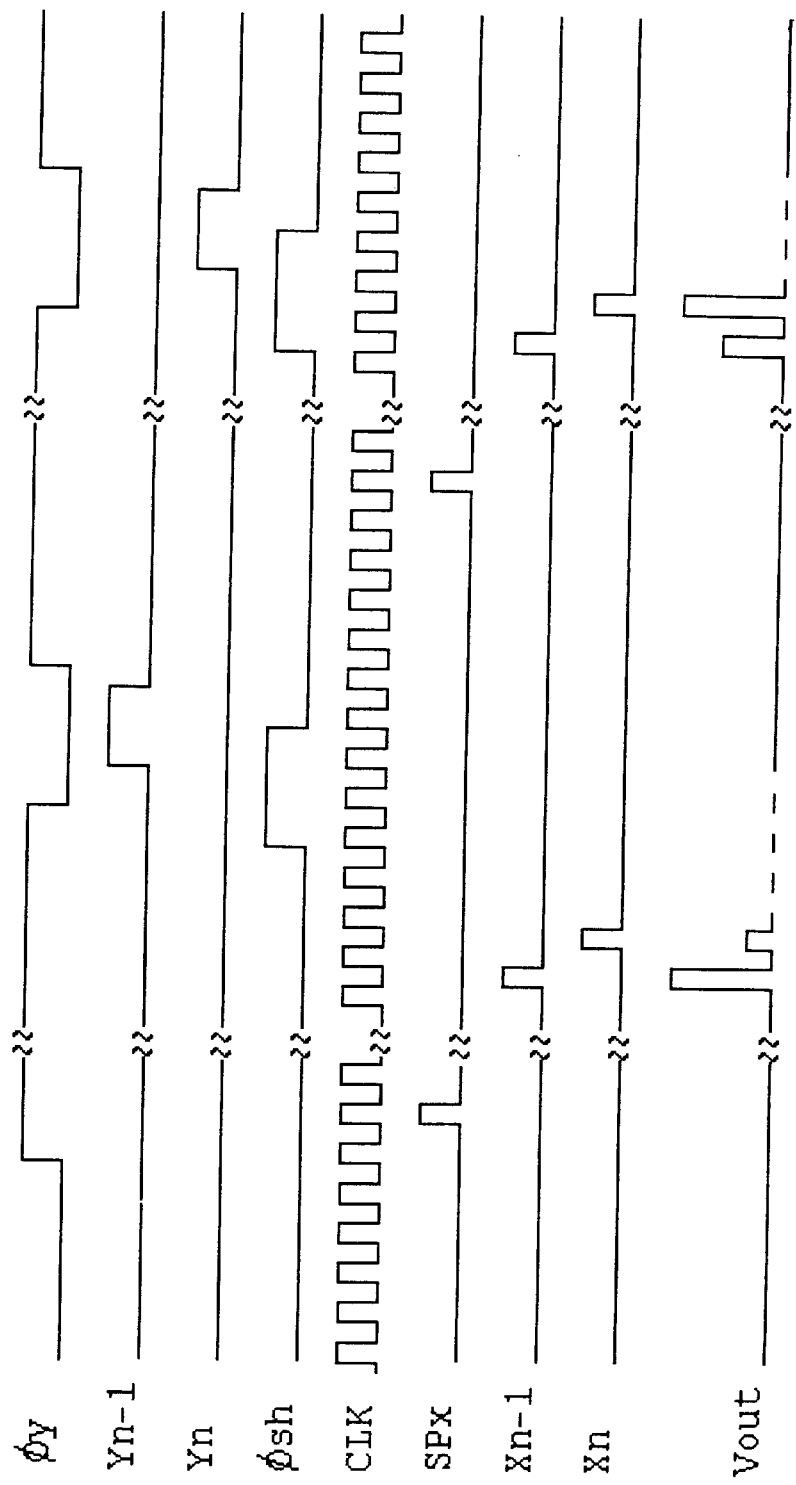
FIG. 11B illustrates the timing control signals to operate the image sensing device presented in FIG. 10A.

The timing control signals to operate this area array are depicted in FIG. 11B. The photodetecting elements from the same Nth row are activated in parallel at the same time by the N output of the Y shift register, and each photosignal on the same row is output to its respective column capacitive load and is stored as a sample-and-hold signal on the capacitor. Then a start pulse control signal is loaded into the X shift register which sequentially activates the readout switch of each sample-and-hold stage and outputs the photosignals to the output of the buffer amplifier. After completing the readout of one row, the Y shift register shifts to the next row and repeats the readout process described above.

While engaging the readout on one row, the same shift register is precharging the photodetecting elements belonging to the previous row. This precharging operation allows the photodetecting elements to begin integration for the next frame to be scanned. The integration time for one frame is approximately the time between two consecutive readouts for a given row of photodetecting elements. The circuit design for the timing control signals to operate this area array is quite economic and efficient because of the simplicity in the design of the photodetecting element and the employment of capacitor-loaded readout circuitry. Excellent sensitivities and anti-blooming characteristics are expected from this device.

Figure 12:
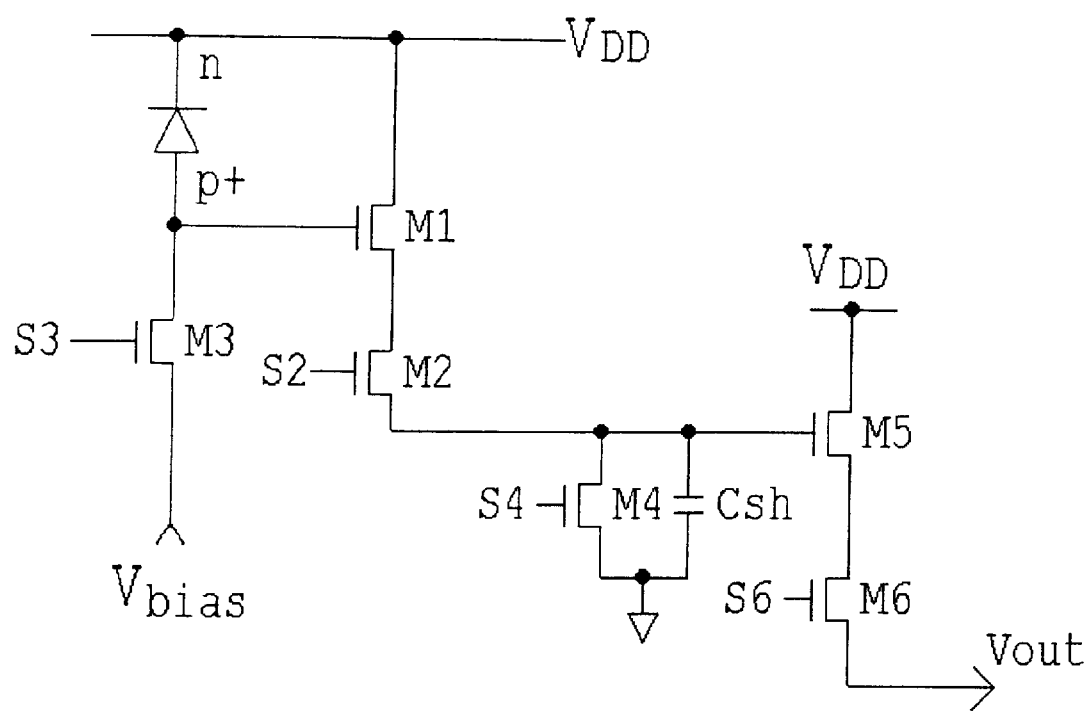
FIG. 12 illustrates the circuit diagram of a photodetector element which comprises the photodetector of FIG. 7A and a switch resettable capacitor load with a buffer amplifier as the sample-and-hold circuit for the photodiode signal.

FIG. 12A illustrates another photodetector of the present invention. The photodetector comprises the photodetector of FIG. 7A and a switch-resettable capacitor load with a buffer amplifier as the sample-and-hold circuitry for the photodiode signal. The operation of the photodetector is best described by the linear array constructed with a plurality of photodetecting elements of FIG. 12A. This linear array is shown in FIG. 13A.

Figure 13A:
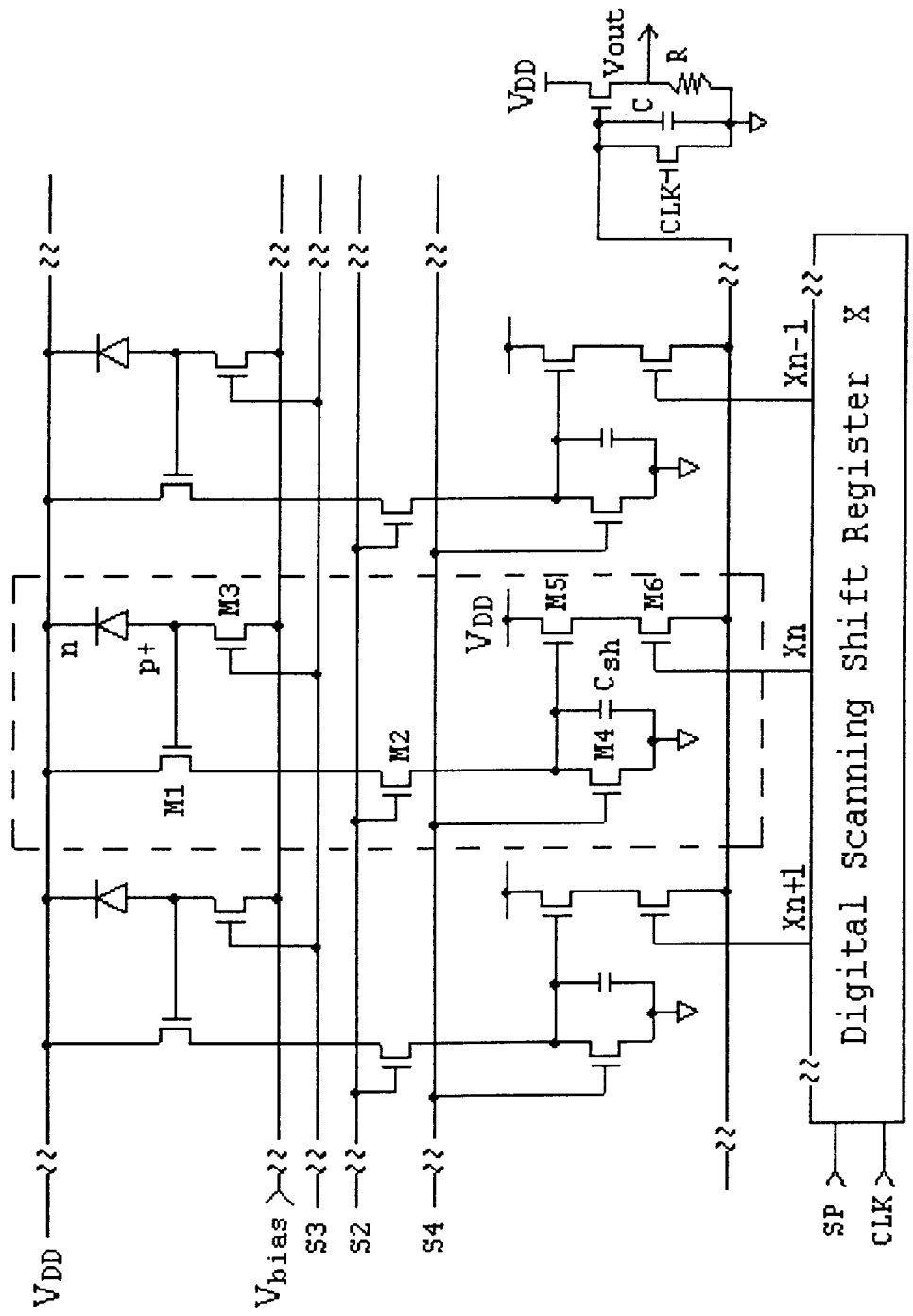
FIG. 13A illustrates a circuit diagram of a linear-array image-sensing device that contains a plurality of photodetector elements of FIG. 12A configured in a one-dimensional structure and the readout circuitry.

In the drawings of FIG. 13A, only three photodetecting elements are shown for the description of the control timing signals required to operate the device. The circuit also includes the capacitor-load readout circuit with a buffer amplifier to output the video signal. The circuit further includes a digital scanning shift register, which sequentially activates the readout switches of each of the photodetecting elements.

Figure 13B:
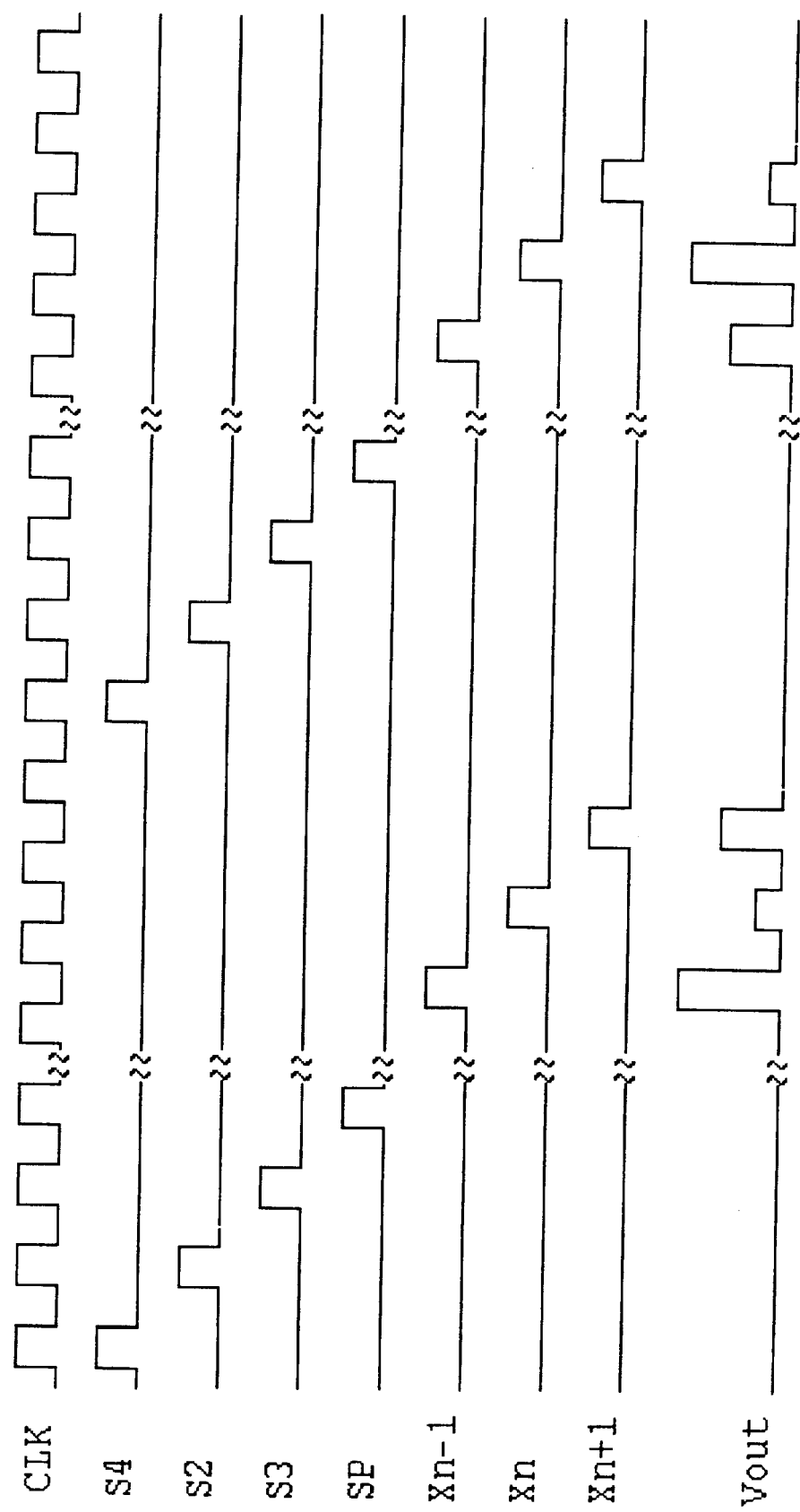
FIG. 13B illustrates the timing control signals for operating the image sensing device presented in FIG. 13A.

The timing control signals to operate this linear array are depicted in FIG. 13B. The readout process begins with resetting all the sample-and-hold capacitors to ground by applying the control signal S4 to each capacitor-reset switch M4 of each photodetecting element. Then the control signal S2 turns on the readout switch M2 of each photodetecting element, the photosignals present in the photodiodes charge the respective capacitors by each corresponding buffer transistor M1 and then hold on the capacitors as soon as the S2 signal turns off. Afterward, the precharging control signal S3 turns on to precharge the photodiode and the transistor M1 for each photodetecting element. The photodetecting elements then begin the integration for the next line to be scanned. The integration time for one line is approximately the time between two consecutive precharging processes. During the integration time, the digital shift register is sequentially activating each of the readout switches of the sample-and-hold circuit to output the video signals of the previous scan. This imaging device functions like a CCD linear array; wherein each of the photosite signals is transferred at the same time in parallel into its respective analog CCD shift-register memories, then the memorized signals are sequentially shifted out through the charge-sensing amplifier while the photosensing elements engage the photocharge integration for the next scan. Arrays of the type shown in FIG. 13A can be used for color CIS scanners employed with three switching LED light sources to increase the throughput by reducing the scanning time per line.

FIG. 14A illustrates another photodetector of the present invention. The photodetector comprises the photodetector element of a voltage-pickoff charge-integration photodiode integrated on a p-type substrate CMOS process and a switch-resettable capacitor load with a buffer amplifier as the sample-and-hold circuitry for the photodiode signal. The operation of the photodetector is best described by the linear array constructed with a plurality of photodetecting elements of FIG. 14A. This linear array is shown in FIG. 15A.

Figure 15A:
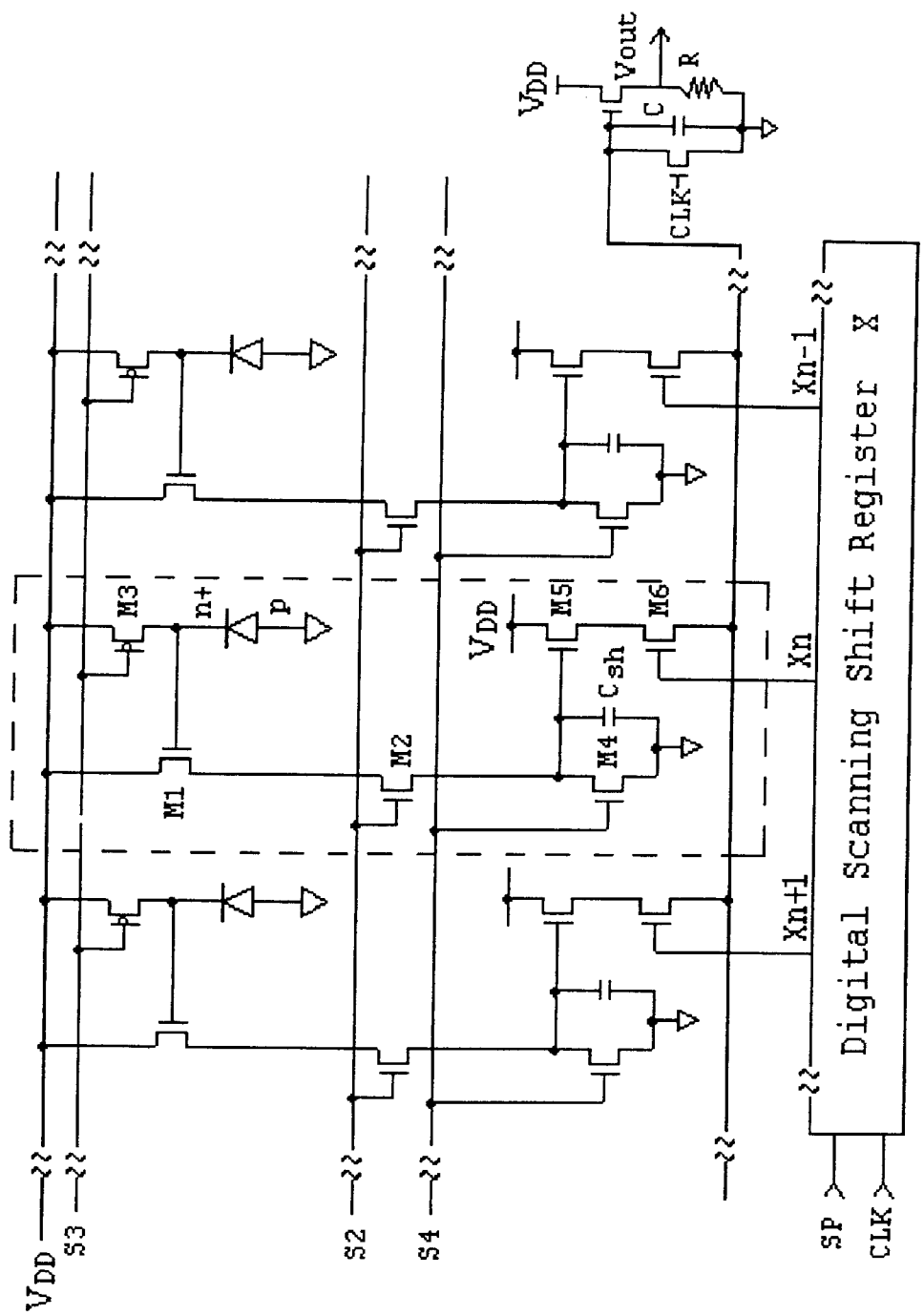
FIG. 15A illustrates a circuit diagram of a linear-array image-sensing device that contains a plurality of photodetector elements of FIG. 14 configured in a one-dimensional structure and the readout circuitry.

In the drawings of FIG. 15A, only three photodetecting elements are shown for the description of the control timing signals required to operate the device. The circuit also includes the capacitor-load readout circuitry with a buffer amplifier to output the video signal. The circuit further includes a digital scanning shift register which sequentially activates the readout switches of each of the photodetecting elements.

Figure 15B:
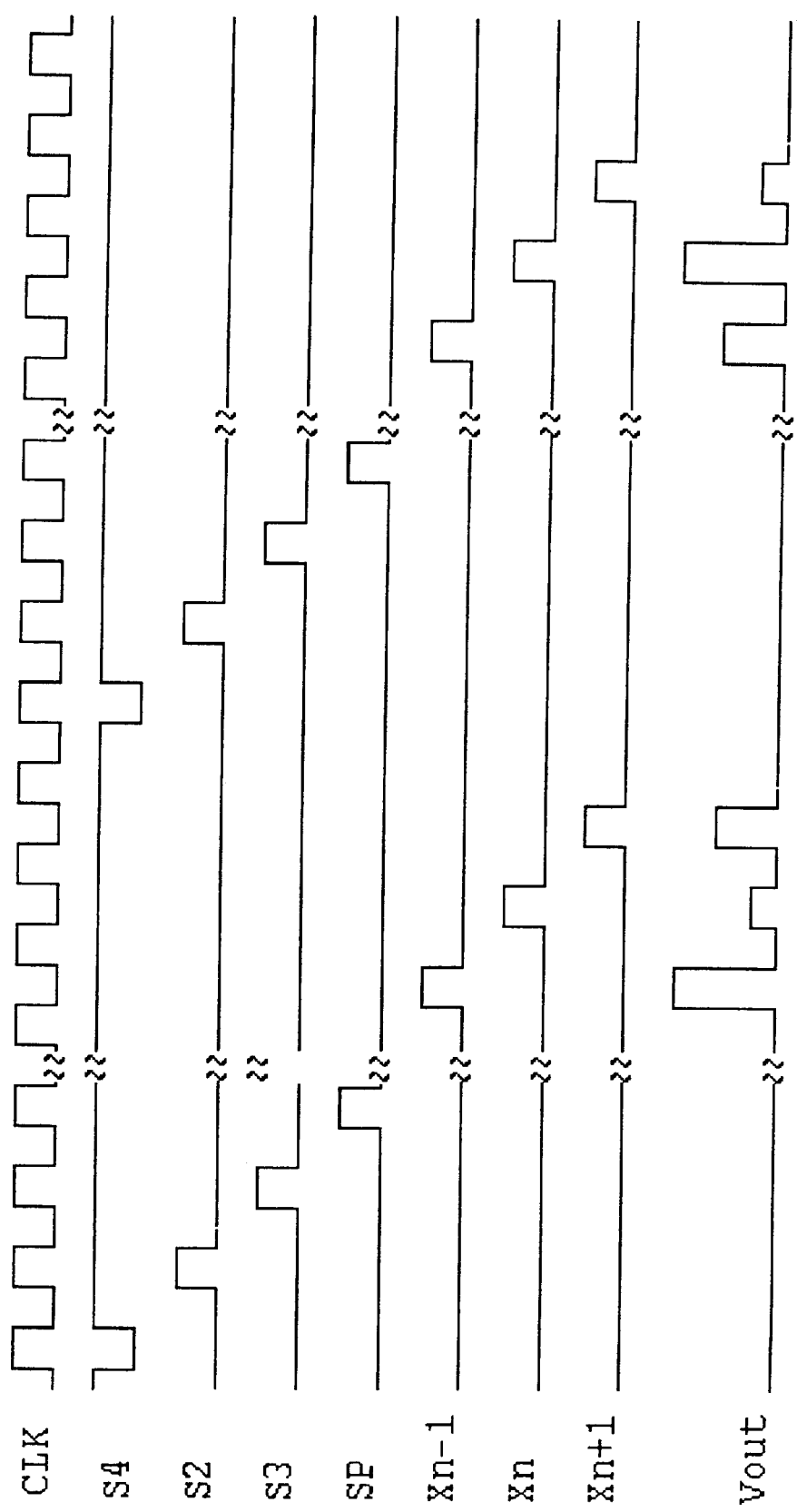
FIG. 15B illustrates the timing control signals for operating the image sensing device presented in FIG. 15A.

The timing control signals to operate this linear array are depicted in FIG. 15B. The operating method in reading out the video signals is exactly the same as that of the device shown in FIG. 13A. The descriptions of the operation will not elaborated here again. The benefits in constructing this array are: (1) cost effective, p-type substrates are more often used in standard CMOS process technologies, (2) the reset switch M3 and readout switch M2 of each of the photodetecting elements are activated from a single control signal, therefore body-effect problems caused by the transistors M3 and M2 during the operation can be eliminated by replacing both switches with transmission gate transistors with little overhead in the circuit design. The difference between the arrays of FIG. 13A and FIG. 15A is in the way the output signal levels are related to the light intensity. The video output signals increase with increasing light intensity for the array of FIG. 13A, and the video output signals decrease with increasing light intensity for the array of FIG. 15A.

Figure 16A:
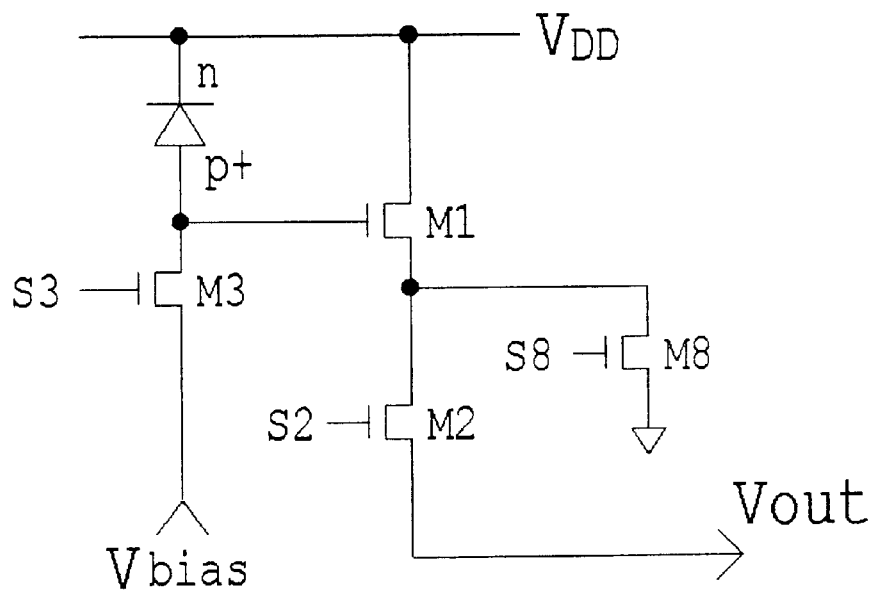
FIG. 16A illustrates a circuit diagram comprising the photodetector of FIG. 7A and a MOS switch to reset the source terminal of transistor M1 to ground through the control signal S3.

FIG. 16A illustrates a circuit diagram comprising the photodetector of FIG. 7A and a MOS switch to reset the source terminal of transistor M1 through the control signal S3 to ground.

Figure 16B:
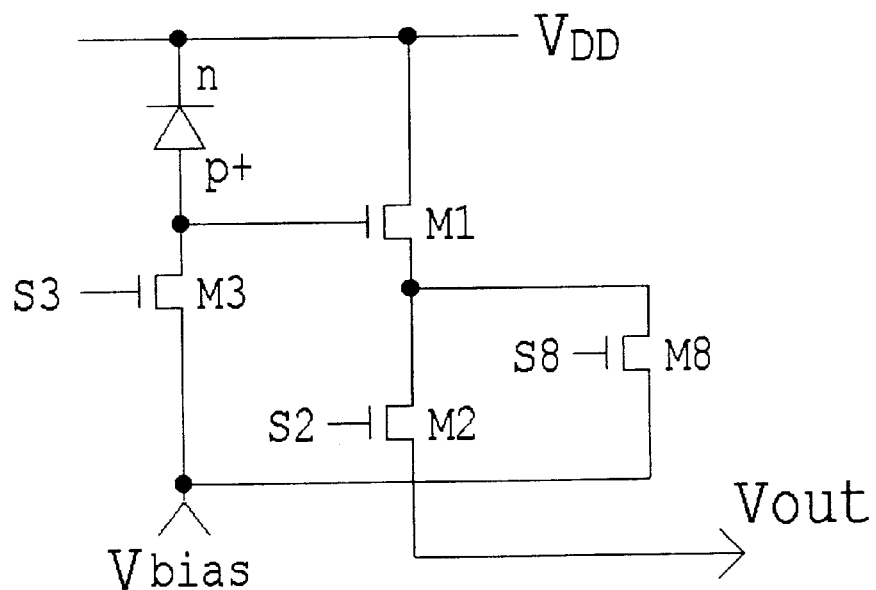
FIG. 16B illustrates a circuit diagram comprising the photodetector of FIG. 7A and a MOS switch to reset the source terminal of transistor M1 to Vbias through the control signal S3.

FIG. 16B illustrates a circuit diagram comprising the photodetector of FIG. 7A and a MOS switch to reset the source terminal of transistor M1 through the control signal S3 to Vbias.

Figure 16C:
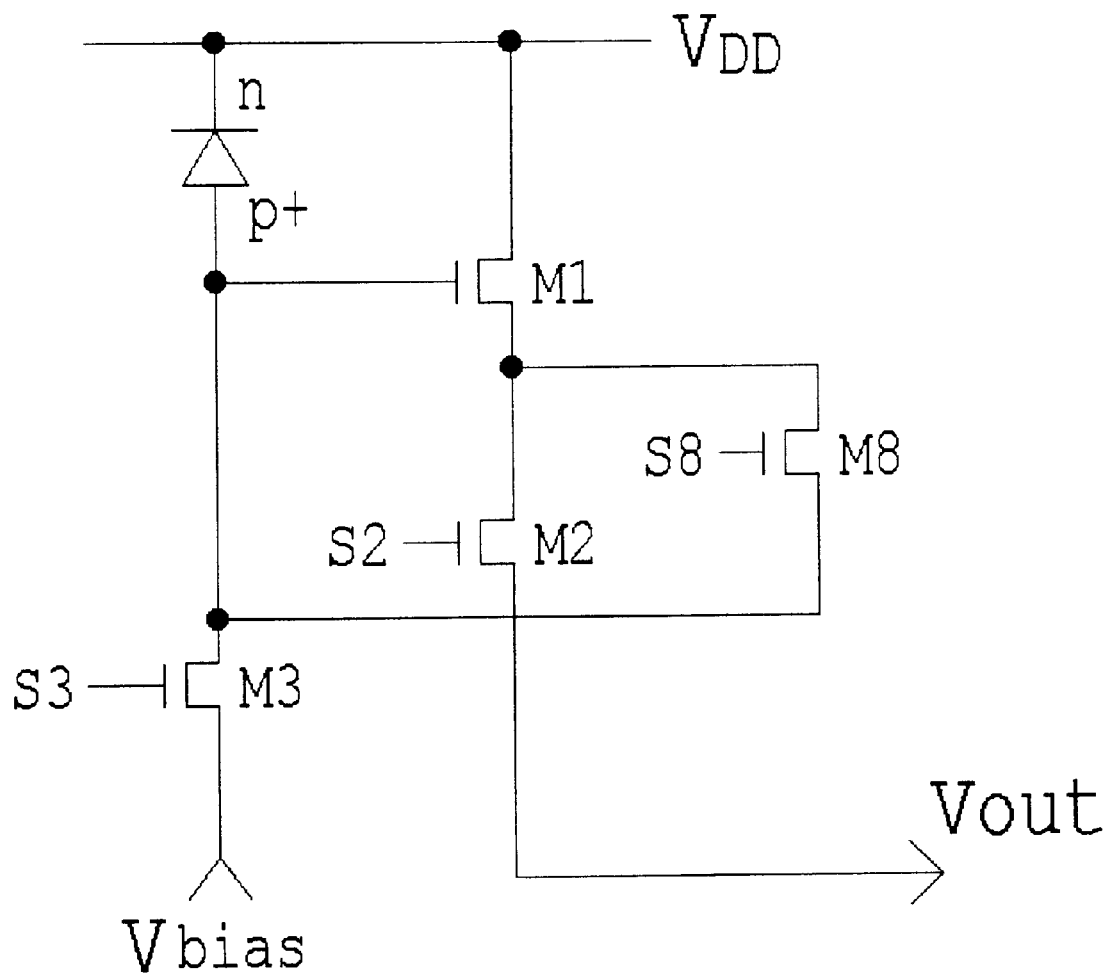
FIG. 16C illustrates a circuit diagram comprising the photodetector of FIG. 7A and a MOS switch to reset the source terminal of transistor M1 to the source terminal of transistor M3 through the control signal S3.

FIG. 16C illustrates a circuit diagram comprising the photodetector of FIG. 7A and a MOS switch to reset the source terminal of transistor M1 through the control signal S3 to the source terminal of transistor M3.

During the precharging cycle for the photodetector of FIG. 7A, the source terminal of transistor M1 is floating, and contains the charge signal remaining from the previous readout cycle which may cause crosstalk between the adjacent readout signals or fixed pattern noise for the readout signals. This effect can be eliminated by resetting the source terminal of transistor M1 during the precharging cycle through a MOS switch connected between the source terminal and either a voltage source or ground. However, a transient current will flow from Vdd to either voltage source or ground through transistor M1 and the source terminal reset switch. This new modification of the photodetecting element is illustrated in FIG. 16 and is included in the photodetectors of the present invention.

Figure 17A:
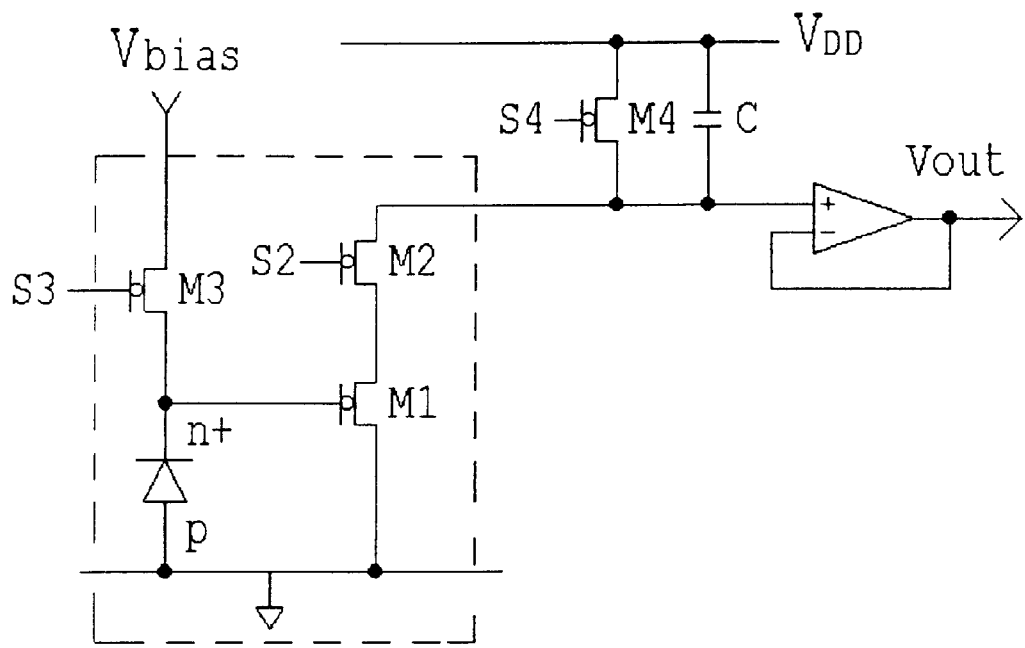
FIG. 17A illustrates the circuit diagram of a gate-biased charge-integration photodiode integrated on p-type substrate CMOS technology with a capacitor-loaded source follower readout circuit The MOS transistors are all p-type MOS transistors, and the photodiode is an n+p junction photodiode.

FIG. 17A illustrates the circuit diagram of a gate-biased charge-integration photodiode integrated on a p-type substrate using CMOS process technology with a capacitor-loaded source-follower readout circuit.

Figure 17B:
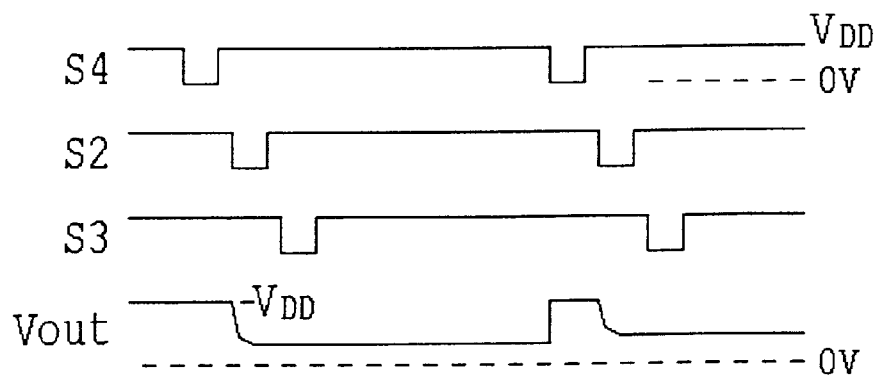
FIG. 17B illustrates the timing diagram of the photodiode and gate precharging switch M3, readout switch M2, capacitor load reset switch M4 and output signal for operating the photodetector element presented in FIG. 17A.

FIG. 17B illustrates the timing diagram of the photodiode and gate precharging switch M3, readout switch M2, capacitor load reset switch M4 and output signal for operating the photodetector element presented in FIG. 17A.

Figure 17C:
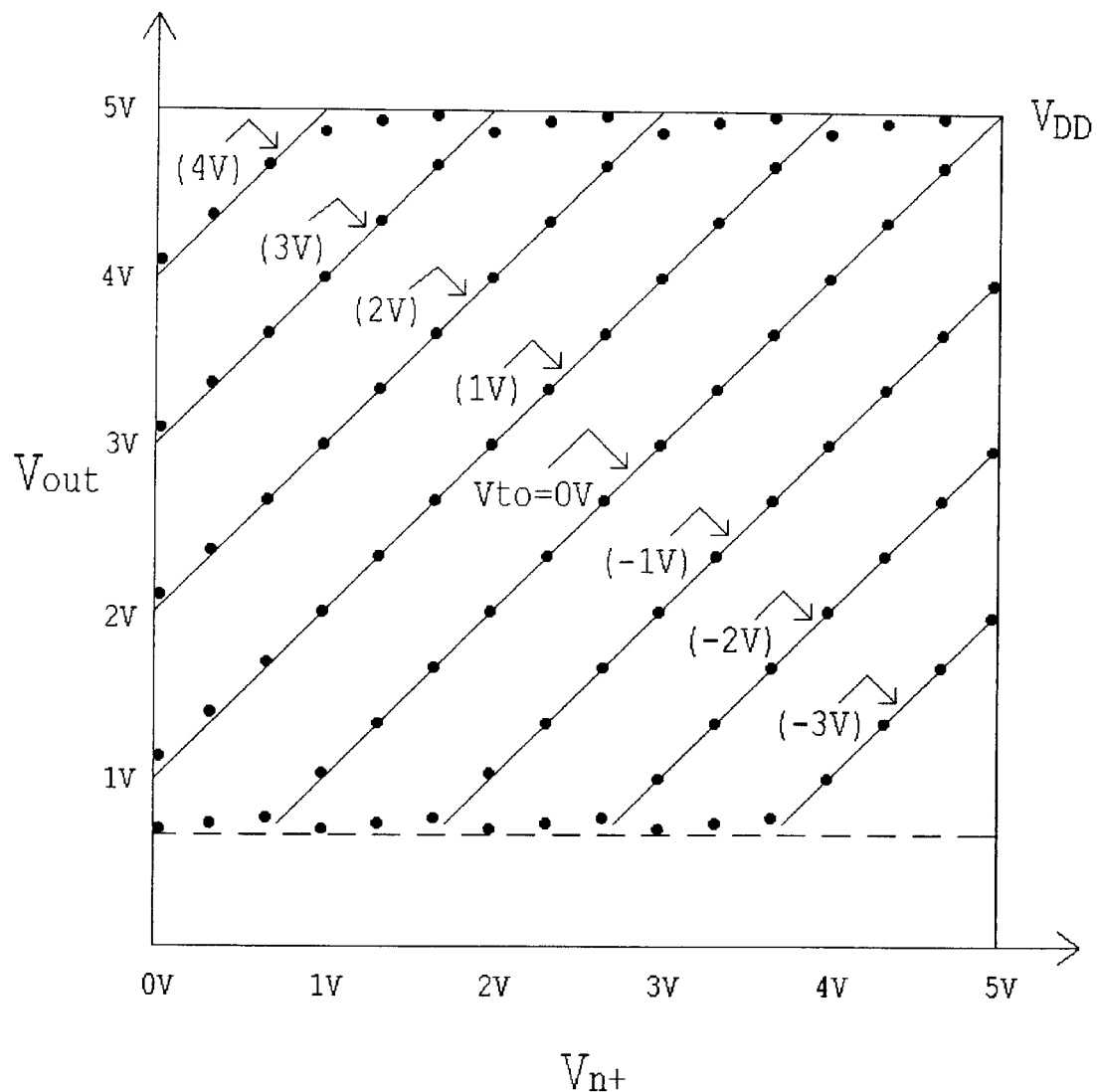
FIG. 17C illustrates the calculated photoresponse transfer characteristics of the photodetector element presented in FIG. 17A with a variable threshold voltage value for transistor M1.

FIG. 17C illustrates the calculated photoresponse transfer characteristics of the photodetector element presented in FIG. 17A with variable threshold voltage Vt0 for transistor M1.

Figure 18:
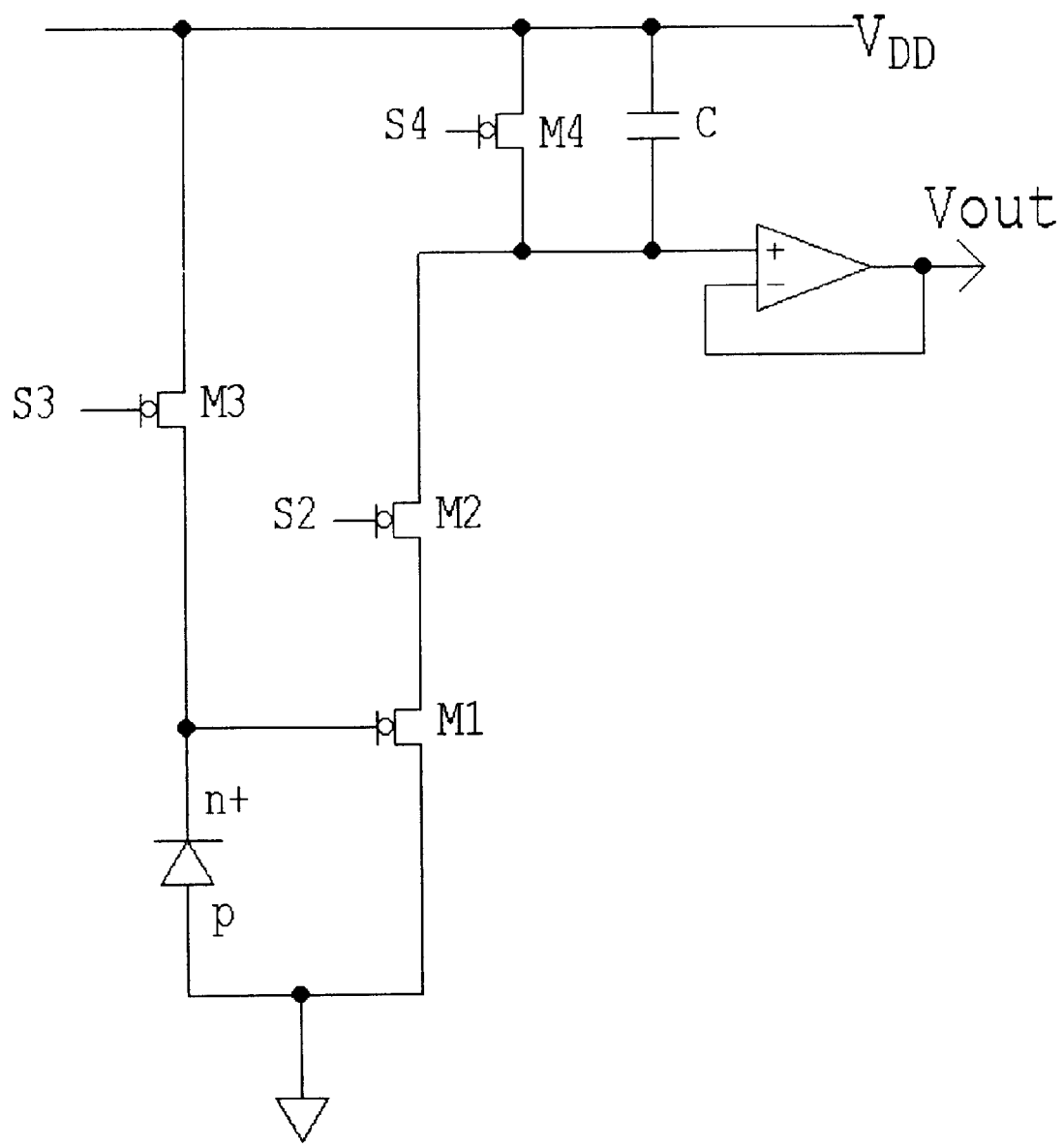
FIG. 18 illustrates a modified circuit diagram for the photodetector element of FIG. 17A, when the threshold voltage Vt0 of the transistor M1 is greater than zero (Vt0>0), and M1 is a depletion mode transistor. The voltage reference circuit can be omitted, and Vbias can be tied to Vdd.

FIG. 18 illustrates a modified circuit diagram for the photodetector element of FIG. 17A, when the threshold voltage Vt0 of transistor M1 is greater than zero. The voltage reference circuit can be omitted, and Vbias can be tied to Vdd.

The photodetector cell of the invention as shown in FIG. 7A uses capacitive-load readout method for outputting the video signal. The circuit of this photodetector cell is very simple and it is very easy to form into multiple photodetector arrays. However, when higher video output data rate and higher signal dynamic range are required, the capacitive-load readout method is insufficient to meet these requirements.

Photodetector with improving output data rate and video signal dynamic range can be obtained by further modifying the photodetector cell and the capacitive load of the invention.

Figure 19A:
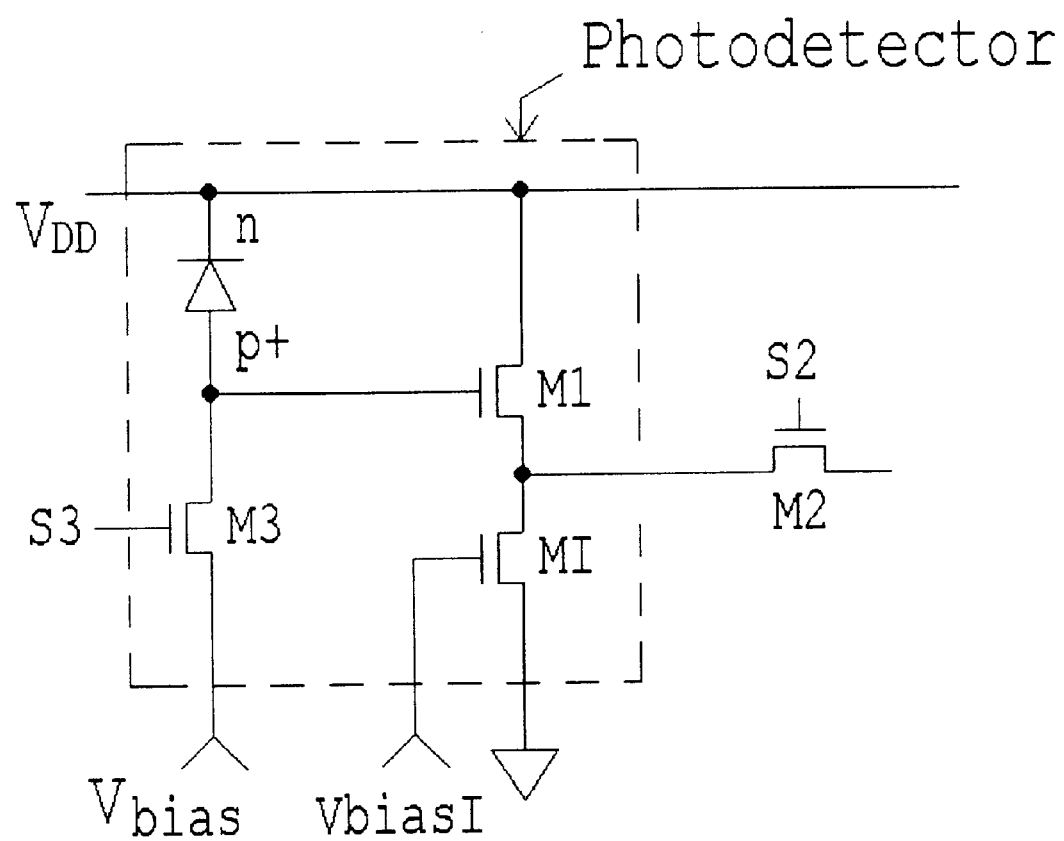
FIG. 19A illustrates the circuit diagram of a gate-biased charge-integration photodiode with a current-source load.
Figure 19B:
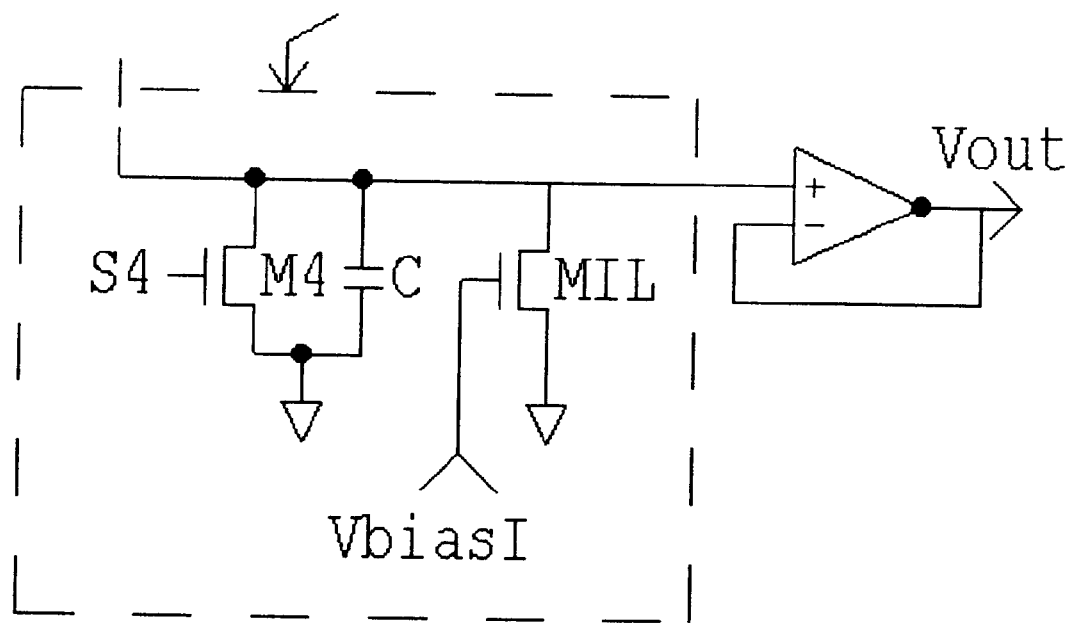
FIG. 19B illustrates the circuit diagram of a capacitor-loaded source follower readout circuit with a current-source load.

Referring to FIG. 19A and FIG. 19B, detailed schematics of the present invention, a current-source load MOS transistor MI is incorporated in the previous gate-biased charge-integration photodiode, and a current-source load MOS transistor MIL is incorporated in the capacitive load of the readout amplifier circuit. Both circuits are the basic building elements for constructing single element, linear array and area array image sensing devices. The photodetector is comprised of a pn-junction photodiode, three major MOS transistors designated M1, M3, and MI, and voltage references, Vbias and VbiasI. The MOS transistor M2 will be included in the photodetector element when photosensing devices are implemented. The transistor MI functions as the current-source load of the buffer amplifier transistor M1, enabling its output voltage to follow instantaneously the voltage signal at the p+ node of the photodiode. The transistor MI greatly reduce the settling time for charging the capacitive load to the output voltage. The current-source-load MOS transistor MIL, connected in parallel with the capacitive load, reduces the charging time constant for the output signal.

Figure 20:
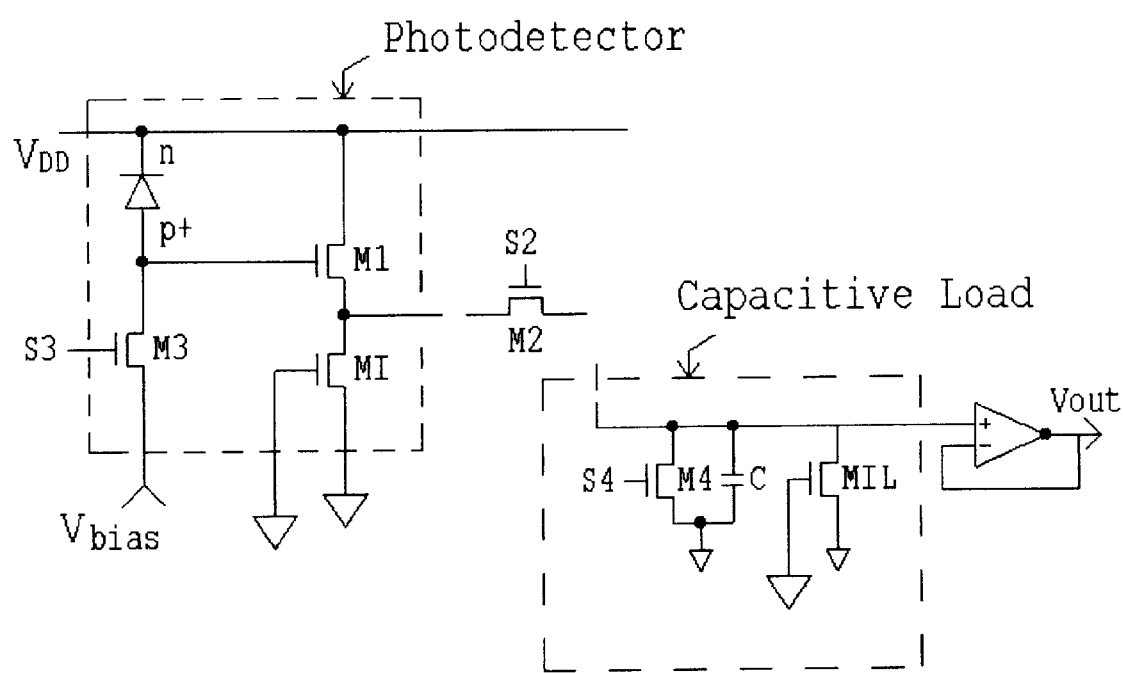
FIG. 20 illustrates a special version of the photodetector element of FIGS. 19A and 19B where VbiasI is connected to the ground.
Figure 21:
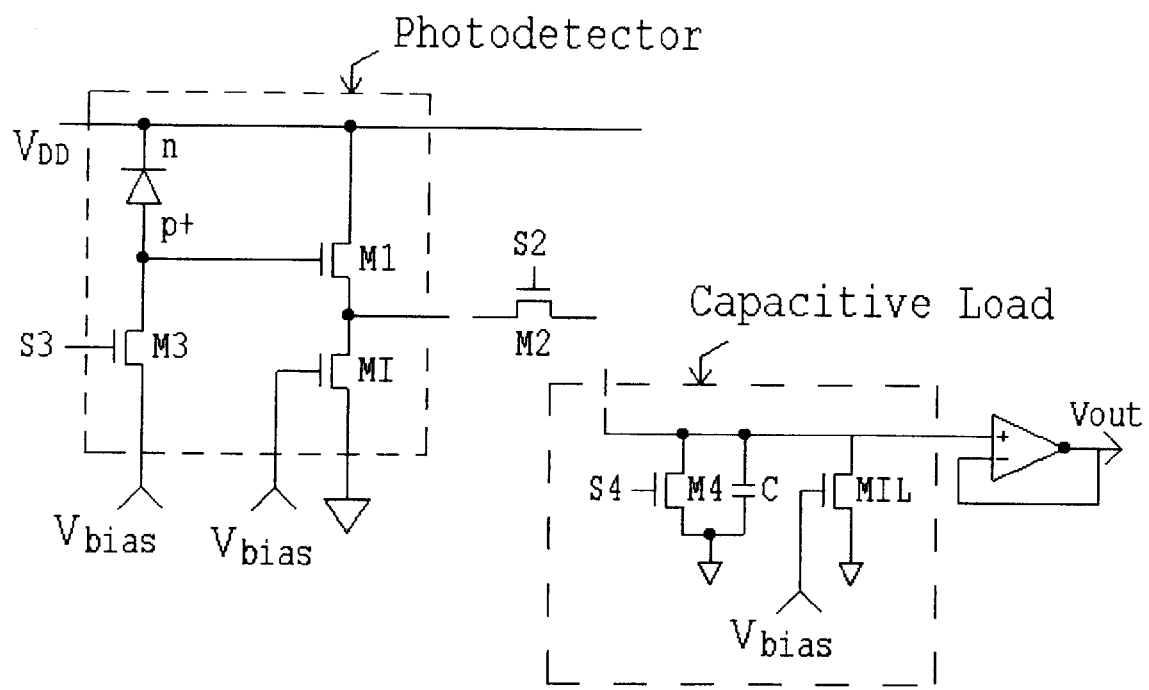
FIG. 21 illustrates another special version of the photodetector element of FIGS. 19A and 19B where VbiasI is connected to Vbias.

This photodetector employs the same CMOS process technology as the photodetector of FIG. 7A. For an n-type substrate wafer of CMOS process technology, both MI and MIL are n-typed MOS transistors. The reference voltage for the gate terminals of transistors MI and MIL can be connected to the ground if depletion-mode n-type transistors are used for transistors MI and MIL as shown in FIG. 20. Or, the reference voltage for the gate terminals of transistors MI and MIL can be connected to Vbias as shown in FIG. 21.

Figure 22A:
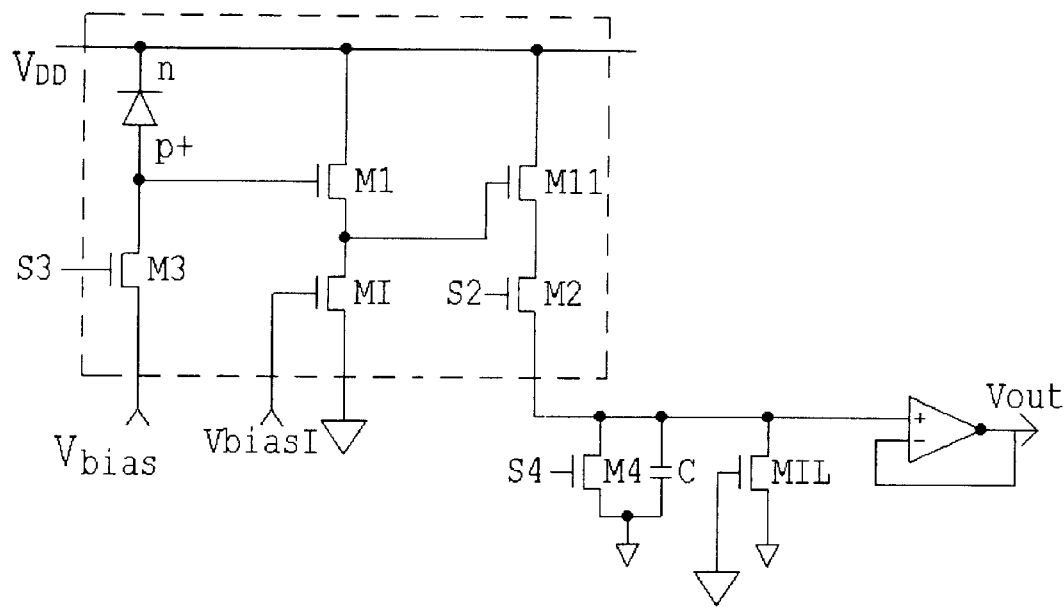
FIG. 22A illustrates a photodetector element comprised of a photodetector cell of FIG. 19A and an additional buffer amplifier readout circuit M11.

FIG. 22A shows a single element photodetecting device. The photodetector element contains a photodetector cell of FIG. 19, and a source-follower buffer amplifier transistor M11 and a readout-switch transistor M2. The readout-switch transistor M2 is incorporated with a second stage buffer amplifier transistor M11. By increasing the transconductance of the transistor M11, the readout data rate and the sensitivity of the photodetector can be improved.

Figure 22B:
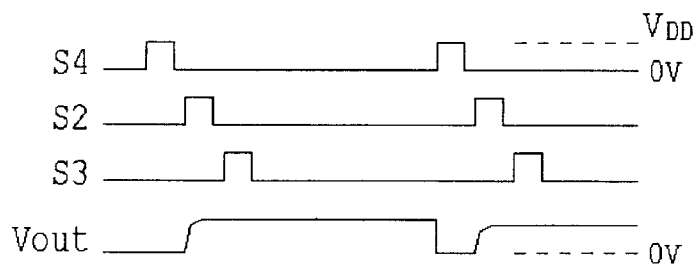
FIG. 22B illustrates the timing control signals for operating the image sensing device presented in FIG. 22A.

FIG. 22B shows the timing diagram for operating the photodetector element of FIG. 22A. The readout mechanism begins with resetting the capacitive load to the ground through the control signal S4 to the gate terminal of transistor M4, then the readout control signal S2 is turned on, the capacitive load is charged through the M1 transistor to a voltage level about one threshold voltage of M1 below the photovoltage signal at the p+ node of the photodiode. The timing for S2 and S4 have to be nonoverlapping to ensure a correct readout signal. After completing the readout process, when the control signal S2 goes low, then the precharging control signal S3 is turned on, the p+ node of the photodiode and the gate terminal of transistor M1 are charged to the voltage of Vbias to initialize the photodetector for the next charge integration cycle.

Figure 23A:
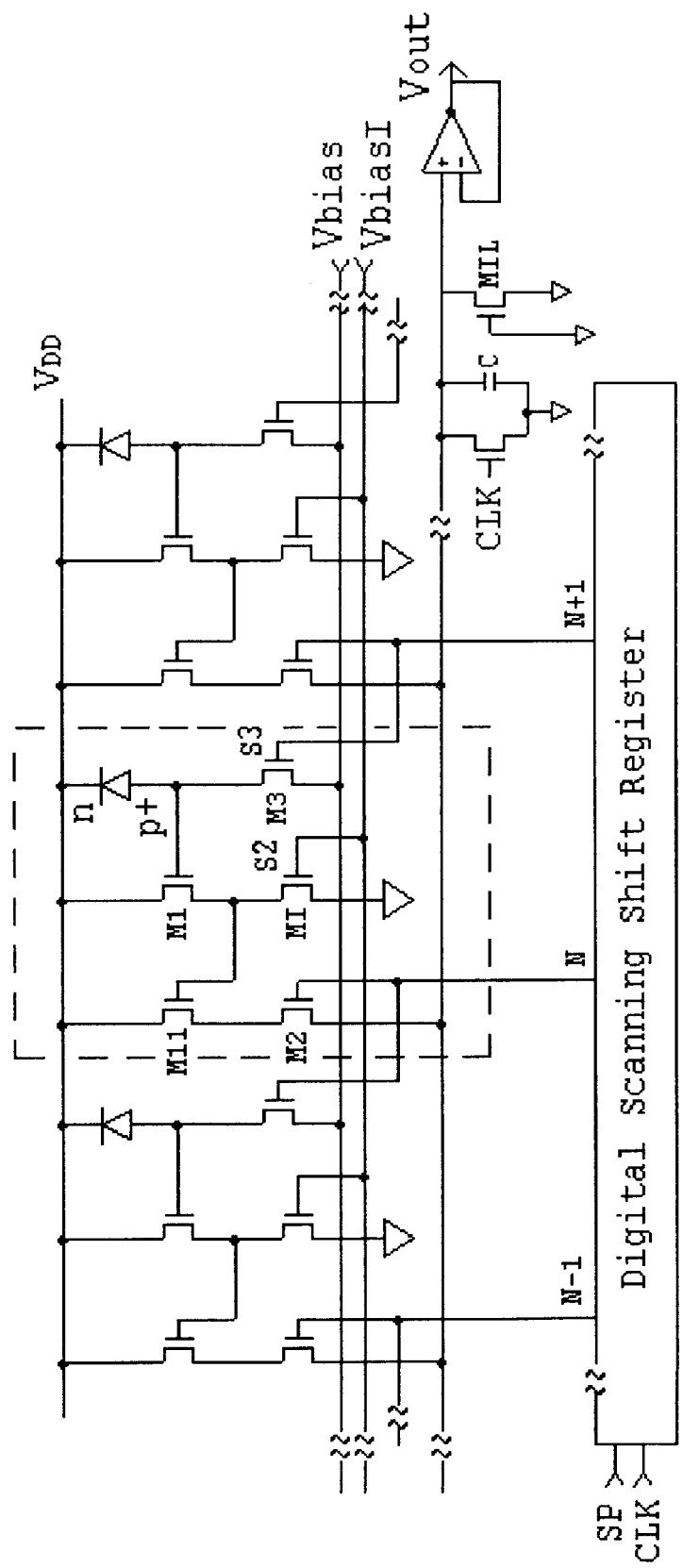
FIG. 23A illustrates a circuit diagram of a linear-array image-sensing device that contains a plurality of photodetecting elements of FIG. 22 configured in a one dimensional structure and the readout circuitry.

FIG. 23A illustrates a linear-array image sensing device that contains a plurality of photodetecting elements of FIG. 22A. In the drawings, only three photodetecting elements are shown to illustrate the control timing relationships between adjacent photodetecting elements. The circuit also includes the capacitive-load readout circuitry and a unity gain operational amplifier as a buffer amplifier for output video signal. The circuit further includes a digital scanning shift register which sequentially activates the readout switches of each of the photodetecting elements. This linear array is similar in application to the linear array presented in FIG. 10A.

Figure 23B:
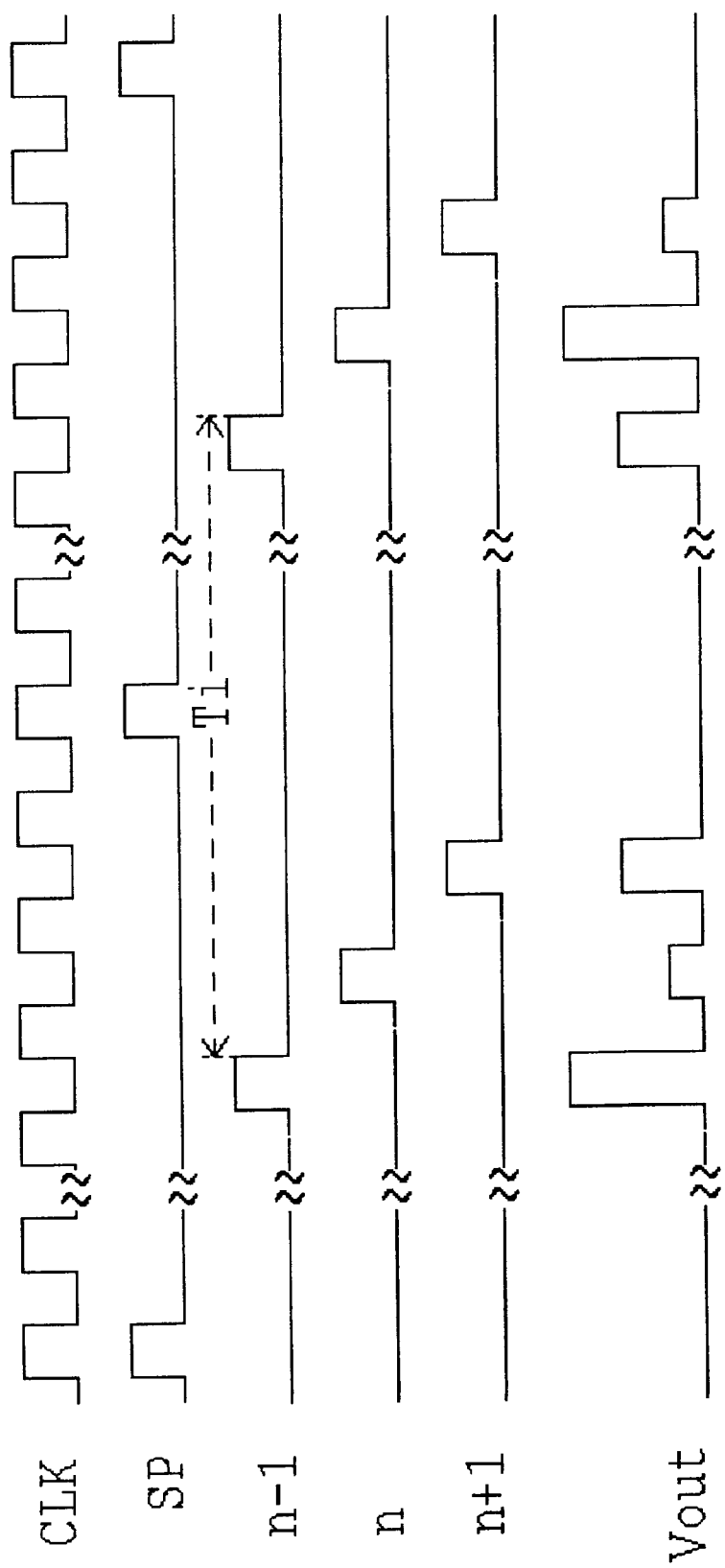
FIG. 23B illustrates the timing control signals for operating the image sensing device presented in FIG. 23A.

FIG. 23B shows the timing diagram for operating the photodetector presented in FIG. 23A. The clock control signal CLK continuously clocks the shift register and resets the capacitive load forcing the output signal to stay at ground level. When the start pulse control signal is applied to the shift register it sequentially activates the readout switch of each photodetecting element to output the photosignal to the capacitor load by employing capacitive-load source follower readout operation. While the digital shift register activates the readout switch of a photodetecting element, the adjacent photodetecting element activated one clock cycle earlier is engaging in the precharging process with the same control signal from the shift register. This precharging operation sets up the photodetecting elements for the next line to be scanned. The integration time for one line is approximately the time between two consecutive readouts for a given photodetecting element.

Figure 24:
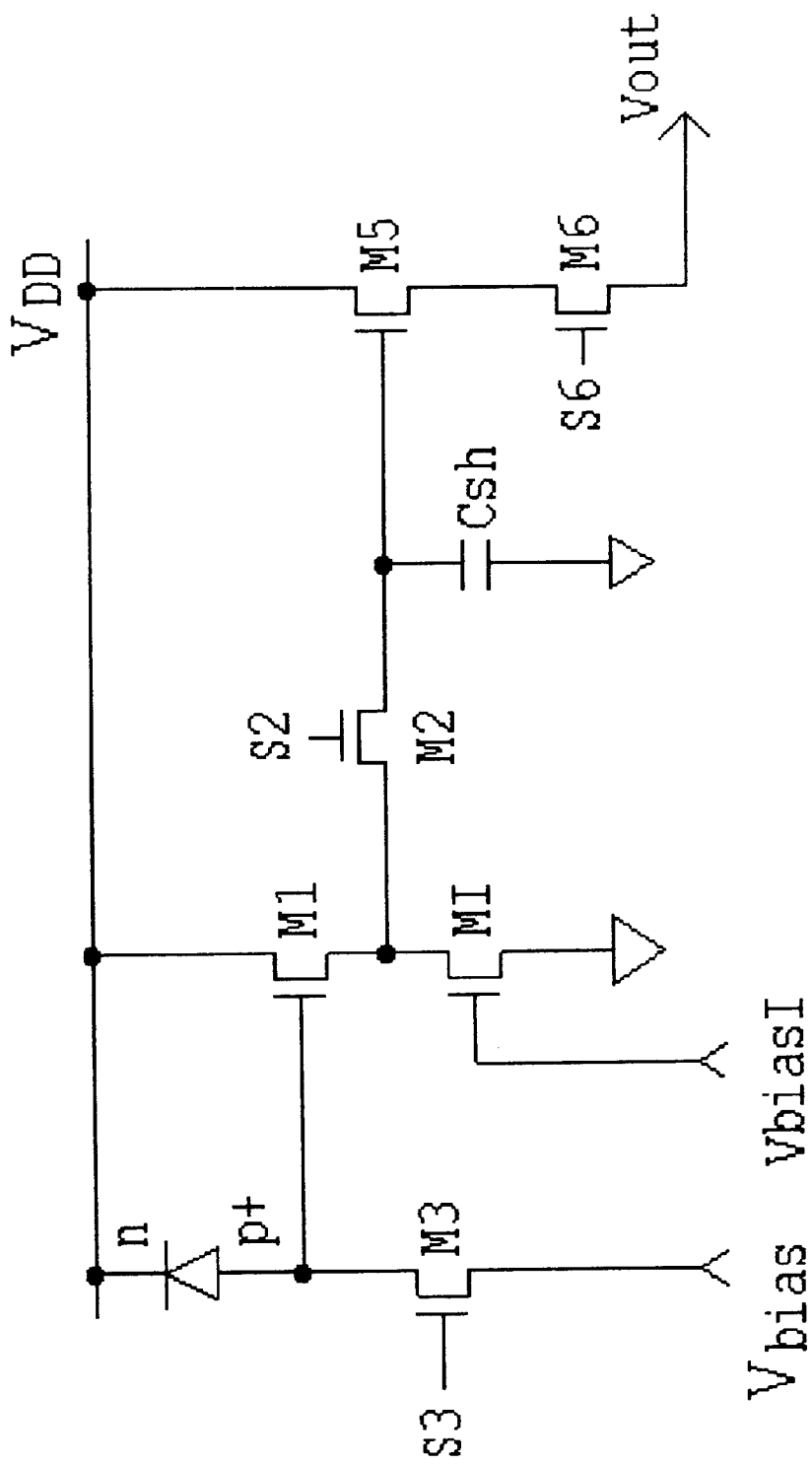
FIG. 24 illustrates the circuit diagram of a photodetector element which comprises the photodetector cell of FIG. 19 and a capacitive sample-and-hold circuit for the photodiode signal.

FIG. 24 illustrates the circuit diagram of a photodetector element constructed with the photodetector cell of FIG. 19A and a capacitive sample-and-hold amplifier.

Figure 25A:
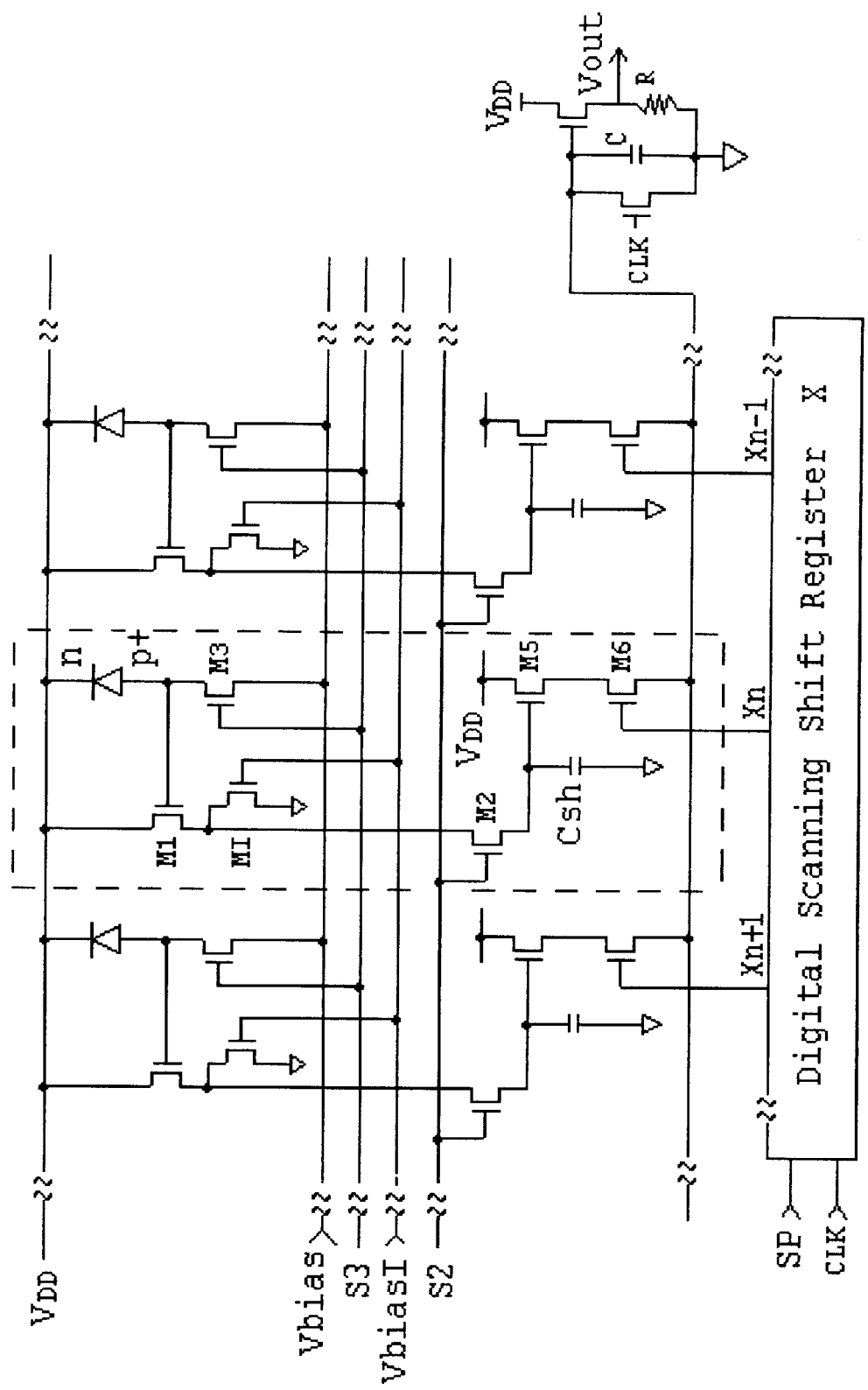
FIG. 25A illustrates a circuit diagram of a linear-array image-sensing device that contains a plurality of photodetector elements of FIG. 24 configured in a one-dimensional structure and the readout circuitry.

FIG. 25A illustrates the circuit diagram of a linear array constructed with a plurality of photodetecting elements of FIG. 24. In the drawings, only three photodetecting elements are shown for the description of the control timing signals required to operate the device. The circuit also includes the capacitor-load readout circuit with a buffer amplifier to output the video signal. The circuit further includes a digital scanning shift register which sequentially activates the readout switches of each of the photodetecting elements.

Figure 25B:
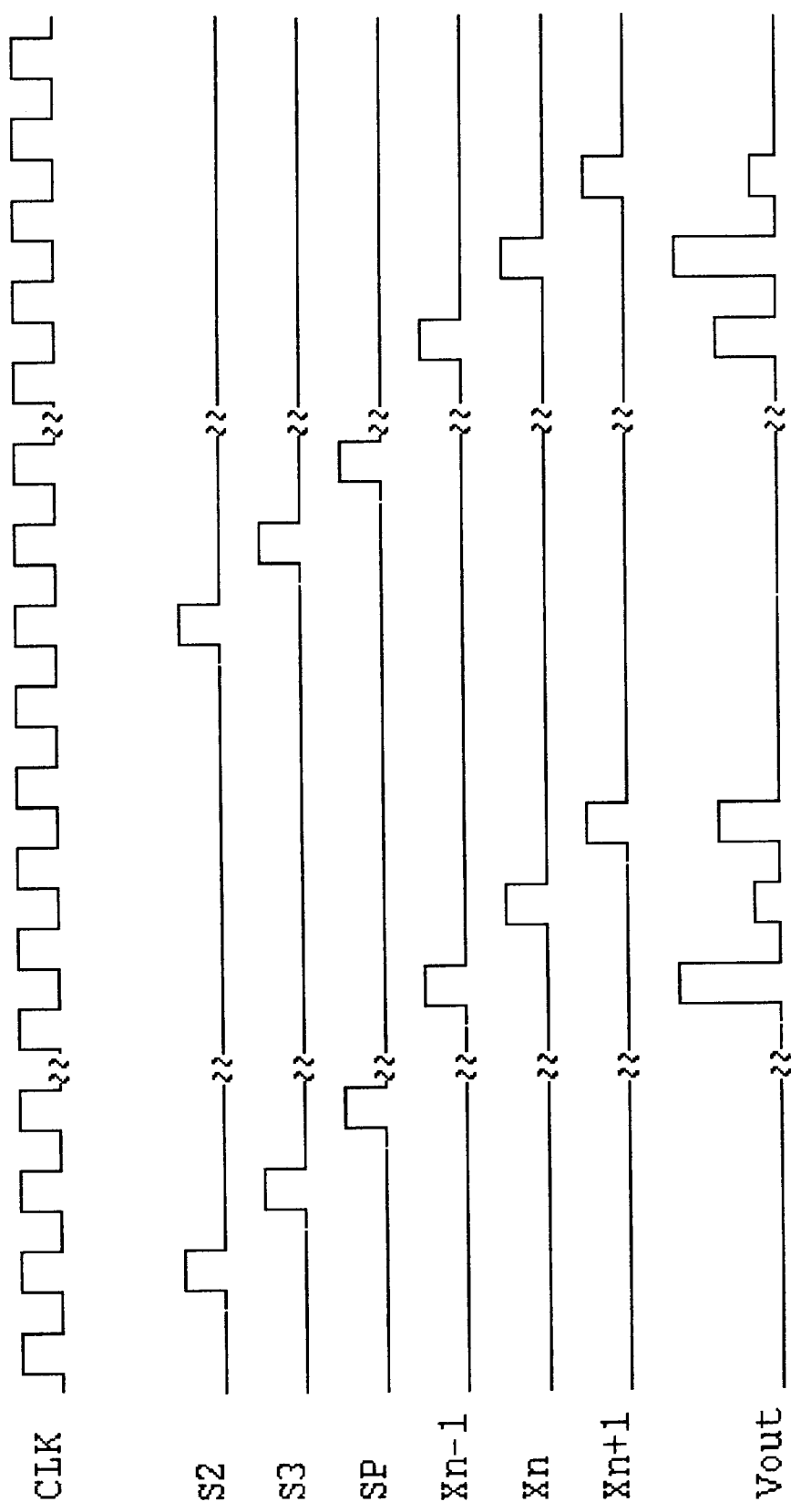
FIG. 25B illustrates the timing control signals for operating the image sensing device presented in FIG. 25A.

The timing control signals to operate this linear array are depicted in FIG. 25B. The readout process begins with turning the readout switch M2 on by applying the control signal S2 to each photodetecting element, the photosignals present in the photodiodes charge the respective capacitors by each corresponding buffer transistor M1 and then hold on the capacitors as soon as the S2 signal turns off. Afterward, the precharging control signal S3 turns on to precharge the photodiode and the transistor M1 for each photodetecting element. The photodetecting elements then begin the integration for the next line to be scanned. The integration time for one line is approximately the time between two consecutive precharging processes. During the integration time, the digital shift register is sequentially activating each of the readout switches of the sample-and-hold circuit to output the video signals of the previous scan. This linear array is similar in application to the linear array of FIG. 13A.

Figure 26:
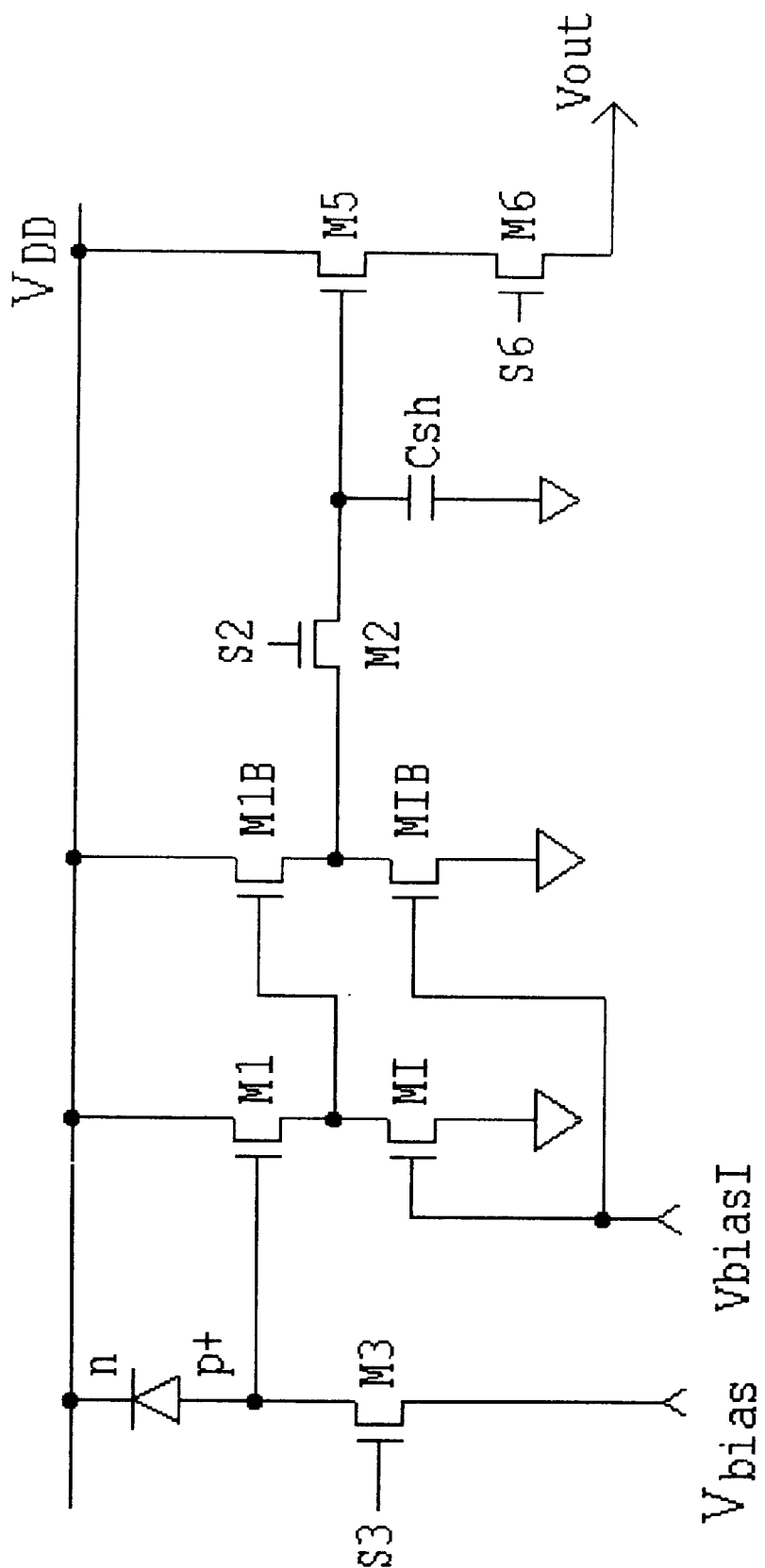
FIG. 26 illustrates a circuit diagram of a photodetector element which comprises the photodetector element of FIG. 24 and an additional source-follower amplifier circuit (M1B and M1B).

FIG. 26 illustrates a modified circuit diagram for the photodetector element of FIG. 24. An additional source-follower amplifier constructed with M1B and M1B MOS transistors is connected between the buffer amplifier M1 and the sample-and-hold switch transistor M2 to further reduce the crosstalk effect between the photodiode and the capacitive sample-and-hold amplifier, and to level shift the video signal to the readout amplifier.

Figure 27A:
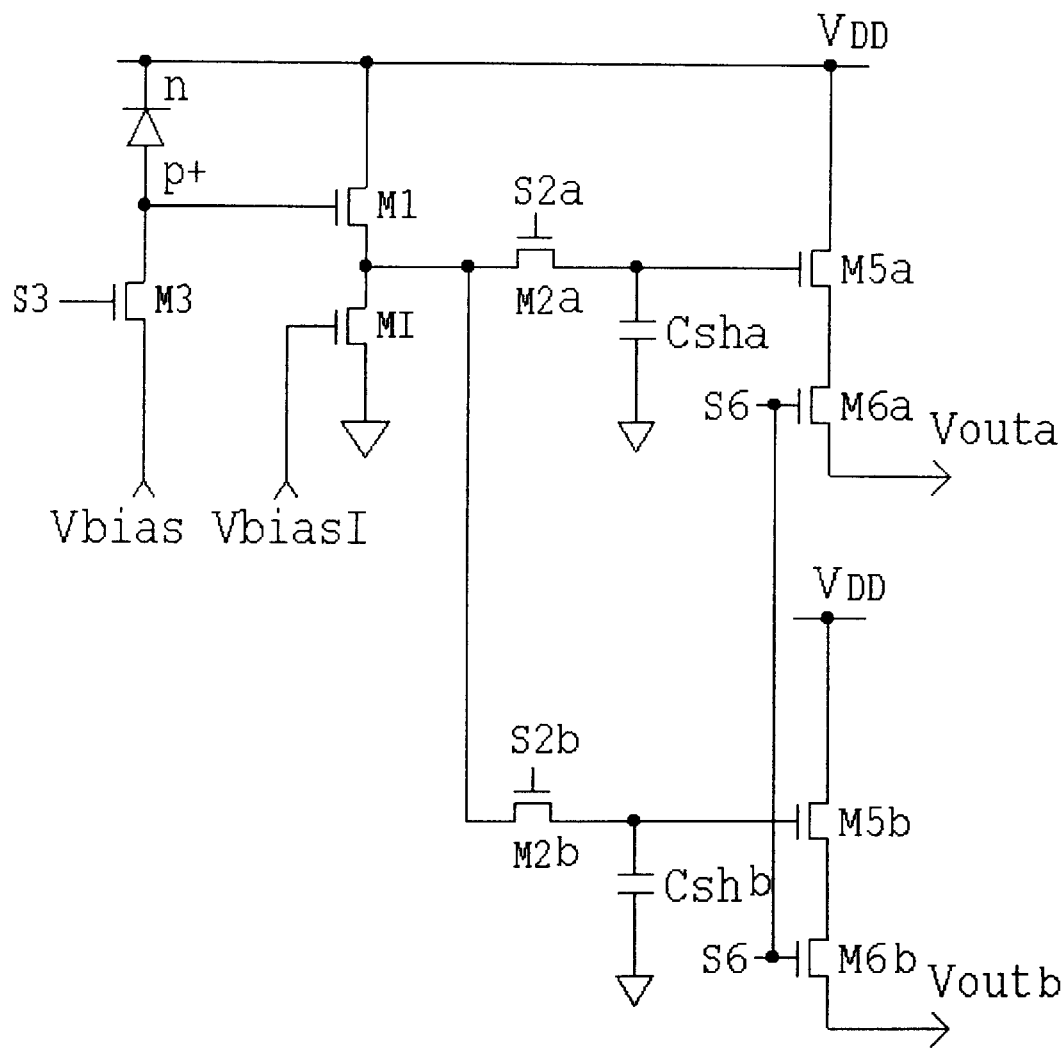
FIG. 27A illustrates the circuit diagram of a photodetector element with offset-cancellation capability, which comprises the photodetector element of FIG. 24, and an additional capacitive sample-and-hold circuit.
Figure 27B:
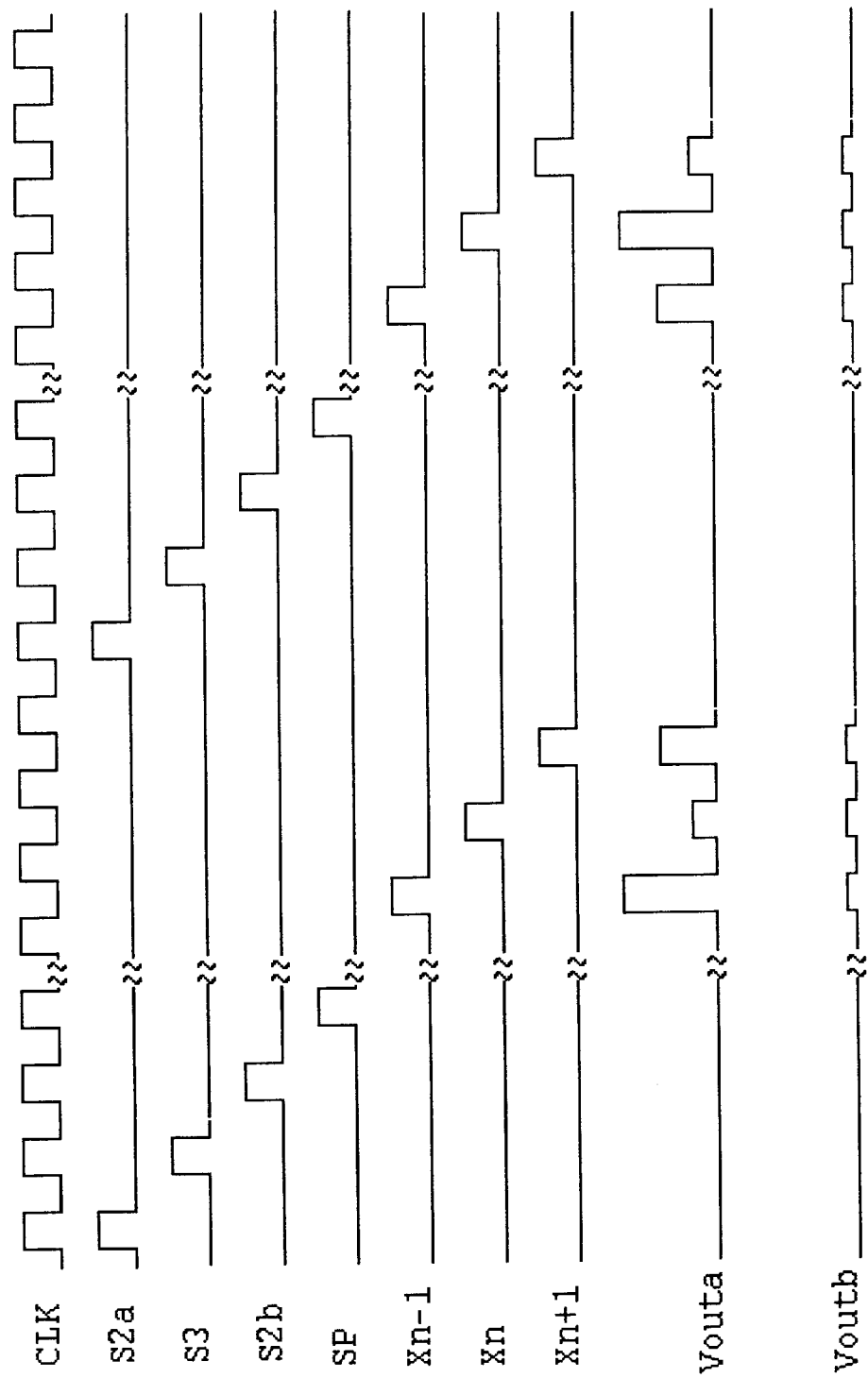
FIG. 27B illustrates the timing control signals for operating the linear-array image-sensing device which comprises a plurality of photodetecting elements of FIG. 27A.

FIG. 27A illustrates another modified circuit diagram for the photodetector element of FIG. 24. This photodetecting element employs offset-cancellation technique to reduce the fixed pattern noise of the photodetector. The photodetector is operated with the following timing control sequence: The photosignal present in the photodiode is sampled and held to the capacitor Csha by pulsing the control signal S2a, then the precharging control signal S3 turns on to precharge the photodiode and the transistor M1. In the beginning of photocharge-integration cycle, the voltage of the photodetector is sampled and held to the capacitor Cshb by pulsing the control signal S2b. The video signals held at the capacitors Csha and Cshb will then be output to the output amplifiers by the control signal S6. The voltage difference between Vouta and Voutb closely represents the photosite signal. Substantial reduction of the fixed pattern noise can be observed in a linear array constructed with a plurality of photodetecting elements of FIG. 27A. The timing control signals for operating such a linear array are depicted in FIG. 27B.

Figure 28:
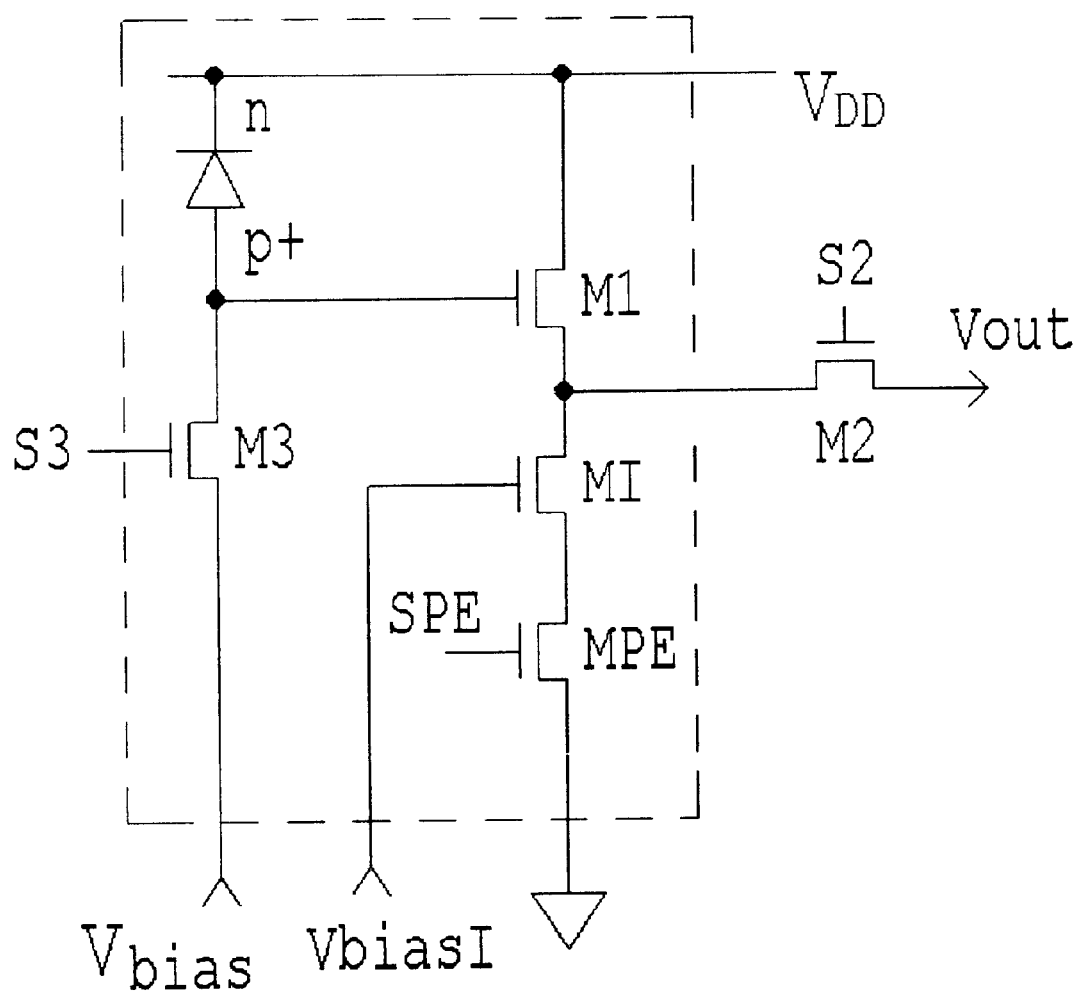
FIG. 28 illustrates the circuit diagram of a photodetector element, which comprises the photodetector cell of FIG. 19, and a current source on-off control transistor MPE.

FIG. 28 illustrates the circuit diagram of a photodetector cell of FIG. 19A with power down capability. An enhanced-mode MOS switch transistor MPE is connected between the current-source load transistor MI and the ground bus. A control signal SPE can be applied to the gate terminal of the transistor MPE to enable or disable the current of the transistor MI. The current consumption of an array constructed with this photodetector element can be minimized.

Figure 14:
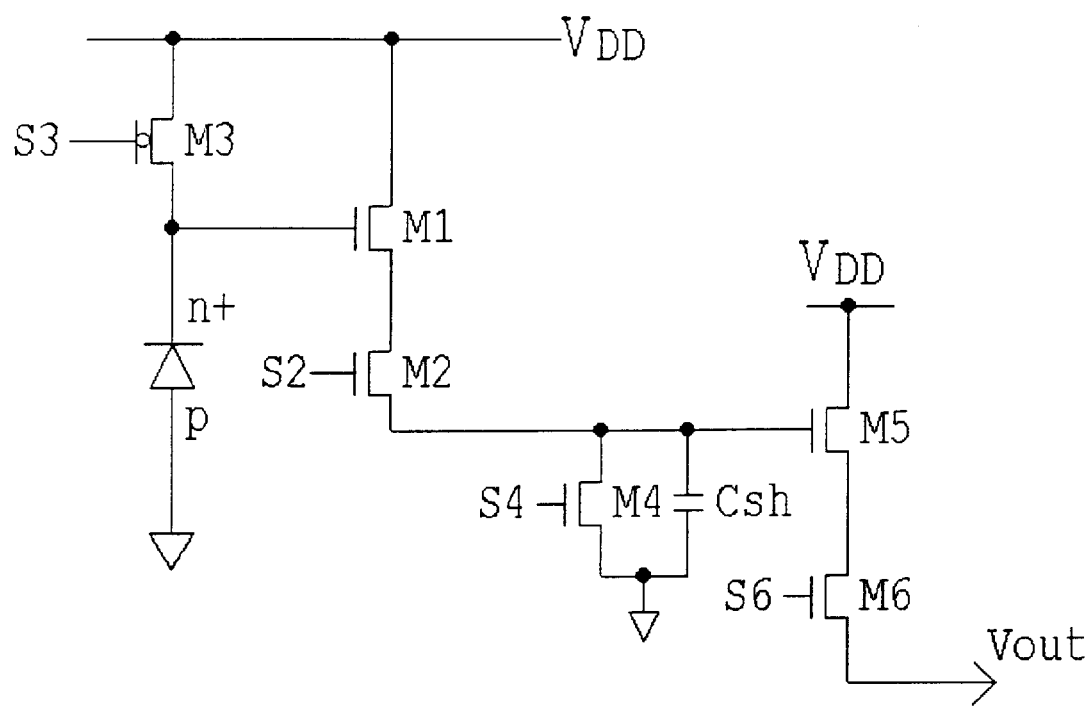
FIG. 14 illustrates the circuit diagram which comprises the photodetector element of a voltage-pickoff charge-integration photodiode integrated on the p-type substrate CMOS process and a switch resettable capacitor load with a buffer amplifier as the sample-and-hold circuit for the photodiode signal.
Figure 29:
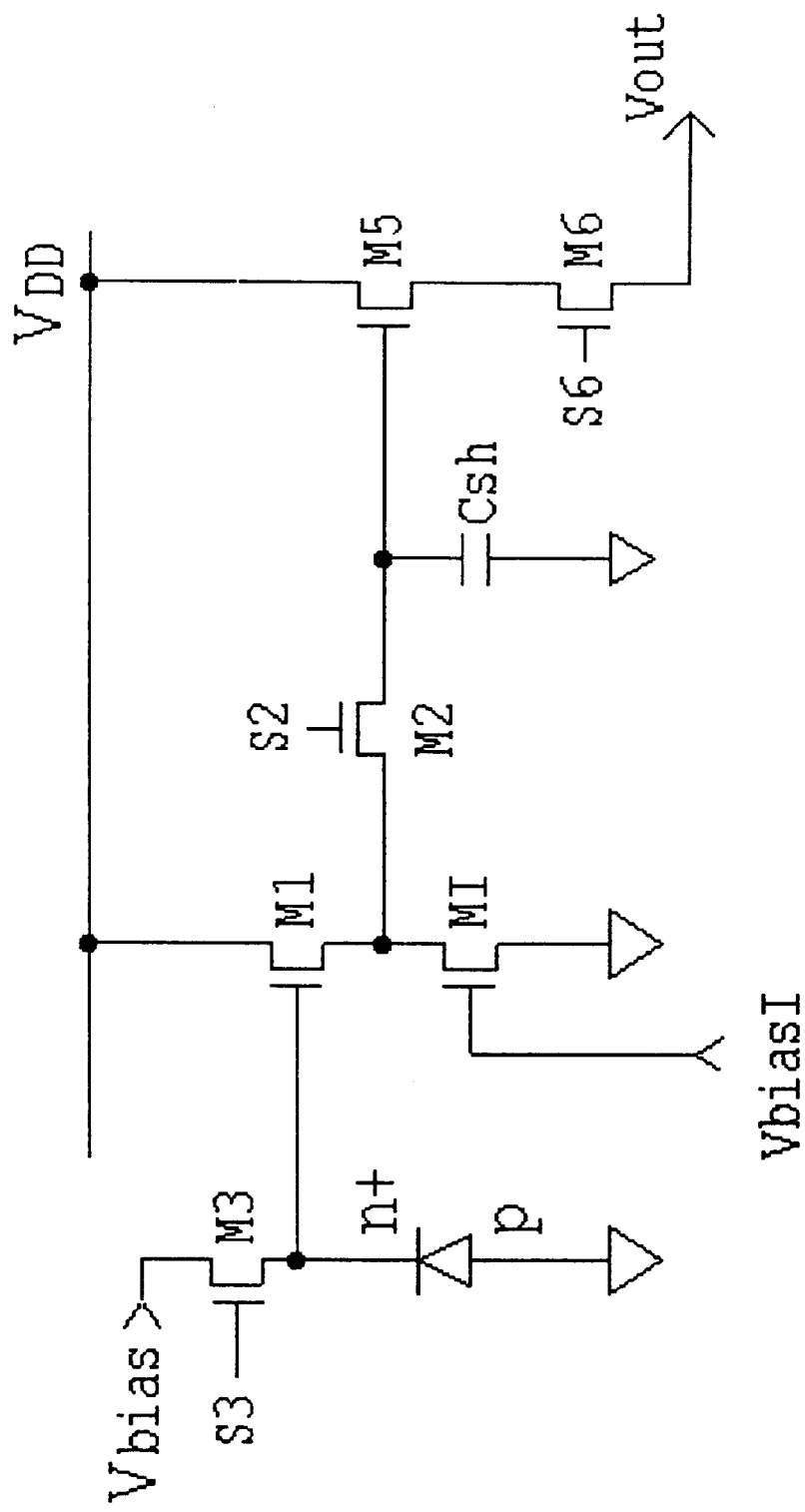
FIG. 29 illustrates the circuit diagram of a photodetector element, which comprises the modified photodetector cell of FIG. 14 with a current source load MOS transistor MI and a capacitive sample-and-hole circuit for the photodiode signal.

FIG. 29 illustrates the circuit diagram of a photodetector element, which comprises the modified photodetector cell of FIG. 14 with a current source load MOS transistor MI and a capacitive sample-and-hole circuit for the photodiode signal. Linear array image sensing devices constructed with a plurality of photodetecting elements of this circuit are similar in application as the linear array presented in FIG. 25A and FIG. 25B.

Figure 30:
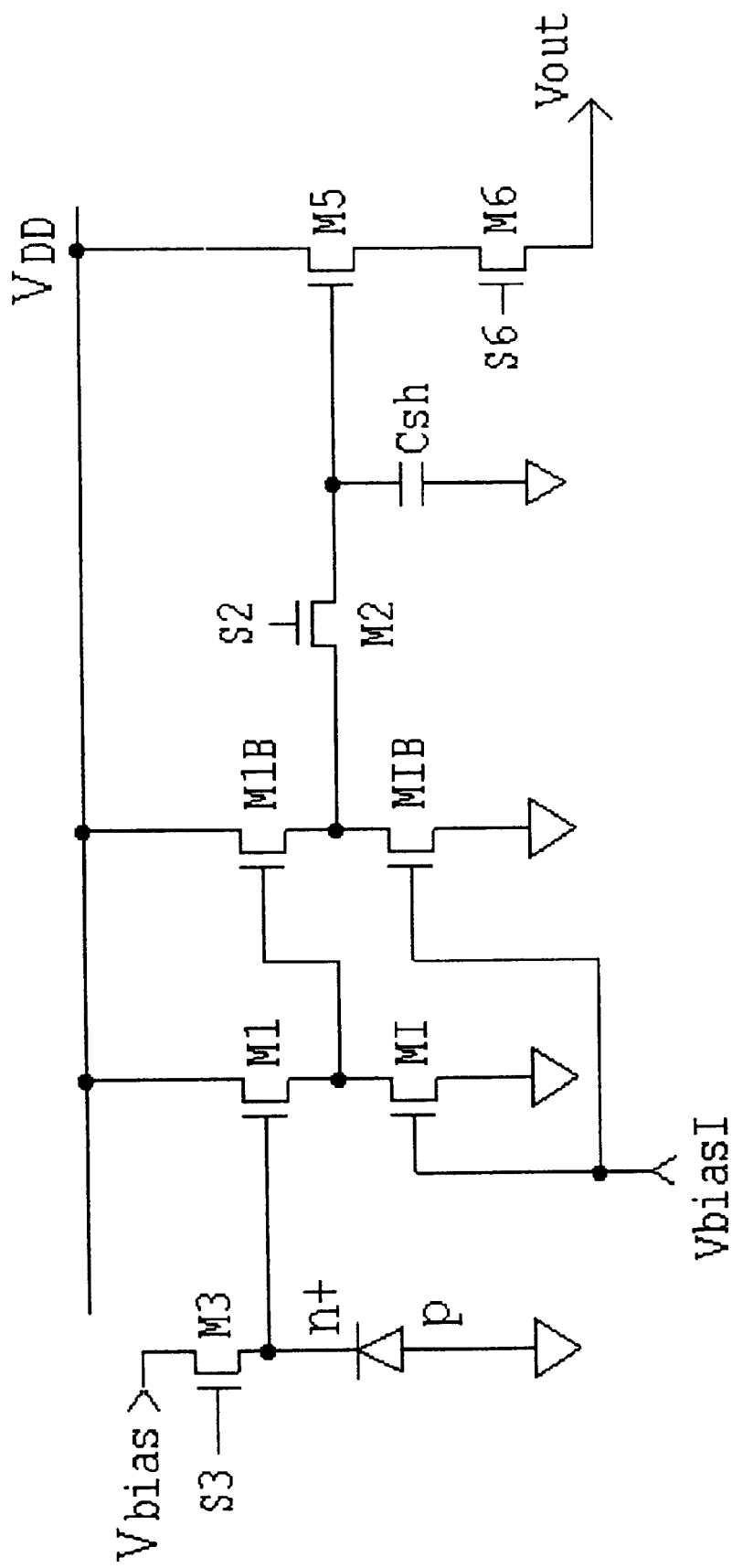
FIG. 30 illustrates the circuit diagram of a photodetector element, which comprises the photodetector element of FIG. 29 and an additional source-follower amplifier circuit (M1B and M1B).

FIG. 30 illustrates the circuit diagram of a photodetector element, which comprises the photodetector element of FIG. 29 and an additional source-follower amplifier circuit (M1B and M1B).

Figure 31:
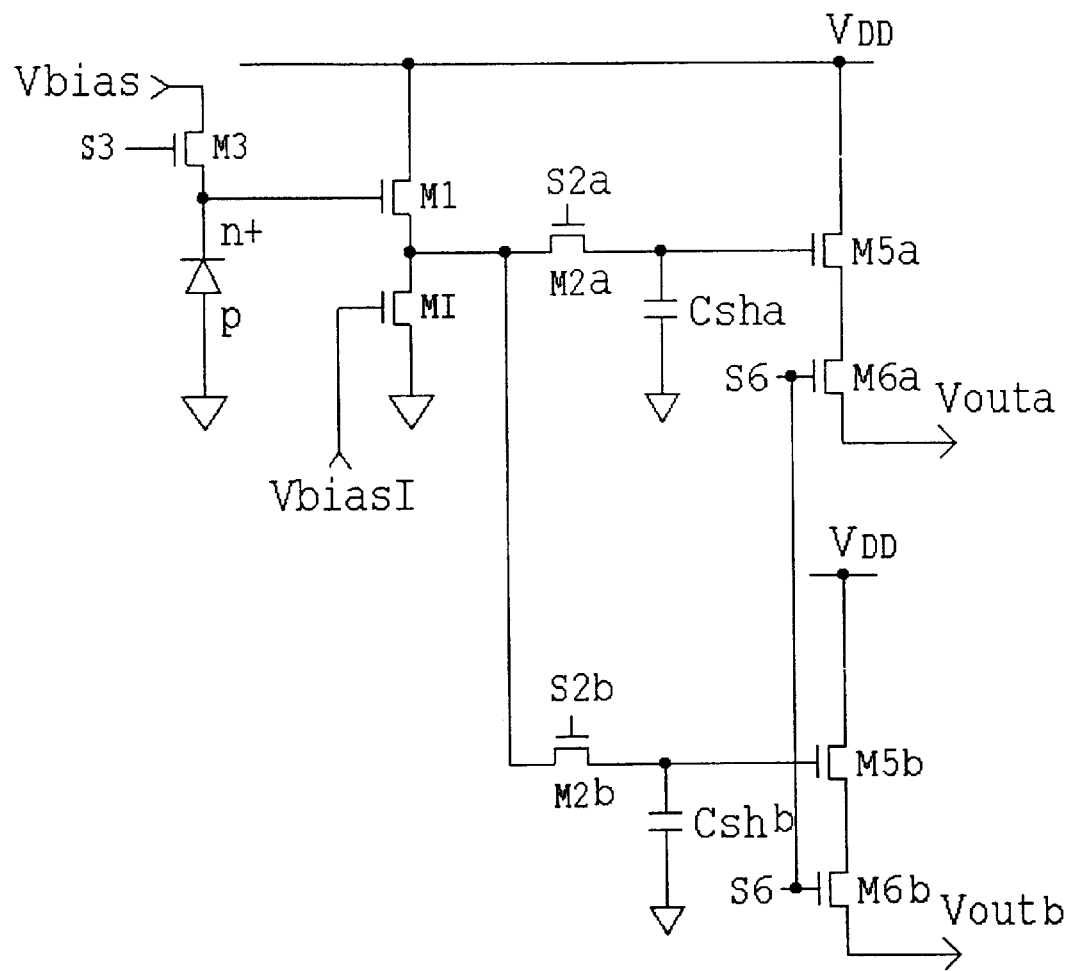
FIG. 31 illustrates the circuit diagram of a photodetector element with offset-cancellation capability, which comprises the photodetector element of FIG. 29, and an additional capacitive sample-and-hold circuit.

FIG. 31 illustrates the circuit diagram of a photodetector element with offset-cancellation capability, which comprises the photodetector element of FIG. 29, and an additional capacitive sample-and-hold circuit.

Figure 32:
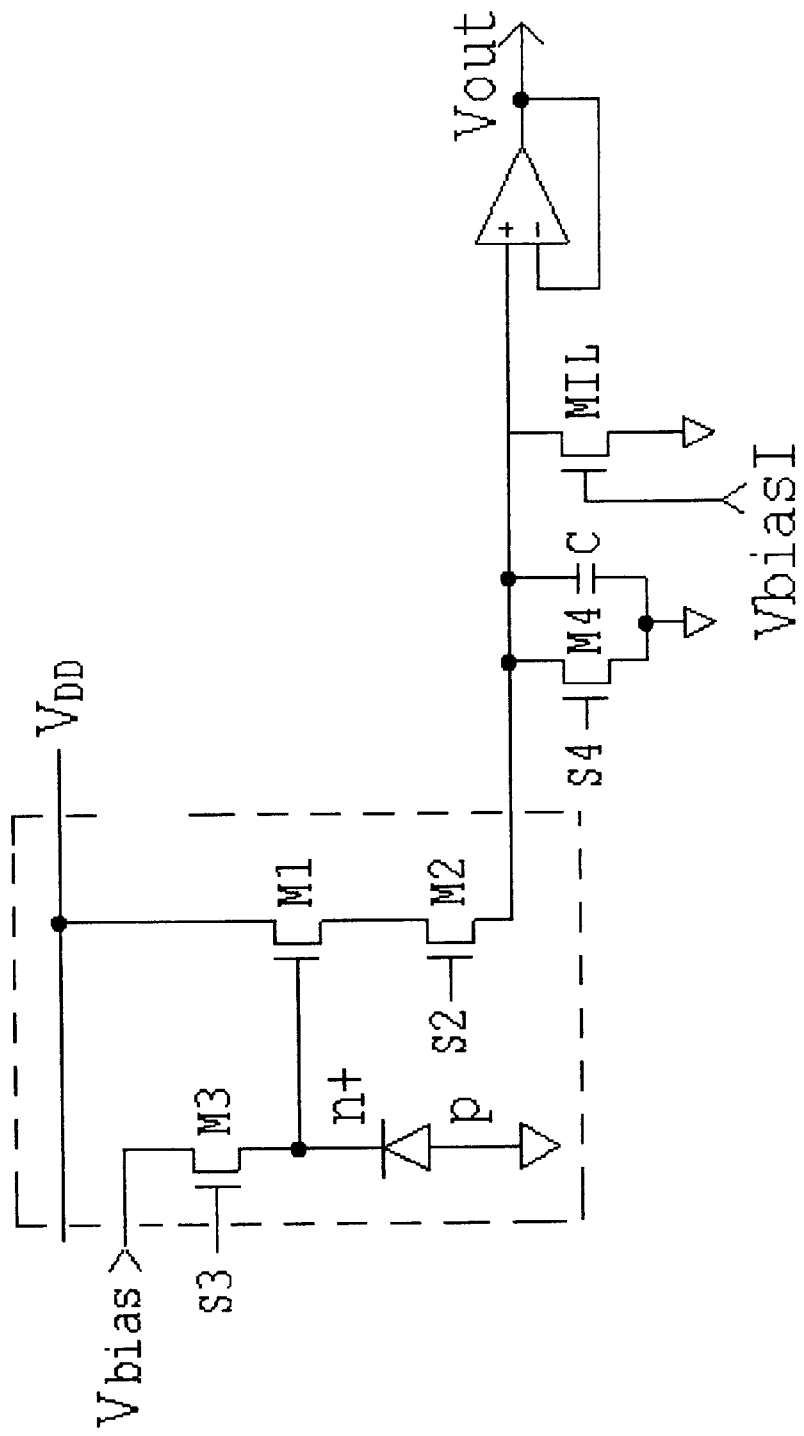
FIG. 32 illustrates the circuit diagram of a gate-biased charge-integration photodiode with a capacitor-loaded source-follower readout circuit built on p-type substrate.

A gate-biased charge integration photodetectors constructed on p-type substrate is illustrated in FIG. 32. The photodiode is a n+p junction diode, and the gate-biased charge storable MOS transistor is an n-type transistor. This photodetector can be implemented with a very simple CMOS process technology.

Figure 33A:
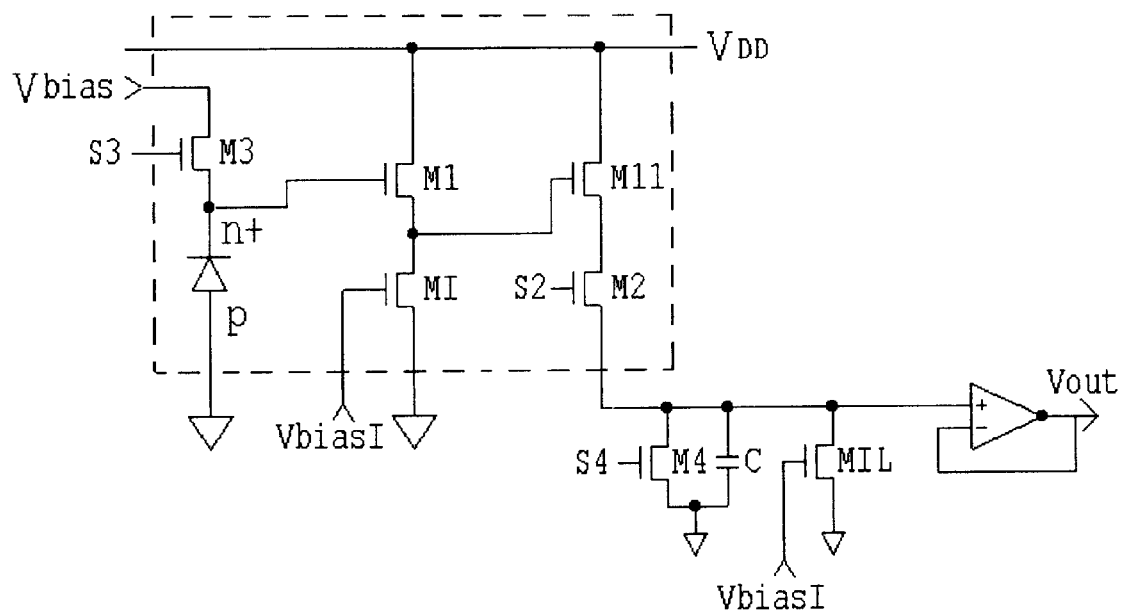
FIG. 33A illustrates a photodetector element comprised of a photodetector cell of FIG. 32A, a current-source load MI, and an additional buffer amplifier readout circuit M11.
Figure 33B:
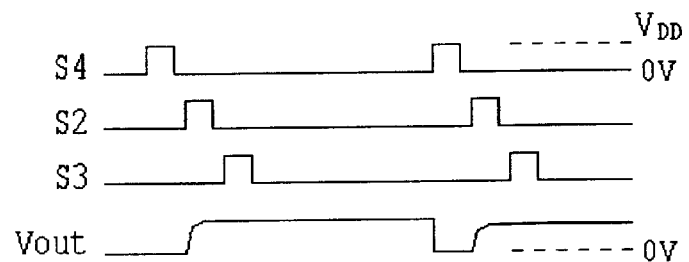
FIG. 33B illustrates the timing control signals for operating the image sensing device presented in FIG. 33A.

A modified photodetector of FIG. 32 with a current-source load is illustrated in FIG. 33A, and the timing control signals to operate the photodetector are illustrated in FIG. 33B.

Figure 34:
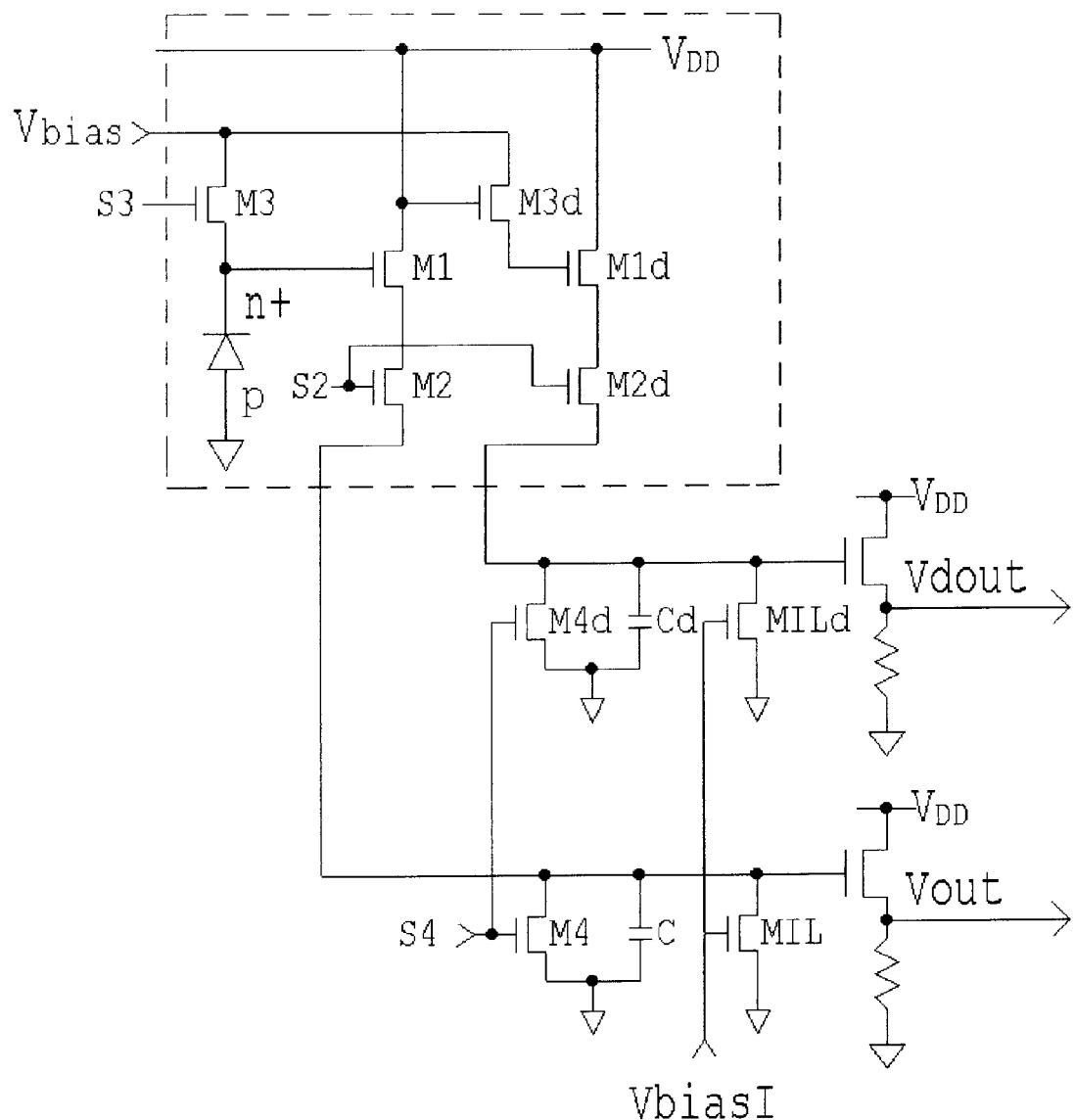
FIG. 34 illustrates the circuit diagram of a gate-biased charge-integration photodiode with dark fixed pattern noise cancellation method.

According to FIGS. 34A to 40B this invention also discloses a CMOS photodetector and a CMOS capacitive sensor supported on a p-type substrate. FIG. 34 illustrates the circuit diagram of a gate-biased charge-integration photodiode of FIG. 32 incorporated with dark fixed pattern noise cancellation circuitry constructed of transistors M1d, M2d and M3d, which are the replica transistors of M1, M2 and M3 respectively.

The CMOS photodetector includes a n+p junction diode having a charge-integration node at the n+ diffusion node. The CMOS detector further includes a gate-biased charge storable MOS transistor M1 that has a gate terminal connected to the charge-integration node of the n+p junction diode. The CMOS detector further includes a readout switch MOS transistor M2 connected to a source terminal of the charge storable MOS transistor M1. The CMOS detector further includes a bias charge pre-charge switch MOS transistor M3 connected to the charge-integration node responsive to a control signal S3 for providing a source of voltage reference as a pre-charge bias voltage to the gate terminal of the gate-biased charge storable MOS transistor M3. The CMOS detector further includes a second gate-biased charge storable MOS transistor M1d having the gate terminal connected to a potential of voltage reference Vbias. The CMOS detector further includes a second readout switch MOS transistor M2d having a drain terminal connected to a source terminal of the second charge storable MOS transistor M1d and a gate terminal connected to a gate terminal of the readout switch MOS transistor M2, and a second bias charge pre-charge switch MOS transistor M3d having a gate terminal connected to a power supply bus Vdd, a drain terminal connected to the voltage reference and a source terminal connected to a gate terminal of the second gate-biased charge storable MOS transistor M1d.

Figure 35A:
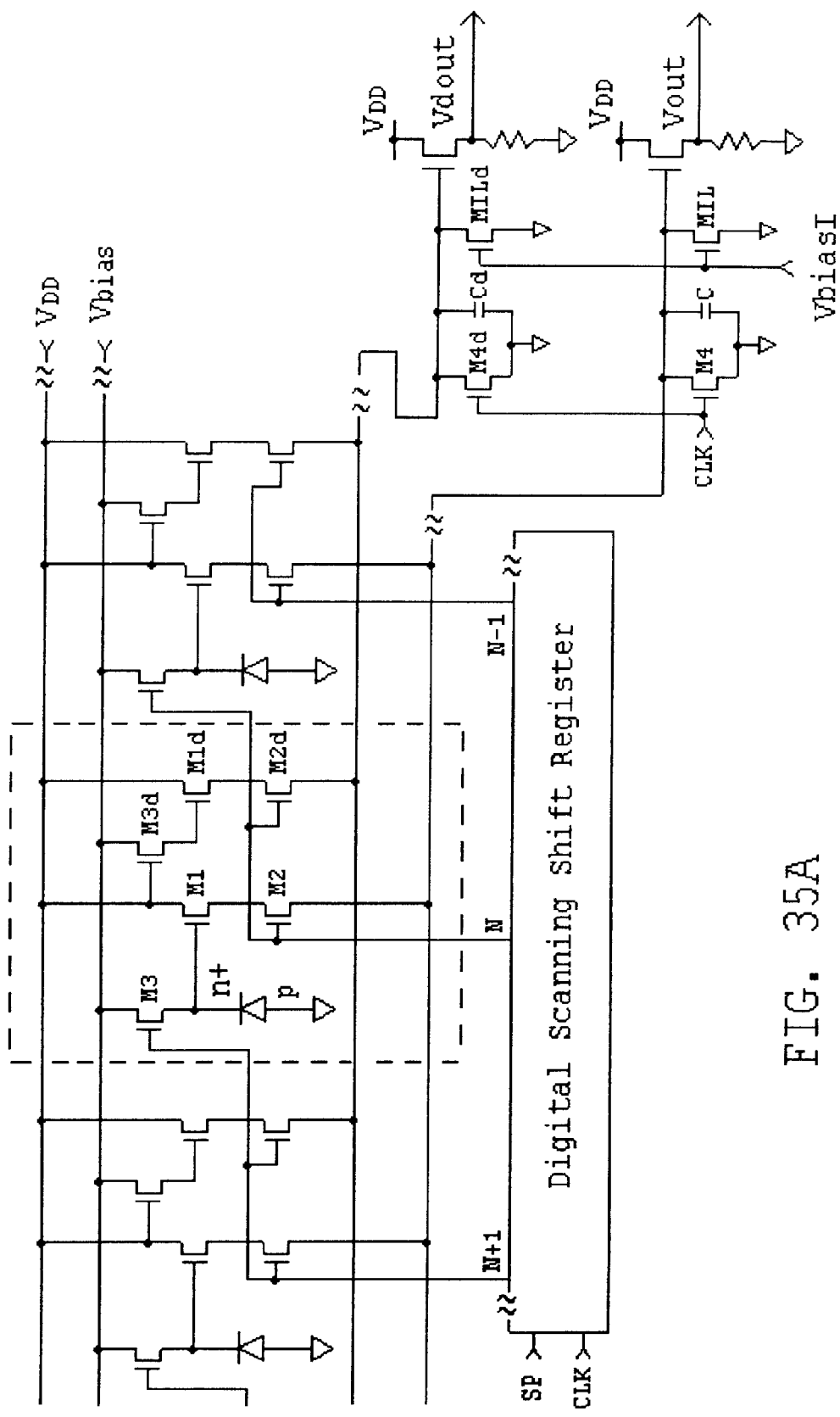
FIG. 35A illustrates a circuit diagram of a linear-array imaging-sensing device that contains a plurality of photodetector elements of FIG. 34 configured in a one-dimensional structure and the readout circuitry.

FIG. 35A illustrates a circuit diagram of a linear-array imaging-sensing device that contains a plurality of photodetector elements of FIG. 34 configured in a one-dimensional structure and the readout circuitry, only three photodetecting elements are shown for the description of the control timing signals required to operate the device. The readout circuitry of the array includes a digital scanning shift register having a plurality of bits each being connected to a gate terminal of each of the readout switch transistor for sequentially reading out a video signal detected by each of the photodetectors, and connected to each of the bias charge pre-charge switch transistor for resetting to the voltage reference, a resettable capacitor and current-source load source follower readout circuit including a buffer amplifier connected to a common source terminal of each readout switch transistor for receiving an output signal sequentially from each of the photodetectors, and a second resettable capacitor and current-source load source follower readout circuit including a buffer amplifier connected to a common source terminal of each second readout switch transistor for receiving an output signal sequentially from each of the photodetectors. In the dark scanning operation, the dark fixed pattern noise of the photodetector array is presented to the video output Vout, and is comprised of the mismatches among the photodetectors mainly from the following three factors: (1) the dark leakage current variations from each photodiode, (2) the process parameter variations from the transistors M1, M2, and M3 of each photodetector, and (3) the clock feedthrough voltage variations from clocking the transistors M2 and M3 of each photodetector during the read and reset periods. When the dark fixed pattern noise cancellation circuitry and the differential readout method are activated, the dark fixed pattern noise of the array is the variations among the signal difference between Video output Vout and the dark reset output Vdout, where Vdout is the DC reset signal from the replica circuit of each photodetector. The fixed pattern noises from the process parameter variations and the clock feedthrough voltage variations are drastically reduced to the mismatches between the Vout and the Vdout within each photodetector of the array.

Figure 35B:
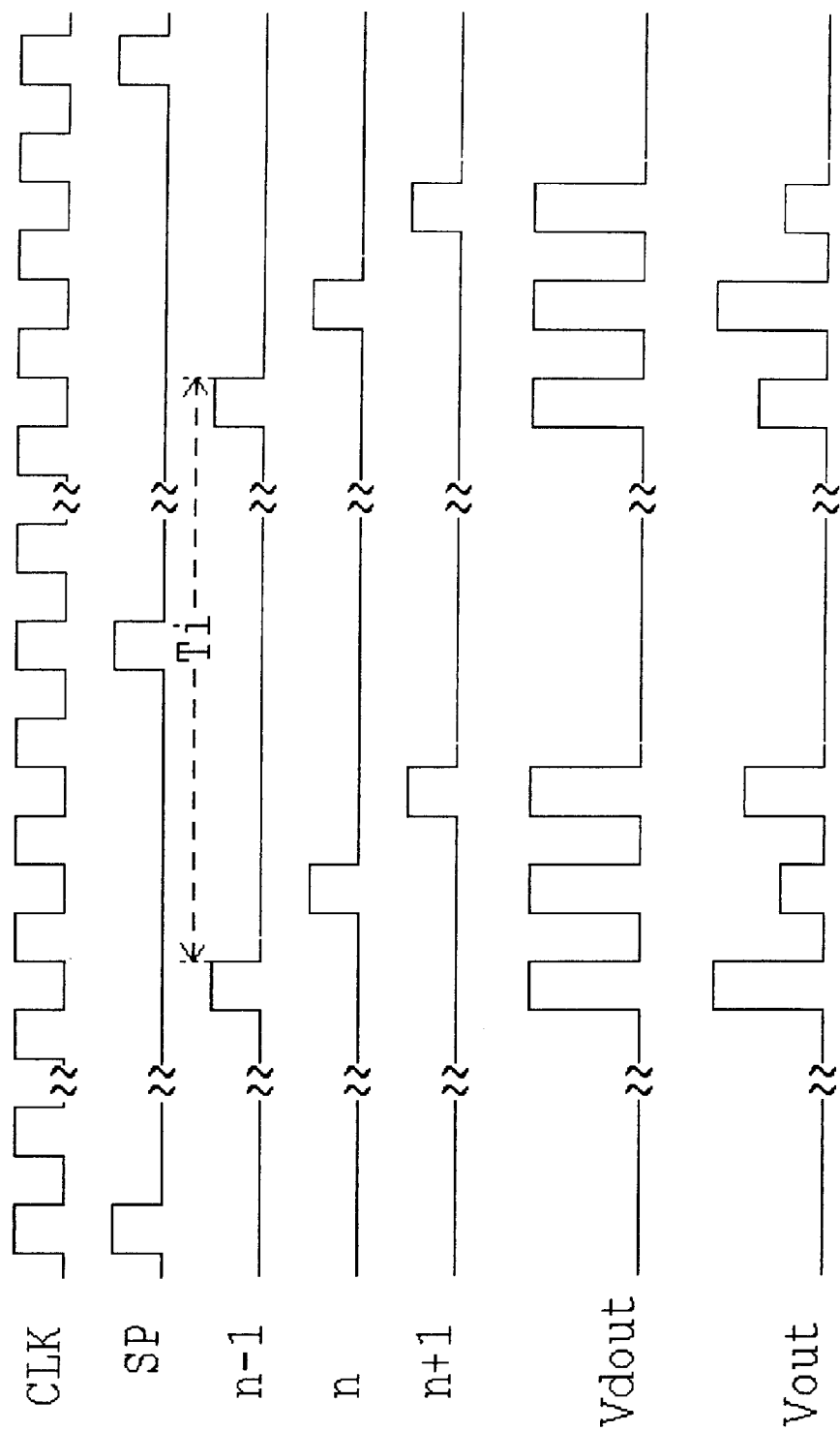
FIG. 35B illustrates the timing control signals for operating the image-sensing device presented in FIG. 35A.

FIG. 35B illustrates the timing control signals for operating the image sensing device presented in FIG. 35A.

Figure 36:
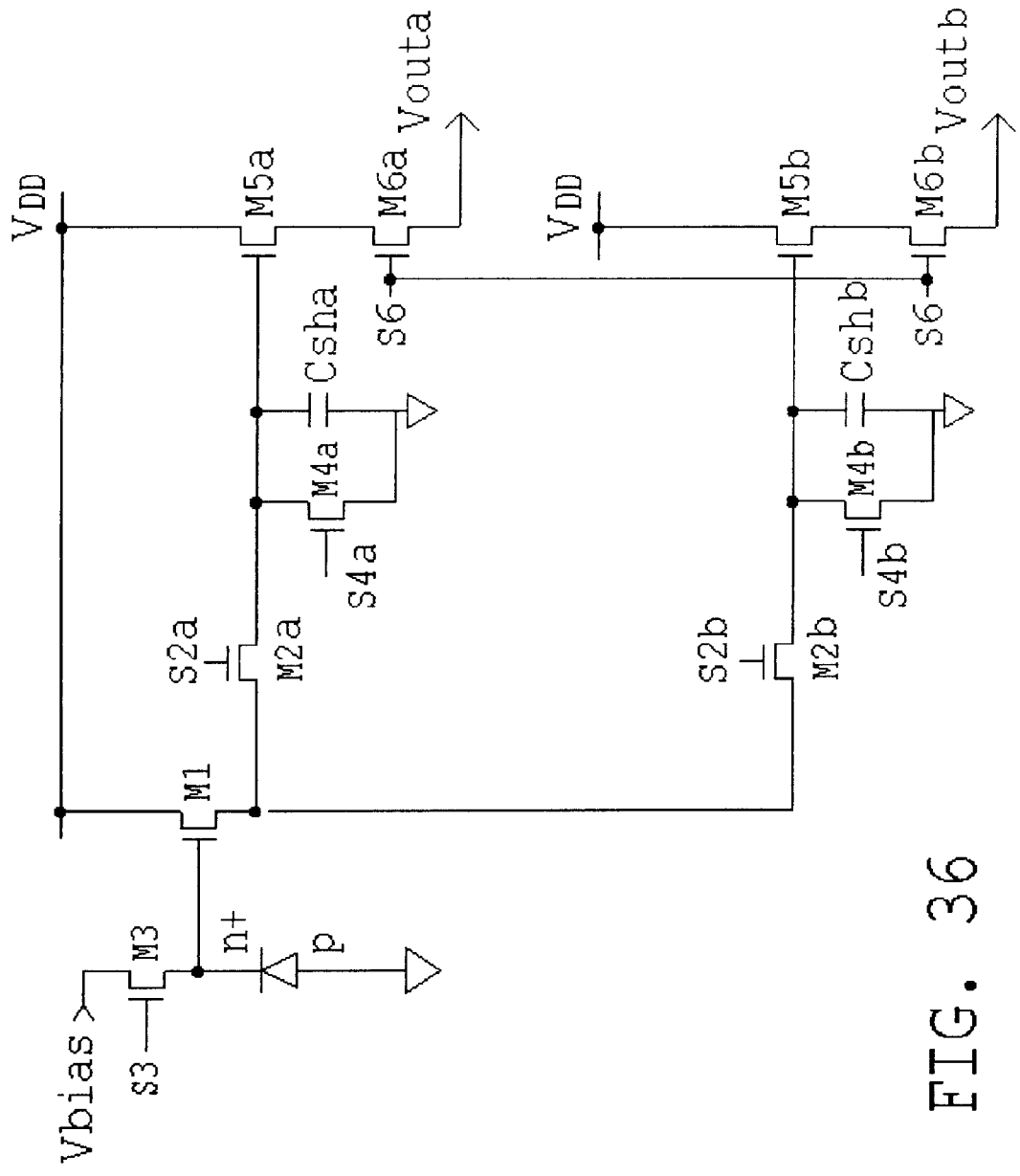
FIG. 36 illustrates the circuit diagram, which comprises gate-biased charge-integration photodiode and capacitor sample-and-hold circuits with dark fixed pattern noise cancellation method.

FIG. 36 illustrates the circuit diagram, which comprises a gate-biased charge-integration photodiode, and capacitor sample-and-hold circuits with dark fixed pattern noise cancellation method. The CMOS photodetector includes a n+p junction diode having a charge-integration node at the n+ diffusion node. The CMOS detector further includes a gate-biased charge storable MOS transistor M1 that has a gate terminal connected to the charge-integration node of the n+−p junction diode. The CMOS detector further includes a readout switch MOS transistor M2 connected to a source terminal of the charge storable MOS transistor M1. The CMOS detector further includes a bias charge pre-charge switch MOS transistor M3 connected to the charge-integration node responsive to a control signal S3 for providing a source of voltage reference as a pre-charge bias voltage to the gate terminal of the gate-biased charge storable MOS transistor M3. The CMOS detector further includes a sample and hold capacitor amplifier circuit having a terminal connected to the source terminal of the gate-biased charge storable MOS transistor M1 for receiving and holding an output signal, the sample and hold capacitor amplifier further includes a sampling-and-hold readout switch transistor for outputting the output signal. The sample-and-hold capacitor amplifier circuit is constructed by a sample-and-hold capacitor circuit and a readout amplifier circuit. The sample-and-hold capacitor circuit is formed by transistors M2$a$ and M4$a$, and the capacitor Csha, and the readout amplifier circuit is formed by transistor M5$a$ and M6$a$. The CMOS detector further includes a second sample and hold capacitor amplifier circuit having a terminal connected to the source terminal of the gate-biased charge storable MOS transistor M1 for receiving and holding an output signal, the sample and hold capacitor amplifier further includes a sampling-and-hold readout switch transistor for outputting the output signal. This second sample-and-hold capacitor amplifier circuit is also constructed by a sample-and-hold capacitor circuit and a readout amplifier circuit. The sample-and-hold capacitor circuit is formed by transistors M2$b$ and M4$b$, and the capacitor Cshb, and the readout amplifier circuit is formed by transistor M5$b$ and M6$b$. The cancellation mechanism is described as follows: right after the photodiode signal was sampled and held to a sample-and-hold stage, the photodiode will be reset to the voltage Vbias, and output the reset voltage to another sample-and-hold stage. Therefore, the dark fixed pattern noise will be canceled during the readout of both sample-and-hold signals.

Figure 37A:
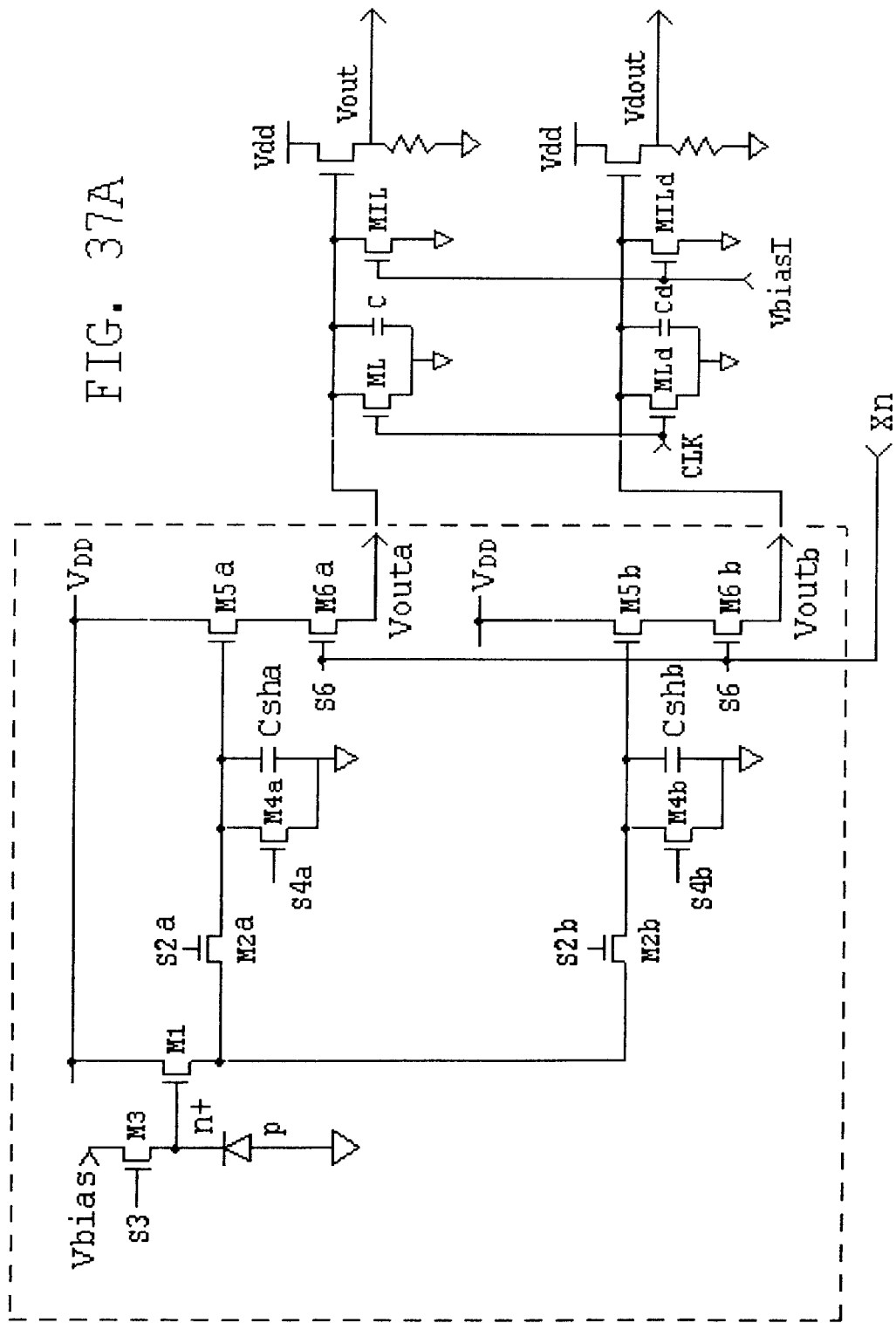
FIG. 37A illustrates a circuit diagram of a linear-array imaging-sensing device that contains a plurality of photodetector elements of FIG. 36 configured in a one-dimensional structure and the readout circuitry.

FIG. 37A illustrates a circuit diagram of a linear-array image sensing device that contains a plurality of photodetector elements of FIG. 36, only one photodetector element is drawn for the description of the control timing signals required to operate the device. The array also includes the capacitor and current-source load readout circuit with a buffer amplifier to output the video signal. The circuit further includes a digital scanning shift register, which sequentially activates the readout switches of each of the photodetecting elements.

Figure 37B:
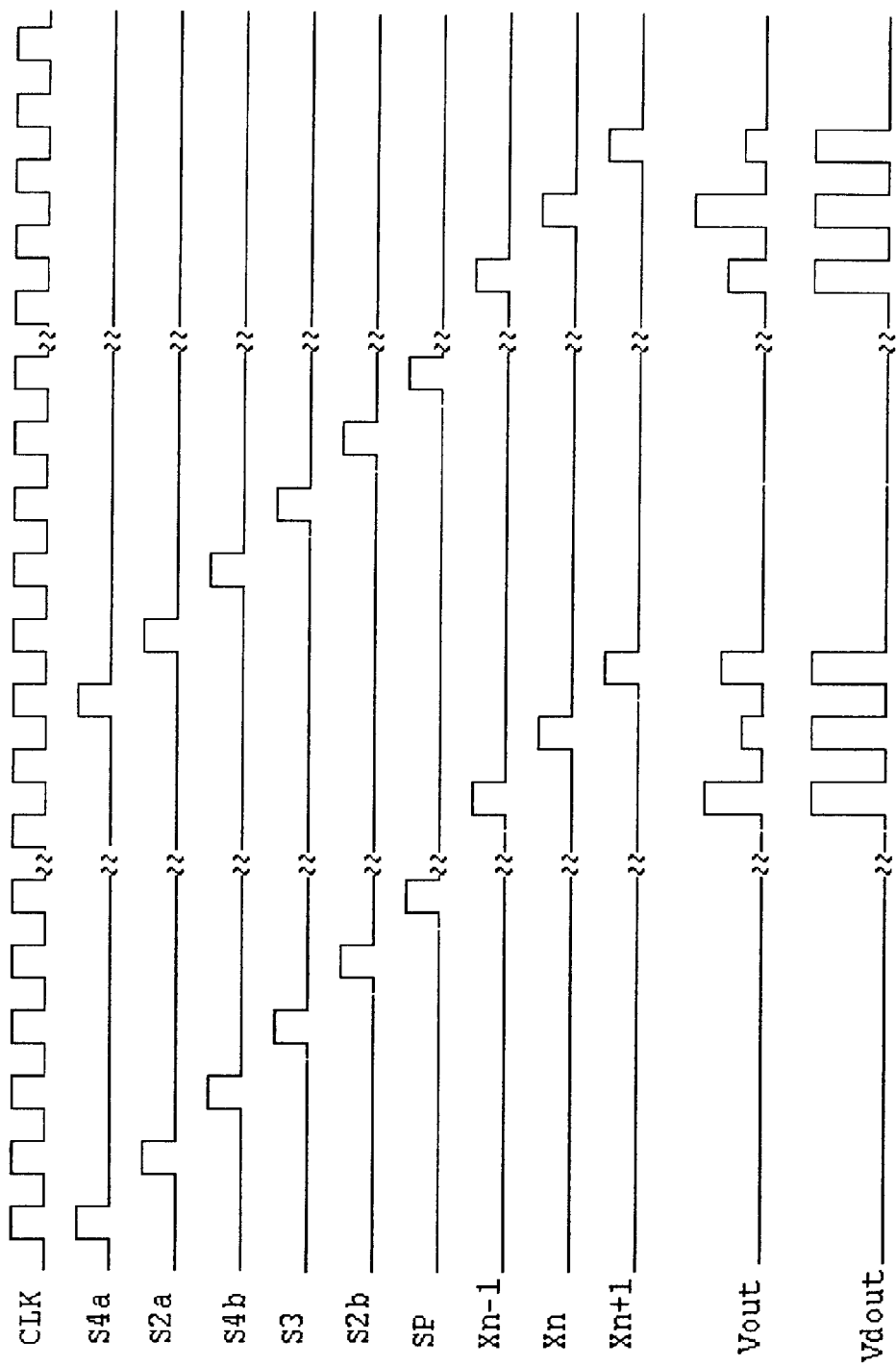
FIG. 37B illustrates the timing control signals for operating the image sensing device presented in FIG. 37A.

This photodetecting element employs offset-cancellation technique to reduce the dark fixed-pattern noise of the photodetector. The photodetector is operated with the following timing control sequence: The photosignal present in the photodiode is sampled and held to the capacitor Csha by pulsing the control signal S2$a$, then the precharging control signal S3 turns on to precharge the photodiode and the transistor M1. In the beginning of the photocharge integration cycle, the voltage of the photodetector is sampled and held to the capacitor Cshb by pulsing the control signal S2$b$. The video signals held at the capacitors Csha and Cshb will then be output to the output amplifiers by the control signal S6. The voltage difference between Vouta and Voutb closely represents the photosite signal. Substantial reduction of the fixed pattern noise can be obtained in a linear array constructed with a plurality of photodetecting elements of FIG. 37A. The timing control signals for operating such a linear array are depicted in FIG. 37B.

Figure 38A:
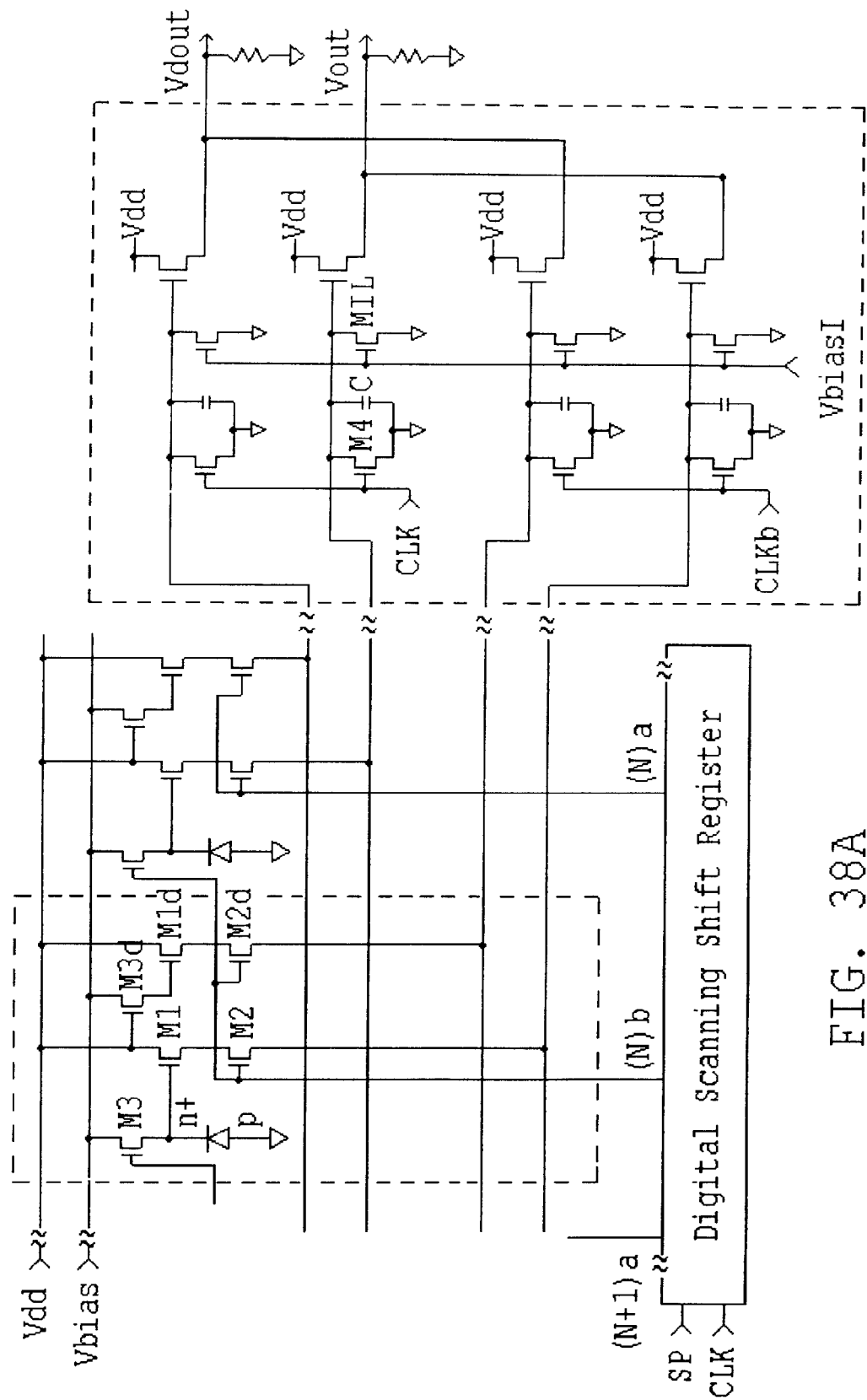
FIG. 38A illustrates a circuit diagram of a linear-array imaging sensing device that contains a plurality of photodetector elements of FIG. 34 configured in a one-dimensional structure and a two-phase multiplexing readout circuitry.

FIG. 38A illustrates a circuit diagram of a linear-array imaging sensing device that contains a plurality of photodetector elements of FIG. 34 configured in a one-dimensional structure and a two-phase multiplexing readout circuitry which is implemented to double the speed of the readout signal of the array. Any kind of the photodetector elements can be used for this array. However, as a demonstrating example, the photodetecting element of FIG. 34 is used. The two-phase multiplexing readout circuitry includes a four-bus readout structure having the first bus connected to a common source terminal of the second readout switch transistor of each odd number photodetector of the photodetectors, having the second bus connected to a common source terminal of the readout switch transistor of each odd number photodetector of the photodetectors. The third bus connected to a common source terminal of the second readout switch transistor of each even number photodetector of the photodetectors and the fourth bus connected to a common source terminal of the readout switch transistor of each even number photodetector of the photodetectors.

The two-phase multiplexing readout circuitry further includes a first resettable capacitor and current-source load source follower readout circuit including a buffer amplifier connected to a common source terminal of the second readout switch transistor of the first readout bus for receiving an output signal sequentially from each of the odd-number photodetectors, a second resettable capacitor and current-source load source follower readout circuit including a buffer amplifier connected to a common source terminal of the readout switch transistor of the second readout bus for receiving an output signal sequentially from each of the odd-number photodetectors, a third resettable capacitor and current-source load source follower readout circuit including a buffer amplifier connected to a common source terminal of the second readout switch transistor of the third readout bus for receiving an output signal sequentially from each of the even-number photodetectors, and a fourth resettable capacitor and current-source load source follower readout circuit including a buffer amplifier connected to a common source terminal of the readout switch transistor of the fourth readout bus for receiving an output signal sequentially from each of the photodetectors. The two-phase multiplexing readout circuitry further includes a digital scanning shift register having a plurality of bits each being connected to a gate terminal of each of the readout switch transistor of the photodetectors for sequentially reading out a video signal detected by each of the photodetectors, and connected to each of the bias charge pre-charge switch transistor for resetting to the voltage reference.

Figure 38B:
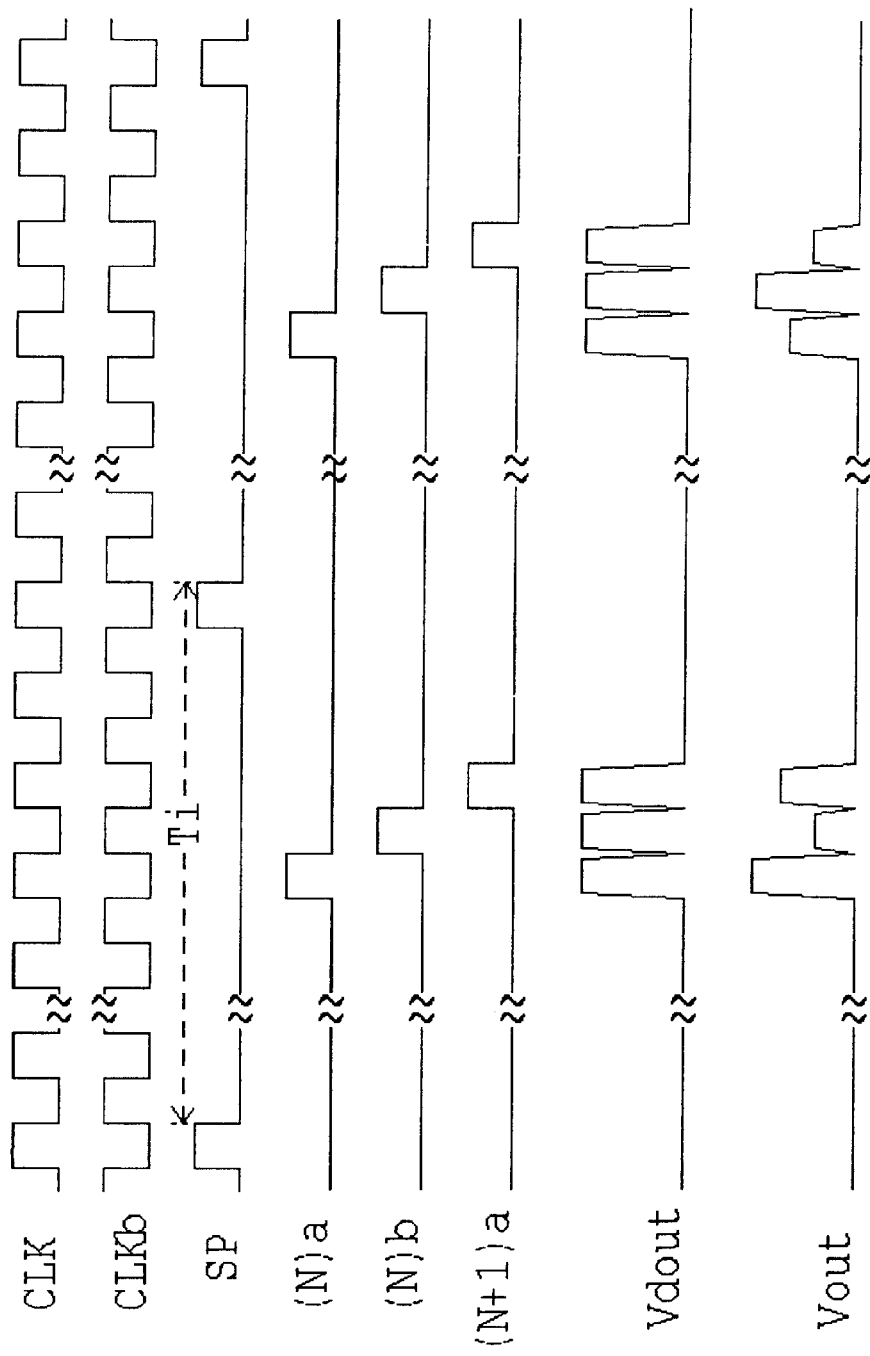
FIG. 38B illustrates the timing control signals for operating the image sensing device presented in FIG. 38A.

FIG. 38B illustrates the timing control signals for operating the image sensing device presented in FIG. 38A. When the start pulse SP is loaded into the digital scanning shift register, a plurality of bits are generated from the shift register with an odd bit (N)a and a even bit (N)b digital outputs, such as at the Nth stage, coming out from each shift register stage at each clock period. Therefore, the readout data rate can be doubled.

Figure 39A:
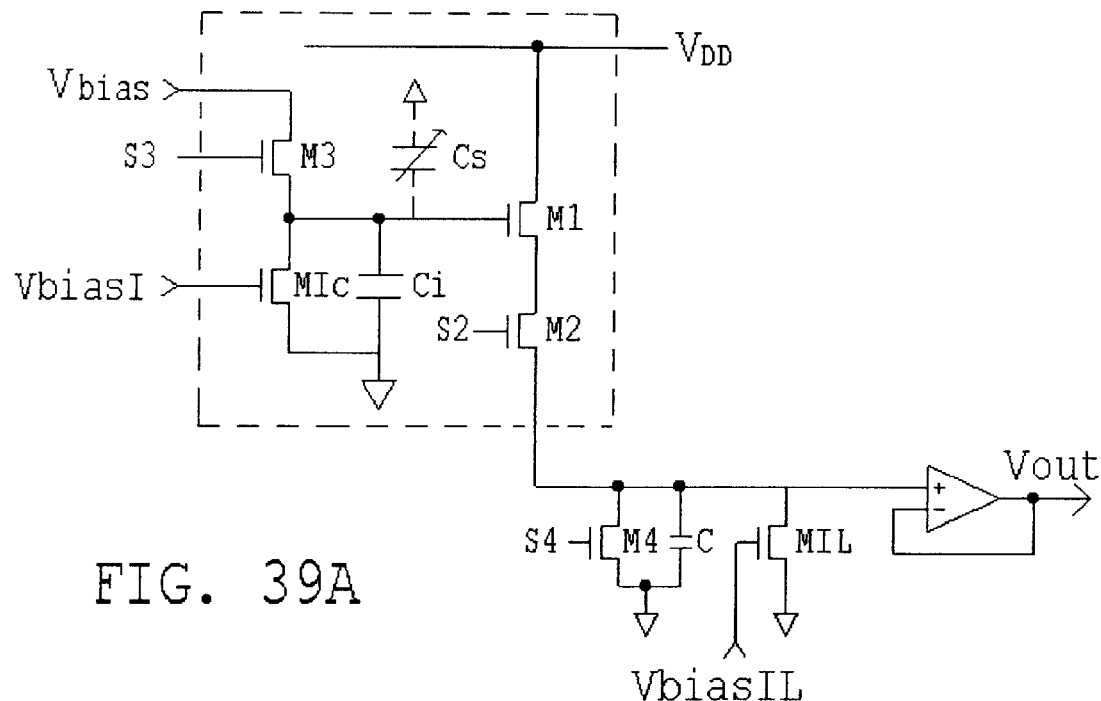
FIG. 39A illustrates the circuit diagram of a gate-biased charge-integration capacitive sensor cell.

Referring to FIG. 39A, a capacitive sensor cell can be constructed by replacing the photodiode of the photodetector cell of FIG. 32 with a capacitor Ci connected between the charge-integration node and the substrate potential. And, a current source MOS transistor Mic whose source and drain terminals are connected to the charge-integration node and the substrate potential respectively to discharge the charge-integration node during the charge-integration period. The capacitor Ci is designed to increase its value if an external fixed potential plate, such as a human's finger, moves closely to the capacitor plate of the charge-integration node. Under this condition, in additional to the capacitor Ci, a stray capacitor Cs is presented to the charge-integration node of the sensor cell, and the output voltage of the sensor cell will vary with the value of Cs. FIG. 39A illustrates the circuit diagram of a gate-biased charge-integration capacitive sensor cell. It includes a MOS capacitor Ci having a charge-integration node, a gate-biased charge storable MOS transistor M1 having a gate terminal connected to the charge-integration node of the MOS capacitor, a readout switch transistor connected to a source terminal of the charge storable MOS transistor M2, a bias charge pre-charge switch transistor M3 connected to the charge-integration node responsive to a control signal for providing a source of voltage reference as a pre-charge bias voltage to the gate terminal of the gate-biased charge storable MOS transistor, and a discharging current-source MOS transistor MIc having a drain terminal connected to the charge-integration node of the MOS capacitor, and a source terminal connected to ground bus, and a gate terminal connected to a bias voltage source.

Figure 39B:
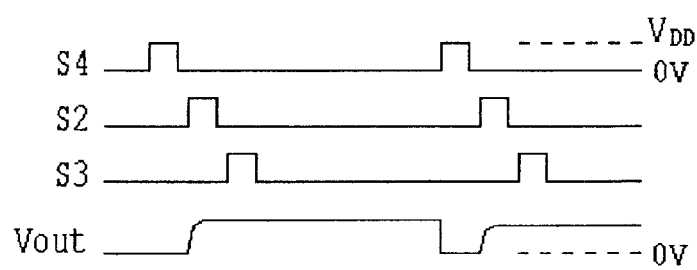
FIG. 39B illustrates the timing control signals for operating the capacitive sensor cell presented in FIG. 39A.

FIG. 39B illustrates the timing control signals for operating the capacitive sensor cell presented in FIG. 39A.

Figure 40A:
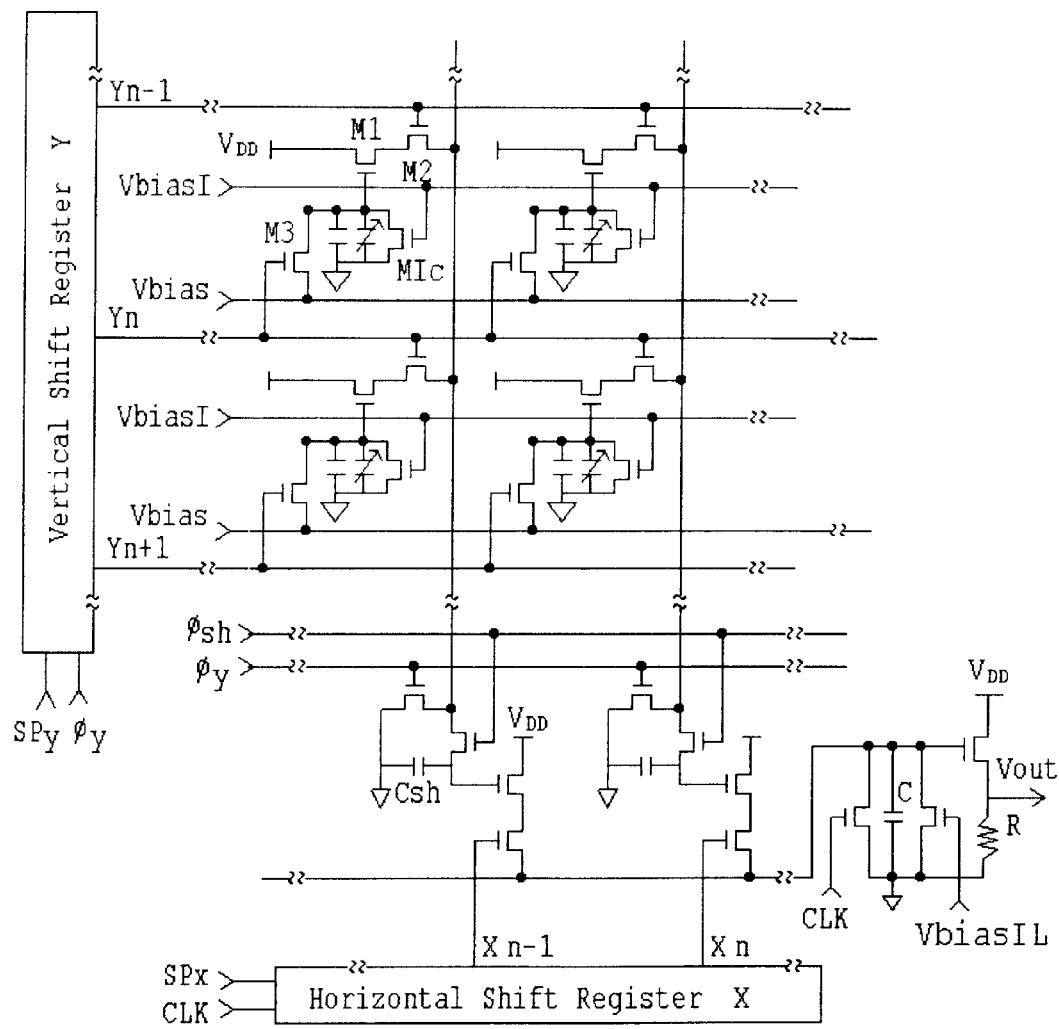
FIG. 40A illustrates a circuit diagram of an area-array capacitive sensor device that contains a plurality of capacitive sensing elements of FIG. 39A configured in a two-dimensional structure and the readout circuitry.

FIG. 40A shows an area array capacitive sensing device that contains a plurality of capacitive sensor elements of FIG. 39A. In the drawings only a 2×2 matrix of capacitor detecting elements is shown to illustrate the control timing signals required to operate this device. The circuit also includes a capacitive-load readout and sample-and-hold circuitry for each column, and a capacitive-current-source load readout circuit and buffer amplifier for outputting video signal. The circuit further includes two digital scanning shift registers, a vertical shift register Y and a horizontal shift register X, outputting with coordinating control signals to sequentially output the capacitive sensing signals one row at a time.

Figure 40B:
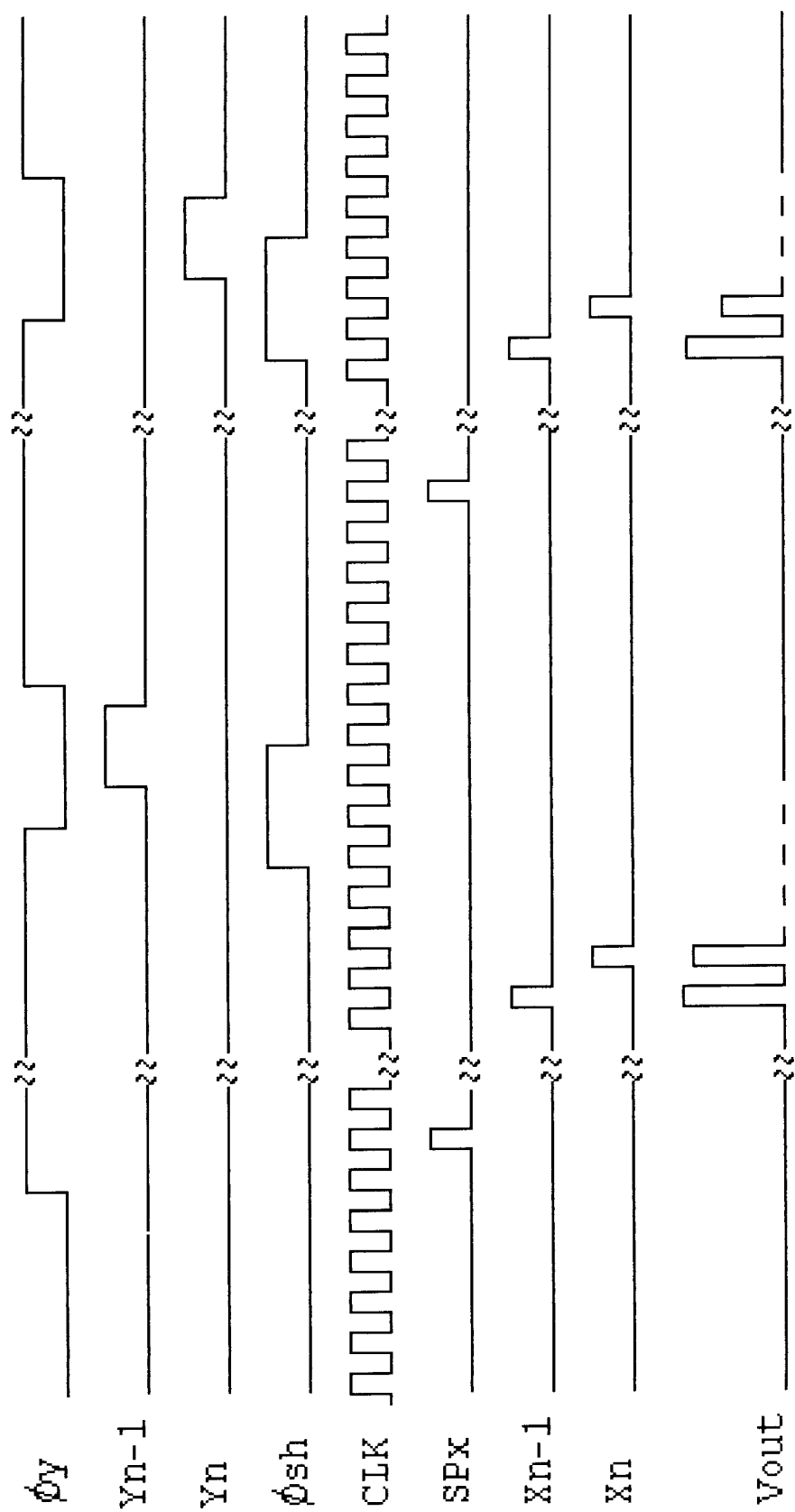
FIG. 40B illustrates the timing control signals for operating the capacitive sensing device presented in FIG. 40A.

The timing control signals to operate this area array are depicted in FIG. 40B. The capacitor detecting elements from the same Nth row are activated in parallel at the same time by the N output of the Y shift register, and each sensor signal on the same row is output to its respective column capacitive load and is stored as a sample-and-hold signal on the capacitor. Then a start pulse control signal is loaded into the X shift register which sequentially activates the readout switch of each sample-and-hold stage and outputs the capacitor sensing signals to the output of the buffer amplifier. After completing the readout of one row, the Y shift register shifts to the next row and repeats the readout process described above.

While engaging the readout on one row, the same shift register is precharging the capacitor detecting elements belonging to the previous row. This precharging operation allows the capacitor detecting elements to begin integration for the next frame to be scanned. The integration time for one frame is approximately the time between two consecutive readouts for a given row of capacitor detecting elements. The circuit design for the timing control signals to operate this area array is quite economic and efficient because of the simplicity in the design of the capacitor detecting element and the employment of capacitor-loaded readout circuitry. Excellent sensitivities for stray capacitance sensing are expected from this device.

The above disclosure is not intended as limiting. Those skilled in the art will readily observe that numerous modifications and alterations of the device may be made while retaining the substance of the invention. Accordingly, the above disclosure should be construed as limited only by the metes and bounds of the appended claims.

I claim:
1. A CMOS photodetector supported on a substrate comprising:
   a p-n junction diode having a charge-integration node;
   a gate-biased charge storable MOS transistor having a gate terminal connected to the charge-integration node of said p-n junction diode;
   a readout switch MOS transistor connected to a source terminal of said charge storable MOS transistor;
   a bias charge pre-charge switch MOS transistor connected to said charge-integration node responsive to a control signal for providing a source of voltage reference as a pre-charge bias voltage to said gate terminal of said gate-biased charge storable MOS transistor;
   a second gate-biased charge storable MOS transistor;
   a second readout switch MOS transistor having a drain terminal connected to a source terminal of said second charge storable MOS transistor and a gate terminal connected to a gate terminal of said readout switch MOS transistor; and
   a second bias charge pre-charge switch MOS transistor having a gate terminal connected to a power supply bus Vdd, a drain terminal connected to said voltage reference and a source terminal connected to a gate terminal of said second gate-biased charge storable MOS transistor.

2. The photodetector of claim 1 wherein:
   said substrate is a p-type substrate, said p-n junction diode is an n+p junction diode and said gate-biased charge storable MOS transistor is an NMOS transistor.

3. A linear array of photo-detectors of claim 1 further comprising:
   a digital scanning shift register having a plurality of bits each being connected to a gate terminal of each of said readout switch transistor for sequentially reading out a video signal detected by each of said photodetectors, and connected to each of said bias charge pre-charge switch transistor for resetting to said voltage reference;
   a resettable capacitor and current-source load source follower readout circuit including a buffer amplifier connected to a common source terminal of said readout switch transistor for receiving an output signal sequentially from each of said photodetectors; and
   a second resettable capacitor and current-source load source follower readout circuit including a buffer amplifier connected to a common source terminal of said second readout switch transistor for receiving an output signal sequentially from each of said photodetectors.

4. The photodetector of claim 1 wherein:
   said substrate is a p-type substrate, said p-n junction diode is an n+p junction diode and said gate-biased charge storable MOS transistor is an NMOS transistor.

5. A linear array of photo-detectors of claim 1 further comprising:
   a four-bus readout structure having the first bus connected to a common source terminal of said second readout switch transistor of each odd number photodetector of said photodetectors, having the second bus connected to a common source terminal of said readout switch transistor of each odd number photodetector of said photodetectors, the third bus connected to a common source terminal of said second readout switch transistor of each even number photodetector of said photodetectors and the fourth bus connected to a common source terminal of said readout switch transistor of each even number photodetector of said photodetectors.

6. A linear array of photo-detectors of claim 1 further comprising:

a digital scanning shift register having a plurality of bits each being connected to a gate terminal of each of said readout switch transistor of said photodetectors for sequentially reading out a video signal detected by each of said photodetectors, and connected to each of said bias charge pre-charge switch transistor for resetting to said voltage reference;

a first resettable capacitor and current-source load source follower readout circuit including a buffer amplifier connected to a common source terminal of said second readout switch transistor of said first readout bus for receiving an output signal sequentially from each of said odd-number photodetectors;

a second resettable capacitor and current-source load source follower readout circuit including a buffer amplifier connected to a common source terminal of said readout switch transistor of said second readout bus for receiving an output signal sequentially from each of said odd-number photodetectors;

a third resettable capacitor and current-source load source follower read-out circuit including a buffer amplifier connected to a common source terminal of said second readout switch transistor of said third readout bus for receiving an output signal sequentially from each of said even-number photodetectors; and a fourth resettable capacitor and current-source load source follower readout circuit including a buffer amplifier connected to a common source terminal of said readout switch transistor of said fourth readout bus for receiving an output signal sequentially from each of said photodetectors.

* * * * *